United States Patent
Tajitsu et al.

(10) Patent No.: US 10,950,779 B2
(45) Date of Patent: Mar. 16, 2021

(54) PIEZOELECTRIC ELEMENT AND DEVICE USING SAME

(71) Applicants: TEIJIN LIMITED, Osaka (JP); KANSAI UNIVERSITY, Suita (JP)

(72) Inventors: Yoshiro Tajitsu, Suita (JP); Yuhei Ono, Osaka (JP); Tomoyoshi Yamamoto, Osaka (JP); Shunsuke Kanematsu, Osaka (JP); Satoko Yoshizaki, Osaka (JP); Suguru Ozawa, Osaka (JP)

(73) Assignees: TEIJIN LIMITED, Osaka (JP); KANSAI UNIVERSITY, Suita (JP)

( * ) Notice: Subject to any disclaimer, the term of this patent is extended or adjusted under 35 U.S.C. 154(b) by 457 days.

(21) Appl. No.: 15/569,878

(22) PCT Filed: Apr. 28, 2016

(86) PCT No.: PCT/JP2016/063479
§ 371 (c)(1),
(2) Date: Oct. 27, 2017

(87) PCT Pub. No.: WO2016/175321
PCT Pub. Date: Nov. 3, 2016

(65) Prior Publication Data
US 2018/0108826 A1    Apr. 19, 2018

(30) Foreign Application Priority Data

Apr. 30, 2015  (JP) .............................. JP2015-093632
Apr. 30, 2015  (JP) .............................. JP2015-093687
(Continued)

(51) Int. Cl.
*H01L 41/08*    (2006.01)
*G01L 1/16*    (2006.01)
(Continued)

(52) U.S. Cl.
CPC ......... *H01L 41/082* (2013.01); *D03D 1/0088* (2013.01); *G01L 1/16* (2013.01);
(Continued)

(58) Field of Classification Search
CPC ... H01L 41/082; H01L 41/0986; H01L 41/45; D03D 1/0088; G01L 1/16
See application file for complete search history.

(56) References Cited

U.S. PATENT DOCUMENTS 4,688,306 A * 8/1987 Soni .................. H01L 41/087
29/25.35
5,508,879 A    4/1996 Kitamura et al.
(Continued)

FOREIGN PATENT DOCUMENTS

CN    106537623 A    3/2017
JP    51-132986 A    11/1976
(Continued)

OTHER PUBLICATIONS

English Translation of JP 2002102186, Hiroyuki (Year: 2002).*
(Continued)

*Primary Examiner* — Bryan P Gordon
(74) *Attorney, Agent, or Firm* — Sughrue Mion, PLLC

(57) ABSTRACT

The purpose of the present invention is to provide a fibrous piezoelectric element which enables a large electric signal to be drawn out by stress produced by relatively small deformation. A piezoelectric element includes a braid composed of a conductive fiber and a piezoelectric fiber. In the braid, the conductive fiber is a core, and the piezoelectric fiber is a covering fiber that covers the periphery of the conductive fiber.

13 Claims, 25 Drawing Sheets

(30) Foreign Application Priority Data

| Apr. 30, 2015 | (JP) | JP2015-093695 |
| Dec. 28, 2015 | (JP) | JP2015-257491 |
| Dec. 28, 2015 | (JP) | JP2015-257495 |

(51) Int. Cl.

| H01L 41/45 | (2013.01) |
| H01L 41/193 | (2006.01) |
| D03D 1/00 | (2006.01) |
| H01L 41/047 | (2006.01) |
| G06F 3/041 | (2006.01) |
| H01L 41/09 | (2006.01) |
| H01L 41/113 | (2006.01) |
| H01L 41/29 | (2013.01) |

(52) U.S. Cl.
CPC .......... *G06F 3/0414* (2013.01); *H01L 41/047* (2013.01); *H01L 41/0986* (2013.01); *H01L 41/1132* (2013.01); *H01L 41/193* (2013.01); *H01L 41/29* (2013.01); *H01L 41/45* (2013.01)

(56) References Cited

U.S. PATENT DOCUMENTS

| 2007/0059524 A1 | 3/2007 | Voigt | |
| 2010/0126840 A1* | 5/2010 | Walkington | H01H 13/704 200/512 |
| 2014/0170919 A1* | 6/2014 | Manipatruni | D01D 5/34 442/188 |
| 2015/0280102 A1* | 10/2015 | Tajitsu | H02N 2/18 310/338 |
| 2017/0029985 A1 | 2/2017 | Tajitsu et al. | |
| 2017/0033291 A1* | 2/2017 | Lee | H01L 51/0591 |

FOREIGN PATENT DOCUMENTS

| JP | 7-73992 A | 3/1995 |
| JP | 2002-102186 A | 4/2002 |
| JP | 2002-203996 A | 7/2002 |
| JP | 2003-284697 A | 10/2003 |
| JP | 2007-63742 A | 3/2007 |
| JP | 2011-524207 A | 9/2011 |
| JP | 2013-026619 A | 2/2013 |
| JP | 2014-42444 A | 3/2014 |
| JP | 2015-5106 A | 1/2015 |
| WO | 2004/086416 A1 | 10/2004 |
| WO | 2009/152456 A2 | 12/2009 |
| WO | 2014/058077 A1 | 4/2014 |

OTHER PUBLICATIONS

Decision to Grant dated Jul. 30, 2019 issued by the Japanese Patent Office in counterpart application No. 2018-031535.
Communication dated Dec. 18, 2018 issued by the Japanese Patent Office in counterpart application No. 2018-031535.
International Search Report of PCT/JP2016/063479 dated Aug. 2, 2016 [PCT/ISA/210].
Communication dated Aug. 28, 2018 issued by the Japanese Patent Office in counterpart application No. 2015-093643.
Communication dated May 7, 2019 by the Japan Patent Office in counterpart application No. 2017-515630.

\* cited by examiner

PIEZOELECTRIC ELEMENT AND DEVICE USING SAME

CROSS REFERENCE TO RELATED APPLICATIONS

This application is a National Stage of International Application No. PCT/JP2016/063479, filed Apr. 28, 2016 (claiming priority based on Japanese Patent Application Nos. 2015-093632, 2015-093687 and 2015-093695, filed Apr. 30, 2015, and Japanese Patent Application Nos. 2015-257491 and 2015-257495, filed Dec. 28, 2015), the contents of which are incorporated herein by reference in their entirety.

TECHNICAL FIELD

The present invention relates to a fiber-like piezoelectric element to be used in a touch input device or pointing device, or for surface form measurement or the like. More specifically, it relates to a sensor that can generate sufficient electrical output as a touch sensor merely by rubbing the surface of a fiber-like piezoelectric element, and that can obtain positional information and shape information about an object to be measured, by rubbing the surface of an object to be measured with the fiber-like piezoelectric element.

The present invention relates to a braided piezoelectric element using piezoelectric fibers, to a fabric-like piezoelectric element using the braided piezoelectric element, and to a device using the foregoing.

The present invention further relates to a braided piezoelectric element using piezoelectric fibers, having the braid covered with a conductive layer, to a fabric-like piezoelectric element using the braided piezoelectric element, and to a device using the foregoing.

The present invention still further relates to a transducer that outputs an electrical signal in response to shape deformation due to external force, and/or whose shape deforms by input of an electrical signal. More specifically, it relates to a fabric-like transducer that is flexible and is able to undergo three-dimensional shape deformation.

BACKGROUND ART

Recent years have seen a drastic increase in input devices employing touch panel systems, i.e. "touch input devices". With the development of thin display technology for bank ATMs and station ticket-vending machines, as well as cellular phones, portable gaming devices, portable music players and the like, there has been a massive increase in devices employing touch panel systems as the input interface.

Recently, for cellular phones and smartphones, many systems are being used with touch input devices installed on display devices that employ liquid crystals or organic electroluminescence, allowing direct input on the screen. To further increase the convenience of portable devices such as smartphones, which are undergoing constant advancements, it is preferred to have multiple touch input means instead of only a device for input onto the screen.

For example, when it is attempted to execute input with the finger on the display screen of a smartphone, the smartphone is held with one hand while input is executed with fingers of the other hand, thus requiring manipulation using both hands. However, if a touch sensor or the like is incorporated into the smartphone housing, the advantage of being operable with one hand is provided.

One example of this is disclosed in PTL 1, as a system whereby a touch sensor or the like is incorporated into a section of the housing at a non-display-screen portion, such as the back of the display screen that is not normally used as a sensor, and screen data items or anchor points are selected by the sensor. Input devices that implement touch sensors such as in PTL 1 include electrostatic capacitive systems, resistance film-type systems, optical systems, electromagnetic induction systems and systems using piezoelectric sheets.

An example of a system using a piezoelectric sheet is disclosed in PTL 2. A piezoelectric sheet system differs from the touch sensors of electrostatic capacitive systems or resistance film systems, in that the single element can simultaneously detect both pressure applied to the sensor and positional information, thus allowing diverse types of input information to be provided. Moreover, PTL 2 discloses an example of using the piezoelectric polymer polylactic acid, as a specific example of a piezoelectric sheet member.

A piezoelectric sheet comprising polylactic acid, as disclosed in PTL 2, is an excellent element that can be flexibilized and that can simultaneously detect positional information and stress with the single element, but in order to obtain sufficient electrical output it is necessary to warp the piezoelectric sheet to some extent by the stress during input. A piezoelectric sheet comprising polylactic acid generates electrical output by shearing stress applied to the sheet, but sufficient electrical output cannot be obtained by tension or compression. In order to obtain large electrical output, therefore, it is necessary to warp the sheet by pressing force from the direction perpendicular to the plane of the piezoelectric sheet. For example, considering that the piezoelectric sheet is laminated on or integrated with the housing on the back side of the smartphone, it is spatially difficult to warp the sheet by pressing force applied to the sheet in the direction perpendicular to the sheet, and it has been a goal to generate sufficient electrical output simply by rubbing the surface of the piezoelectric element. In addition, the housing surface of a smartphone or the like is not always a flat plane and may include numerous three-dimensional irregularities in its shape for reasons of design maintenance, and it has been desirable for the piezoelectric elements used in it to be flexible.

Also, PTL 3 discloses a piezoelectric fiber technology in which a piezoelectric polymer is oriented by adding twists. The piezoelectric fibers described in PTL 3 yield electrical output through tension or compression of the fibers, by having the fibers pre-twisted via special production methods. However, PTL 3 discloses absolutely no technology for generating and extracting sufficient electrical output in response to shearing stress by rubbing of fiber surfaces. Thus, it is extremely difficult to incorporate such a piezoelectric fiber element into a smartphone housing or the like, and extract sufficient electrical output by relatively small amounts of applied stress such as rubbing the surface with a finger or the like.

It is generally known that polylactic acid fibers oriented by uniaxial stretching produce virtually no polarization in response to stretching or compression stress in the direction of the stretching axis or the direction perpendicular to it, and therefore yield essentially no electrical output by the relatively small applied stress generated by rubbing the fiber surfaces with a finger. On the other hand, it is known that application of force in a direction that is neither parallel nor perpendicular to the stretching axis of the polylactic acid piezoelectric fibers, i.e. shearing stress, produces polarization, thereby exhibiting the function as a piezoelectric body.

PTL 4 discloses a fiber-like piezoelectric element that allows electrical output to be extracted from the relatively small applied stress of rubbing the surface with a finger or the like. In PTL 4, carbon fiber is used as the conductive fiber for the constituent element of the fiber-like piezoelectric element. However, when this fiber-like piezoelectric element is applied for purposes requiring repeated durability, because carbon fiber has weak flexural rigidity, the fiber will gradually break making it impossible to obtain quantitative piezoelectricity, and potentially causing the piezoelectric property to gradually decrease. In addition, when it is attempted to obtain height or shape information of an object to be measured using a braided piezoelectric element as the contact probe, the carbon fiber breaks and the tip becomes sharper, and the characteristic rigidity of the carbon fiber can potentially damage the surface of the object to be measured.

Moreover, there has been increasing interest in recent years for "wearable sensors", which have made their debut as products in the form of eyeglasses or wristwatches. However, such devices produce the sensation of being worn, and are more desirably in the form of fabrics, i.e. clothing, which are the ultimate wearable form. Piezoelectric elements using the piezoelectric effect of piezoelectric fibers are known as such types of sensors. For example, PTL 4 discloses a piezoelectric element comprising two conductive fibers and one piezoelectric fiber, with points of contact between them, while including a piezoelectric unit disposed on essentially the same plane. Also, PTL 3 discloses a piezoelectric material which is a fiber-like or molded article made of a piezoelectric polymer wherein, in order to generate piezoelectricity by tensile force applied in the axial direction, the construction includes added twists in a direction different from the direction of the tensile force that is to be applied.

On the other hand, recent years have seen a drastic increase in input devices employing touch panel systems, i.e. "touch input devices". With the development of thin display technology for bank ATMs and station ticket-vending machines, as well as smartphones, cellular phones, portable gaming devices, portable music players and the like, there has been a massive increase in devices employing touch panel systems as the input interface. As means for realizing such touch panel systems there are known systems using piezoelectric sheets or piezoelectric fibers. For example, PTL 2 discloses a touch panel employing a piezoelectric sheet made of L-polylactic acid having a stretching axis oriented in a prescribed direction.

In such wearable sensors or touch panel system sensors, it is desirable to extract a high electrical signal even for small amounts of stress produced in the piezoelectric material by small deformation applied to the piezoelectric material. For example, it is desirable to stably extract a high electrical signal even for relatively small amounts of stress produced in the piezoelectric material by movement of stretching out the finger, or the action of rubbing the surface with the finger.

The piezoelectric fiber of PTL 4 is an excellent material that can be applied for various purposes, but it cannot always output a high electrical signal in response to stress produced by relatively small amounts of deformation, nor does this publication disclose technology for obtaining a high electrical signal.

The piezoelectric fibers described in PTL 3 can output an electrical signal in response to tension or compression on the piezoelectric fibers, by having the piezoelectric fibers pre-twisted via special production methods. However, PTL 3 does not disclose any technology for producing an adequate electrical signal in response to bending or stretching of the piezoelectric fibers, or shearing stress due to rubbing of the surfaces of the piezoelectric fibers. Therefore, when such piezoelectric fibers are used, it is difficult to extract a sufficient electrical signal simply by stress produced by relatively small amounts of deformation such as rubbing of the surface.

The piezoelectric sheet of PTL 2 can output an electrical signal by deformation (stress) of the piezoelectric sheet. However, because it is still in a sheet form, it has poor flexibility and cannot be used to allow free bending in the manner of a fabric.

Moreover, the piezoelectric element described in PTL 4 has bare conductive fibers serving as the signal wire, and therefore in order to suppress noise signals it is necessary to construct a separate noise shielding structure. Therefore, the piezoelectric element described in PTL 4 still has room for improvement toward its implementation.

Wearable sensors that have piezoelectric elements mounted in fabrics from which they extract signals have also been disclosed (PTLs 5 and 6). However, because they require a separate structure on the surface of a woven or knitted fabric, they are poorly suited for free form surfaces and have poor touch sensation, while also lacking practicality due to problems of manageability, workability and processability. In addition, a fabric structure formed of a piezoelectric material and a conducting material in the form of a film also exists (PTL 7), but it likewise has poor suitability to free form surfaces and poor touch sensation, and lacks practicality due to problems of manageability, workability and processability.

There has also been proposed a fabric sensor composed entirely of fibers, which detects resistance between conductive fibers (PTL 8), but this detects pressure on the fabric without directly detecting shape deformation.

PTL 4 discloses a piezoelectric element including a piezoelectric unit comprising two conductive fibers and one piezoelectric fiber, disposed on essentially the same plane while having points of contact between them, and a technique for arranging multiple piezoelectric units in parallel on the plane. However, it nowhere suggests higher functions based on selective responses to electrical signals for stress at specific locations or in specific directions, or compositing with piezoelectric units in the thickness direction of the element, and therefore further improvements in this technology have been a topic of interest.

Another issue has been the output of unintended signals during direct contact with the human body or contact with electrified objects.

CITATION LIST

Patent Literature

[PTL 1] Japanese Unexamined Patent Publication No. 2001-189792
[PTL 2] Japanese Unexamined Patent Publication No. 2011-253517
[PTL 3] Japanese Patent Publication No. 3540208
[PTL 4] International Patent Publication No. WO2014/058077
[PTL 5] Japanese Patent Public Inspection No. 2007-518886
[PTL 6] Japanese Unexamined Patent Publication HEI No. 6-323929
[PTL 7] Japanese Unexamined Patent Publication No. 2002-203996
[PTL 8] Japanese Unexamined Patent Publication No. 2006-284276

SUMMARY OF INVENTION

Technical Problem

The present invention has been accomplished in light of this background, and its first object is to provide a fiber-like piezoelectric element that can extract electrical output by relatively small applied stress such as rubbing of the surface with the finger or the like, and to provide a fiber-like piezoelectric element that can withstand repeated friction on the surface or tip section of the piezoelectric element.

The second object is to provide a fiber-like piezoelectric element capable of extracting a large electrical signal even by stress produced by relatively small deformation.

The third object is to provide a fiber-like piezoelectric element capable of extracting a large electrical signal even by stress produced by relatively small deformation, and capable of controlling noise signals.

The fourth object is to provide a flat transducer that can selectively respond with an electrical signal to stress at a specific location or in a specific direction, by using fiber materials and forming a conventional woven or knitted fabric structure, as well as to provide a device that uses a signal from the transducer and/or a device that functions by inputting an electrical signal.

The fifth object is to provide a fabric-like transducer with a low malfunction rate, highly practicality and extreme flexibility, by using fiber materials and forming a conventional woven or knitted fabric structure, as well as to provide a device that uses a signal from the transducer and/or a device that functions by inputting an electrical signal.

Solution to Problem

As a result of ardent research directed toward achieving the first object, the present inventors have completed this invention upon finding that electricity can be efficiently extracted by a braided piezoelectric element which is a combination of a conductive fiber and a piezoelectric polymer, wherein the surface of the conductive fiber serving as the core is covered with the piezoelectric polymer.

Specifically, the present invention provides the following 1 to 13 as means for achieving the first object of the invention (first invention).

1. A piezoelectric element including a braid comprising a conductive fiber and piezoelectric fibers, the braid having the conductive fiber as the core, and the piezoelectric fibers being covering fibers that cover the periphery of the conductive fiber.

2. The piezoelectric element according to 1 above, wherein the flexural rigidity of the conductive fiber is no greater than $0.05 \times 10^{-4}$ N·m²/m.

3. The piezoelectric element according to 1 above, wherein the conductive fiber is a metal coated organic fiber.

4. The piezoelectric element according to any one of 1 to 3 above, wherein the piezoelectric fibers include mainly polylactic acid.

5. The piezoelectric element according to 4 above, wherein the piezoelectric fibers include mainly poly-L-lactic acid or poly-D-lactic acid with an optical purity of 99% or greater.

6. The piezoelectric element according to any one of 1 to 5 above, wherein the piezoelectric fibers are uniaxially oriented and include crystals.

7. The piezoelectric element according to any one of 1 to 6 above, which detects the amount of stress applied to the covering fibers and/or the location at which it is applied.

8. The piezoelectric element according to 7 above, wherein the stress to be detected is frictional force between the surfaces of the covering fibers and the surface of the contacting object.

9. The piezoelectric element according to 7 above, wherein the stress to be detected is resistance in the direction perpendicular to the surfaces or tip sections of the covering fibers.

10. A sensor using the piezoelectric element according to any one of 1 to 9 above.

11. A device comprising:
    a piezoelectric sensor according to 10 above,
    amplification means that amplifies an electrical signal outputted from the piezoelectric sensor in response to applied pressure, and
    output means that outputs the electrical signal that has been amplified by the amplification means.

12. The device according to 11 above, the device further comprising transmission means that transmits the electrical signal that has been outputted from the output means, to an external device.

13. A device comprising:
    the piezoelectric sensor according to 10 above,
    output means that outputs an electrical signal from the piezoelectric sensor in response to applied pressure, and
    transmission means that transmits the electrical signal outputted from the output means, to an external device.

Moreover, as a result of ardent research directed toward achieving the second object, the present inventors have completed this invention upon finding that electricity can be efficiently extracted by a braided piezoelectric element as a combination of a conductive fiber and piezoelectric fibers, wherein the surface of the conductive fiber serving as the core is covered with the braided piezoelectric fibers.

Specifically, the invention provides the following 14 to 21 as means for achieving the second object of the invention (second invention).

14. A braided piezoelectric element comprising a core formed of a conductive fiber and a sheath formed of braided piezoelectric fibers covering the core, wherein the piezoelectric fibers include polylactic acid as a main component, the winding angles of the piezoelectric fibers with respect to the conductive fiber being between 150 and 75°, inclusive.

15. The braided piezoelectric element according to 14 above, wherein the total fineness of the piezoelectric fibers is at least ½ times and no greater than 20 times the total fineness of the conductive fiber.

16. The braided piezoelectric element according to 14 above, wherein the fineness per piezoelectric fiber is at least 1/20 times and no greater than 2 times the total fineness of the conductive fiber.

17. A fabric-like piezoelectric element comprising a fabric that includes the braided piezoelectric element according to any one of 14 to 16 above.

18. The fabric-like piezoelectric element according to 17 above, wherein the fabric further includes conductive fibers that cross and contact with at least part of the braided piezoelectric element.

19. The fabric-like piezoelectric element according to 18 above, wherein among the fibers forming the fabric and crossing the braided piezoelectric element, at least 30% are conductive fibers.

20. A device comprising a braided piezoelectric element according to any one of 14 to 16 above, amplification means that amplifies an electrical signal outputted from the braided piezoelectric element in response to applied pressure, and output means that outputs the electrical signal that has been amplified by the amplification means.

21. A device comprising a fabric-like piezoelectric element according to any one of 17 to 19 above, amplification means that amplifies an electrical signal outputted from the fabric-like piezoelectric element in response to applied pressure, and output means that outputs the electrical signal that has been amplified by the amplification means.

Moreover, as a result of ardent research directed toward achieving the third object, the present inventors have completed this invention upon finding that an electrical signal can be efficiently extracted and noise signals can be suppressed, by a braided piezoelectric element as a combination of a conductive fiber and piezoelectric fibers, wherein the surface of the conductive fiber serving as the core is covered with the braided piezoelectric fibers, and a conductive layer is also provided around the periphery.

Specifically, the invention provides the following 22 to 32 as means for achieving the third object of the invention (third invention).

22. A braided piezoelectric element comprising a core formed of a conductive fiber, a sheath formed of braided piezoelectric fibers covering the core, and a conductive layer provided around the periphery of the sheath.

23. The braided piezoelectric element according to 22 above, wherein the coverage factor of the sheath by the conductive layer is 25% or greater.

24. The braided piezoelectric element according to 22 or 23 above, wherein the conductive layer is formed of fibers.

25. The braided piezoelectric element according to any one of 22 to 24 above, wherein the piezoelectric fibers include polylactic acid as the main component, and the winding angle of the piezoelectric fibers with respect to the conductive fibers is between 15° and 75°, inclusive.

26. The braided piezoelectric element according to any one of 22 to 25 above, wherein the total fineness of the piezoelectric fibers is at least 1 and no greater than 20 times the total fineness of the conductive fibers.

27. The braided piezoelectric element according to any one of 22 to 25 above, wherein the fineness per piezoelectric fiber is at least 1/20 times and no greater than 2 times the total fineness of the conductive fibers.

28. A fabric-like piezoelectric element comprising a fabric that includes the braided piezoelectric element according to any one of 22 to 27 above.

29. The fabric-like piezoelectric element according to 28 above, wherein the fabric further includes conductive fibers that cross and contact with at least part of the braided piezoelectric element.

30. The fabric-like piezoelectric element according to 29 above, wherein among the fibers forming the fabric and crossing the braided piezoelectric element, at least 30% are conductive fibers.

31. A device comprising a braided piezoelectric element according to any one of 22 to 27 above, amplification means that amplifies an electrical signal outputted from the braided piezoelectric element in response to applied pressure, and output means that outputs the electrical signal that has been amplified by the amplification means.

32. A device comprising a fabric-like piezoelectric element according to any one of 28 to 30 above, amplification means that amplifies an electrical signal outputted from the fabric-like piezoelectric element in response to applied pressure, and output means that outputs the electrical signal that has been amplified by the amplification means.

Moreover, as a result of ardent research directed toward achieving the fourth object, the present inventors have completed this invention upon finding that a combined arrangement of conductive fibers and piezoelectric fibers functions as a piezoelectric element, and further that by layering a flat transducer comprising a piezoelectric element or the like and forming a composite, it is possible to selectively produce an electrical signal in response to stress at a specific location or in a specific direction.

Specifically, the invention provides the following 33 to 48 as means for achieving the fourth object of the invention (fourth invention).

33. A transducer composed of at least two sheets or fabrics, at least one of the sheets or fabrics comprising the following layer A, and at least one of the layers other than layer A comprising the following layer B.

Layer A: A flat transducer that outputs or inputs an electrical signal, including a piezoelectric unit wherein a conductive fiber and a piezoelectric fiber are arranged on approximately the same plane so as to provide electrical connection, the transducer having a function of mutually converting between stress in a specific location or direction and an electrical signal as selective output or input.

Layer B: A flat transducer that outputs or inputs an electrical signal, the transducer having a function of mutually converting between a signal in a specific location or direction differing from that of layer A or a signal of a different type than that of layer A, and an electrical signal as selective output or input.

34. The transducer according to 33 above, including at least one layer that is the following layer C, between layer A and layer B.

Layer C: A layer having the function of reducing noise caused by electrical interference between layer A and layer B.

35. The transducer according to 33 or 34 above, wherein the piezoelectric unit includes two conductive fibers and one piezoelectric fiber, arranged in the order: conductive fiber, piezoelectric fiber, conductive fiber.

36. The transducer according to 33 or 34 above, having contact points where the conductive fibers and the piezoelectric fiber are in mutual physical contact.

37. The transducer according to 33 or 34 above, wherein insulating fibers are arranged so that the conductive fibers in the piezoelectric unit are not in electrical connection with the conductive fiber and/or piezoelectric fiber in the other piezoelectric unit.

38. The transducer according to 33 or 34 above, wherein the piezoelectric fiber includes mainly polylactic acid.

39. The transducer according to 33 or 34 above, wherein the piezoelectric fiber includes mainly poly-L-lactic acid or poly-D-lactic acid with an optical purity of 99% or greater.

40. The transducer according to 33 or 34 above, wherein the piezoelectric fiber is uniaxially oriented and includes crystals.

41. The transducer according to 33 or 34 above, wherein the conductive fibers are metal-plated fibers.

42. The transducer according to 33 or 34 above, which is a woven or knitted fabric containing a plurality of the piezoelectric units.

43. The transducer according to 42 above, which is a woven fabric containing a plurality of the piezoelectric units, its woven texture being a plain weave, twill weave, satin weave or a composite weave thereof.

44. The transducer according to 43 above, employing a combination of a plurality of the woven or knitted fabrics.

45. A device comprising a transducer according to any one of 33 to 44 above, amplification means that amplifies an electrical signal outputted from the transducer in response to applied pressure, and output means that outputs the electrical signal that has been amplified by the amplification means.

46. The device according to 45 above, the device further comprising transmission means that transmits the electrical signal that has been outputted from the output means, to an external device.

47. A device comprising the transducer according to any one of 33 to 44 above, output means that outputs an electrical signal from the transducer in response to applied pressure, and transmission means that transmits the electrical signal outputted from the output means to an external device.

48. A device comprising receiving means that receives an electrical signal, and a transducer according to any one of 33 to 44 above, to which an electrical signal received by the receiving means is applied.

Moreover, as a result of ardent research directed toward achieving the fifth object, the present inventors have completed this invention upon finding that a combined arrangement of conductive fibers and piezoelectric fibers functions as a piezoelectric element, and further that by layering a conductive sheet or conductive fabric on the piezoelectric element, it is possible to provide a highly practical transducer that is resistant to malfunction.

Specifically, the invention provides the following 49 to 64 as means for achieving the fifth object of the invention (fifth invention).

49. A layered transducer comprising at least two sheets or fabrics, at least one of the sheets or fabrics comprising the following layer A, and at least one of the layers other than layer A comprising the following layer B.

Layer A: A transducer that outputs or inputs an electrical signal, including a piezoelectric unit wherein a conductive fiber and a piezoelectric fiber are arranged on approximately the same plane so as to provide electrical connection.

Layer B: A conductive sheet or conductive fabric having a sheet resistance of no greater than $10^4$ S/sq.

50. The transducer according to 49 above, further having the following layer C layered between layer A and layer B.

Layer C: An insulating sheet or insulating fabric having a sheet resistance of $10^6$ S/sq. or greater.

51. The transducer according to 49 or 50 above, wherein the piezoelectric unit includes two conductive fibers and one piezoelectric fiber, arranged in the order: conductive fiber, piezoelectric fiber, conductive fiber.

52. The transducer according to 49 or 50 above, having contact points where the conductive fibers and the piezoelectric fiber are in mutual physical contact.

53. The transducer according to 49 or 50 above, wherein insulating fibers are arranged so that the conductive fibers in the piezoelectric unit are not in electrical connection with the conductive fiber and/or piezoelectric fiber in the other piezoelectric unit.

54. The transducer according to 49 or 50 above, wherein the piezoelectric fiber includes mainly polylactic acid.

55. The transducer according to 49 or 50 above, wherein the piezoelectric fiber includes mainly poly-L-lactic acid or poly-D-lactic acid with an optical purity of 99% or greater.

56. The transducer according to 49 or 50 above, wherein the piezoelectric fiber is uniaxially oriented and includes crystals.

57. The transducer according to 49 or 50 above, wherein the conductive fibers are metal-plated fibers.

58. The transducer according to 49 or 50 above, which is a woven or knitted fabric containing a plurality of the piezoelectric units.

59. The transducer according to 58 above, which is a woven fabric containing a plurality of the piezoelectric units, its woven texture being a plain weave, twill weave, satin weave or a composite weave thereof.

60. The transducer according to 59 above, employing a combination of a plurality of the woven fabrics.

61. A device comprising a transducer according to any one of 49 to 60 above, amplification means that amplifies an electrical signal outputted from the transducer in response to applied pressure, and output means that outputs the electrical signal that has been amplified by the amplification means.

62. The device according to 61 above, the device further comprising transmission means that transmits the electrical signal that has been outputted from the output means, to an external device.

63. A device comprising the transducer according to any one of 49 to 60 above, output means that outputs an electrical signal from the transducer in response to applied pressure, and transmission means that transmits the electrical signal outputted from the output means, to an external device.

64. A device comprising receiving means that receives an electrical signal, and a transducer according to any one of 49 to 60 above, to which an electrical signal received by the receiving means is applied.

Advantageous Effects of Invention

According to the first invention it is possible to obtain a fiber-like piezoelectric element that allows electrical output to be extracted from the relatively small applied stress of rubbing the surface with a finger or the like. It is also possible to obtain a fiber-like piezoelectric element that can withstand repeated friction on the surface or tip section of the piezoelectric element.

According to the second invention it is possible to provide a fiber-like piezoelectric element capable of extracting a large electrical signal even by stress produced by relatively small deformation.

According to the third invention it is possible to provide a fiber-like piezoelectric element capable of extracting a large electrical signal even by stress produced by relatively small deformation, and able to suppress noise signals.

According to the fourth invention it is possible to obtain a fabric-like transducer with excellent flexibility, by using fiber materials and forming a conventional woven or knitted fabric structure. The transducer of the invention is flexible, and it is therefore possible to obtain a transducer whose input/output are electrical signals, in different forms that allow foldable fabric forms, such as a handkerchief, or wearable fabric forms to be obtained.

Moreover, according to the fifth invention it is possible to obtain a fabric-like transducer with excellent flexibility, by using fiber materials and forming a conventional woven or knitted fabric structure. The transducer of the invention is flexible, and it is therefore possible to obtain a transducer whose input/output are electrical signals, in different forms that allow foldable fabric forms, such as a handkerchief, or wearable fabric forms to be obtained.

DESCRIPTION OF EMBODIMENTS

The principle by which an electrical signal is generated in a combination of a conductive fiber and piezoelectric fiber, which is common to the first invention to fifth invention, will be explained first.

Figure 1A:
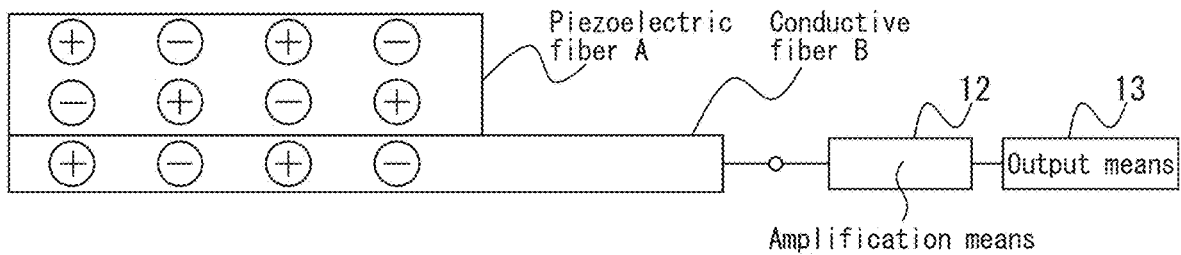
FIGS. 1(A) to 1(C) are a set of schematic cross-sectional views illustrating the principle by which an electrical signal is generated by a conductive fiber and piezoelectric fiber combination.
Figure 1B:
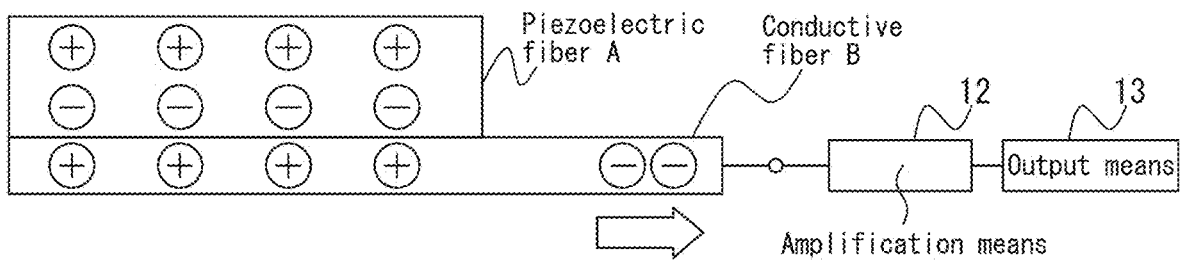
Figure 1C:
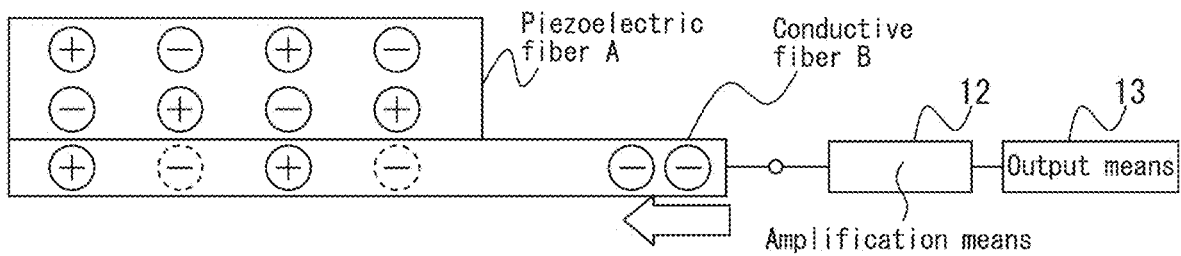

FIGS. 1(A) to 1(C) are schematic cross-sectional views illustrating the principle by which an electrical signal is generated by a conductive fiber and piezoelectric fiber combination. A lead wire is connected from a conductive fiber B to the input terminal of amplification means 12. In FIG. 1(A), which is the state in which the conductive fiber B and the piezoelectric fiber A are elongated without being bent, positive and negative electrical charges are evenly distributed in the conductive fiber B and the piezoelectric fiber A. When bending of the piezoelectric fiber A begins, as shown in FIG. 1(B), polarization is generated in the piezoelectric fiber A, and the signs of the electrical charges become oriented in each direction. A negative electrical charge flows out from the conductive fiber B, being drawn by the orientation of the positive and negative electrical charges generated by polarization of the piezoelectric fiber A. Movement of the negative charge manifests as flow of a minute electrical signal (i.e. current), and the amplification means 12 amplifies the electrical signal while output means 13 outputs the electrical signal that has been amplified by the amplification means 12. The state of polarization shown in FIG. 1(B) continues as long as bending of the piezoelectric fiber A is maintained (fixed).

When the action of elongation of the piezoelectric fiber A begins from a state in which the bent form of the piezoelectric fiber A has been maintained (fixed) (FIG. 1(B)), polarization of the piezoelectric fiber A ceases, as shown in FIG. 1(C), and the positive and negative electrical charges in the piezoelectric fiber A become evenly distributed. A negative charge then flows to the conductive fiber B, drawn by the even distribution of positive and negative electrical charges in the piezoelectric fiber A. Movement of the negative charge manifests as flow of a minute electrical signal (i.e. current), but the electrical signal is amplified by the amplification means 12, and the amplified electrical signal is outputted by the output means 13. Incidentally, since the direction of movement of the negative charge is opposite between the state during the action of bending of the piezoelectric fiber A (FIG. 1(B)) and the state of transition from the action of bending to the action of elongation (FIG. 1(C)), electrical signals of reverse polarity are generated by the bending and elongation actions. For example, a positive electrical signal is generated during the action of bend of the piezoelectric fiber A, while a negative electrical signal is generated during the action of elongation of the piezoelectric fiber A.

According to the invention, minute electrical signals generated with the action of bending and the action of elongation of the piezoelectric fiber A are amplified by the amplification means 12 and outputted by the output means 13, and computation processing by an external device (not shown) ascertains whether the amplified electrical signal is positive or negative and detects the presence of bending and the degree of bending of the piezoelectric fiber A. For example, in the external device (not shown), it is possible to carry out computation processing whereby the amplified electrical signals that have been amplified by the amplification means 12 and outputted from the output means 13 are time-integrated, and if the integral value is at least a prescribed upper limit it is judged to be "bending action", or if it is less than a prescribed lower limit it is judged to be "elongation action". Throughout the present specification, a reference to an electrical signal being generated in response to stress applied to the piezoelectric fiber A is synonymous with the electrical signal being generated in response to distortion of the piezoelectric fiber A.

The first invention will now be explained in detail.
(Covering Fibers)

Figure 2:
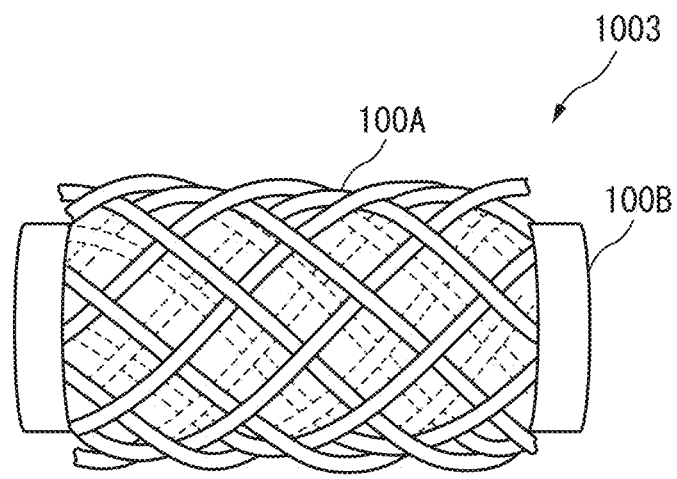
FIG. 2 is a schematic diagram of the piezoelectric element of Example 1, as an example of the construction of a piezoelectric element according to the first invention.

The piezoelectric element of the first invention includes covering fibers that cover the surface of the conductive fiber with piezoelectric fibers, i.e. fibers of a piezoelectric polymer. FIG. 2 is a schematic diagram showing an example of the construction of a piezoelectric element according to an embodiment of the first invention. As shown in FIG. 2, the covered fiber 1003 of the piezoelectric element comprises piezoelectric fibers 100A covering the surface of a conductive fiber 100B.

The length of the covered fiber 1003 of the piezoelectric element is not particularly restricted, and it may be continuously produced during production and cut to the desired length thereafter. For use as an actual piezoelectric element, the length of the covered fiber 1003 is 1 mm to 10 m, preferably 5 mm to 2 m and more preferably 1 cm to 1 m. With a short length, the convenience of the fiber shape may be lost, and with a long length, problems may result such as reduced electrical output due to problems with the resistance value of the conductive fiber 100B.
(Conductive Fiber)

The conductive fiber may be of any type that exhibits conductivity and any publicly known type may be used, examples of which include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber winding. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity. Fibers that have been metal-plated in this manner may be considered to be metal-plated fibers.

The base fiber that has been coated with a metal may be a publicly known fiber, regardless of the presence or absence of conductivity, examples of which include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these and any publicly known fiber may be used, or combinations of these fibers may be used.

The metal to be coated onto the base fiber may be any type that exhibits conductivity and exhibits the effect of the invention. Examples to be used include gold, silver, platinum, copper, nickel, tin, zinc, palladium, indium tin oxide, copper sulfide and the like, as well as their mixtures and alloys.

When an organic fiber coated with a metal with bending resistance is used as the conductive fiber, the conductive fiber is very highly unlikely to break, and the durability and safety of a sensor using the piezoelectric element will be excellent.

The conductive fiber used may be a multifilament consisting of a bundle of multiple filaments, or a monofilament consisting of a single filament. Using multifilaments is preferred from the viewpoint of the long-length stability of the electrical characteristics. The diameter of a monofilament is 1 μm to 5000 μm, and preferably 2 μm to 100 μm. It is more preferably 3 μm to 50 μm. The number of filaments is preferably from 1 to 100,000, more preferably 5 to 500 and even more preferably 10 to 100.

If the diameter is small the strength will be reduced and handling may become difficult, while if the diameter is large there may be some sacrifice of flexibility. The cross-sectional shape of the conductive fiber is preferably circular or elliptical from the viewpoint of design and production of the piezoelectric element, but this is not limitative.

Moreover, a lower electrical resistance is preferred for efficient extraction of electrical output from the piezoelectric polymer, the volume resistivity being preferably no greater than $10^{-1}$ Ω·cm, more preferably no greater than $10^{-2}$ Ω·cm and even more preferably no greater than $10^{-3}$ Ω·cm. However, the resistivity of the conductive fiber is not limited thereto so long as strong signal detection can be obtained.

For use according to the present invention, the conductive fiber must be resistant to movements such as repeated bending and twisting. As one indicator, low flexural rigidity is preferred. Flexural rigidity is generally measured with a measuring apparatus such as a KES-FB2 Pure Bending Tester by KATO TECH CO., LTD. The degree of flexural rigidity suitable for the present invention is preferably lower than the product "HTS40 3K", a carbon fiber multifilament by Toho Tenax Co., Ltd. Specifically, the flexural rigidity of the conductive fiber is preferably no greater than $0.05 \times 10^{-4}$ N·m²/m, more preferably no greater than $0.02 \times 10^{-4}$ N·m²/m and even more preferably no greater than $0.01 \times 10^{-4}$ N·m²/m.
(Piezoelectric Polymer)

The piezoelectric polymer used may be a polymer that exhibits piezoelectricity, such as polyvinylidene fluoride or polylactic acid, but it is preferably one including mainly polylactic acid. Polylactic acid is readily oriented and exhibits piezoelectricity by stretching after melt spinning, and has excellent productivity since it does not require electric field orientation treatment as is necessary with polyvinylidene fluoride and the like. Furthermore, a piezoelectric fiber is formed from a piezoelectric polymer, but a piezoelectric fiber composed of polylactic acid has low polarization with tension and compression stress in the axial direction and thus has poor function as a piezoelectric element, whereas it produces relatively large electrical output under shearing stress, which is preferable for a piezoelectric element of the invention having a construction in which shearing stress tends to be applied to the piezoelectric polymer.

The piezoelectric polymer preferably includes mainly polylactic acid. The term "mainly" means preferably 90 mol % or greater, more preferably 95 mol % or greater and even more preferably 98 mol % or greater.

Polylactic acid includes poly-L-lactic acid obtained by polymerization of L-lactic acid and L-lactide, poly-D-lactic acid obtained by polymerization of D-lactic acid and D-lactide, and stereocomplex polylactic acid comprising a hybrid structure of these, depending on the crystal structure, and any of these may be used so long as they exhibit piezoelectricity. Poly-L-lactic acid and poly-D-lactic acid are preferred from the viewpoint of a high piezoelectric modulus. Since poly-L-lactic acid and poly-D-lactic acid exhibit opposite polarization against the same stress, they may be used in combination according to the purpose. The optical purity of the polylactic acid is preferably 99% or greater, more preferably 99.3% or greater and even more preferably 99.5% or greater. If the optical purity is less than 99% the piezoelectric modulus may be significantly lowered, potentially making it difficult to obtain sufficient electrical output by shape deformation of the piezoelectric fiber. The piezoelectric polymer includes mainly poly-L-lactic acid or poly-D-lactic acid, preferably with an optical purity of 99% or greater.

The piezoelectric fibers formed from the piezoelectric polymer preferably are uniaxially oriented in the fiber axis direction of the covered fiber and include crystals, and more preferably they are uniaxially oriented polylactic acid with crystals. This is because polylactic acid exhibits high piezoelectricity in a crystalline state and when uniaxially oriented.

Since polylactic acid is a polyester with relatively rapid hydrolysis, a publicly known hydrolysis preventer such as an isocyanate compound, oxazoline compound, epoxy compound or carbodiimide compound may be added when resistance to moist heat is an issue. Also, if necessary, an antioxidant, plasticizer, photodegradation inhibitor or the like such as a phosphoric acid-based compound may be added to modify the physical properties.

Moreover, polylactic acid may be used as an alloy with another polymer, in which case if polylactic acid is to be used as the main piezoelectric polymer, the amount of the polylactic acid is preferably at least 50 wt % or greater, more preferably 70 wt % or greater and most preferably 90 wt % or greater, based on the total weight of the alloy.

In the case of an alloy, suitable examples of polymers other than polylactic acid include polybutylene terephthalate, polyethylene terephthalate, polyethylene naphthalate copolymer and polymethacrylate, with no limitation to these, and any polymer may be used so long as the piezoelectricity that is the object of the invention is exhibited.

In order to obtain a piezoelectric fiber from the piezoelectric polymer, any publicly known method for forming a fiber from a polymer may be employed so long as the effect of the invention can be exhibited, such as a method of forming a fiber by extrusion molding of a piezoelectric polymer, a method of forming a fiber by melt spinning of a piezoelectric polymer, a method of forming a fiber by dry or wet spinning of a piezoelectric polymer, or a method of forming a fiber by electrostatic spinning of a piezoelectric polymer. The spinning conditions employed may be according to a publicly known process suitable for the piezoelectric polymer used, and for most cases a melt spinning process may be employed, which facilitates industrial production.

As mentioned above, when the piezoelectric polymer is polylactic acid, it will exhibit greater piezoelectricity if oriented by uniaxial stretching and if it contains crystals, and therefore the fiber is preferably stretched.

(Covering)

Each conductive fiber has the surface covered with piezoelectric fibers formed from a piezoelectric polymer. The thickness of the piezoelectric fiber layer covering the conductive fiber is preferably 1 µm to 10 mm, more preferably 5 µm to 5 mm, even more preferably 10 µm to 3 mm and most preferably 20 µm to 1 mm. If it is too thin, problems may result in terms of strength, while if it is too thick, it may be difficult to extract electrical output.

It is preferred for the conductive fiber to be as closely bonded as possible with the piezoelectric fibers, but for improved adhesiveness, an anchor layer or adhesive layer may be provided between the conductive fiber and the piezoelectric fibers.

The covering method used is a method of winding the piezoelectric fibers around the conductive fiber. The shape of the piezoelectric fiber layer, on the other hand, is not particularly restricted so long as an electrical output can be outputted in response to applied stress.

The covering state of the conductive fiber of the piezoelectric polymer is not particularly restricted in terms of the forms of the conductive fiber and piezoelectric fibers, but they are preferably as nearly concentric as possible. When a multifilament is used as the conductive fiber, the piezoelectric fibers need only be covering so that at least a portion of the surface of the multifilament (the peripheral surface of the fiber) is contacting, and the piezoelectric fibers may cover all, or not all, of the filament surfaces (peripheral surfaces of the fibers) of the multifilament. The covering state of the piezoelectric fibers on each filament in the interior forming the multifilament of a conductive fiber may be set as appropriate, in consideration of performance and handleability of the piezoelectric element.

The piezoelectric element of the invention includes at least one conductive fiber, but the number of conductive fibers is not limited to one and may be more.

Since the piezoelectric element of the invention has no need for electrodes on its surface, there is no need to further cover the piezoelectric element itself, while it also has the advantage of being less likely to malfunction.

(Production Method)

The piezoelectric element of the invention includes a covered fiber wherein the surface of one conductive fiber is covered with piezoelectric fibers. The method for producing the covered fiber may be the following.

(i) A method of preparing the conductive fiber and the stretched piezoelectric fibers in separate steps and winding the piezoelectric fibers around the conductive fiber, is preferred. In this case, the covering is preferably carried out as nearly concentrically as possible.

In this case, the preferred spinning and stretching conditions, when using polylactic acid as the piezoelectric polymer forming the piezoelectric fibers, is a melt spinning temperature of preferably 150 to 250° C., a stretching temperature of preferably 40 to 150° C., a draw ratio of preferably 1.1 to 5.0 and a crystallization temperature of preferably 80 to 170° C.

The winding piezoelectric fibers used may be multifilaments consisting of bundles of multiple filaments, or monofilaments.

The form of winding to cover may be, for example, covering by the piezoelectric fibers in the form of a braided tube, with the conductive fiber as the core inserted in the braided tube. Alternatively, covering may be by a tubular braid formed with the conductive fiber as the core filament and the piezoelectric fibers formed as a braid around its periphery. When the piezoelectric fibers are used as monofilaments, the monofilament diameter is 1 μm to 5 mm, preferably 5 μm to 2 mm and even more preferably 10μ to 1 mm. When used as a multifilament, the monofilament diameter is 0.1 μm to 5 mm, preferably 2 μm to 100 μm and even more preferably 3 μm to 50 μm. The number of filaments for a multifilament is preferably from 1 to 100,000, more preferably 50 to 50,000 and even more preferably 100 to 20,000.

A piezoelectric element of the invention can be obtained by a fiber produced by the method described above, wherein the surface of a conductive fiber is covered with piezoelectric fibers.

The piezoelectric element of the invention does not require formation of a conductive layer on the surface, and it can therefore be produced in a relatively simple manner.

(Protective Layer)

A protective layer may also be provided on the outer surface of the piezoelectric element of the invention. The protective layer preferably has an insulating property, and from the viewpoint of flexibility it is more preferably composed of a polymer. In such cases it will naturally be the protective layer that is rubbed, but there are no particular restrictions so long as the shearing stress caused by rubbing reaches the piezoelectric fibers and can induce polarization. The protective layer is not limited to being formed by coating of the polymer or the like, and it may instead be a film, or a combination of these. An epoxy resin, acrylic resin or the like may be suitably used as the protective layer.

The thickness of the protective layer is as small as possible to facilitate transmission of shearing stress to the piezoelectric polymer, but if it is too small, problems may be caused such as breakdown of the protective layer itself, and it is therefore preferably 10 nm to 200 μm, more preferably 50 nm to 50 μm, even more preferably 70 nm to 30 μm and most preferably 100 nm to 10 μm. The shape of the piezoelectric element may also be created by the protective layer.

(Function)

The piezoelectric element of the invention can be utilized as a sensor that detects the amount of stress and/or the location of stress applied to the piezoelectric element by rubbing of the surface of the piezoelectric element. The piezoelectric element of the invention can, of course, extract electrical output even if shearing stress is applied to the piezoelectric polymer by pressing force instead of rubbing. For example, the "applied stress" may be frictional force between the surface of the piezoelectric element, i.e. the surface of the (piezoelectric fibers of the) covered fiber, and the surface of the contacting object, such as a finger, or it may be resistance in the direction perpendicular to the surface or tip section of the (piezoelectric fibers of the) covered fiber. In particular, the piezoelectric element of the invention facilitates efficient extraction of high electrical output when bending or rubbing has occurred in the direction parallel to the conductive fiber.

The term "applied stress" means high stress of a degree associated with rubbing of the surface with a finger, the amount of the stress of rubbing the surface with a finger being approximately in the range of 1 to 1000 Pa. Needless to mention, it is possible to detect even a greater degree of applied stress at the applied location. When input is made with a finger or the like, preferably operation can be performed with a load of between 1 Pa to 500 Pa, inclusive, and more preferably operation can be performed with a load of between 1 Pa and 100 Pa, inclusive. Naturally, operation can be performed even with a load exceeding 500 Pa, as mentioned above.

(Multiple Piezoelectric Elements)

Multiple piezoelectric elements of the invention may also be used in arrangement. The manner of arrangement may be on one level in one dimension, or overlaid in two dimensions, or their use by weaving into a fabric, or formation in a braided manner. A fabric-like or braided piezoelectric element can also be created in this manner. For a fabric or braided form, blending, union weaving or mixed knitting in combination with fibers other than those of the piezoelectric element, or incorporation into the resin of the housing of a smartphone, may be carried out so long as the object of the invention is achieved.

When a plurality of piezoelectric elements of the invention are arranged in such a manner, an advantage is afforded whereby the manner of arrangement and manner of knitting may be selected within a wide range, since the piezoelectric elements of the invention do not need electrodes on the surface.

When a plurality of piezoelectric elements of the invention are arranged, electrical output can be efficiently extracted because the distance between conductive fibers is short. Furthermore, by maintaining a constant distance between the conductive fibers, it is possible to minimize variation caused by the location of the electrical output.

(Insulating Fiber)

According to the invention, insulating fibers, for example, may also be used at sections other than the covered fiber of the piezoelectric element. In this case, the insulating fibers used may be fibers of a material and shape that are stretchable, in order to improve the flexibility of the piezoelectric element.

By situating insulating fibers in this manner at sections other than the covered fiber, it is possible to improve the performance in terms of operation of the piezoelectric element (for example, aiding movement of a contact probe that employs the piezoelectric element).

Such insulating fibers that are used need only have a volume resistivity of $10^6$ Ω·cm or greater, more preferably $10^8$ Ω·cm or greater and even more preferably $10^{10}$ Ω·cm or greater.

Examples of insulating fibers to be used include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. There is no restriction to these, however, and any publicly known insulating fibers may be used as desired. These insulating fibers may also be used in combination, or combined with fibers having no insulating property to form fibers with an overall insulating property.

Fibers of various publicly known shapes may also be used, for the purpose of imparting flexibility.

(Technology for Use of Piezoelectric Element)

Figure 4:
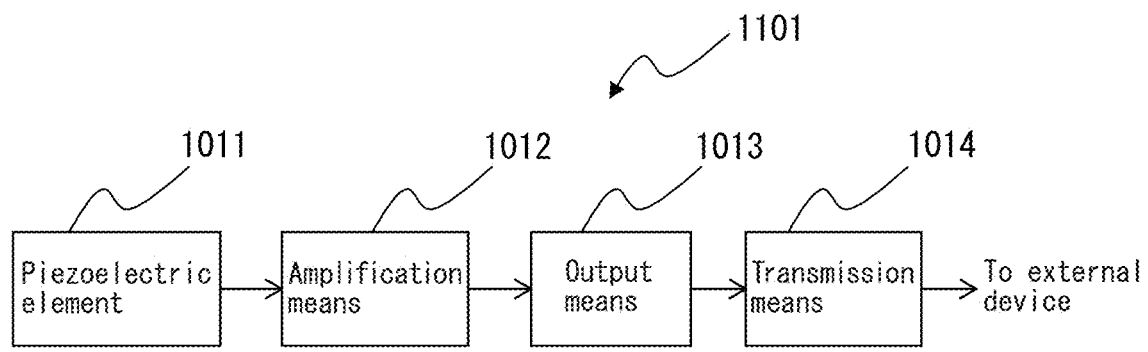
FIG. 4 is a block diagram showing a sensor comprising a piezoelectric element according to the first invention.

Since the piezoelectric element of the invention in any desired form can output contact, pressure and shape deformation on the surface as an electrical signal, it can be utilized as a sensor that detects the amount of stress and/or the location of stress applied to the piezoelectric element. FIG. 4 is a block diagram showing a sensor comprising a piezoelectric element of the invention. By constructing a sensor 1101 comprising a piezoelectric element of the invention 1011, amplification means 1012 that amplifies the electrical signal outputted from the piezoelectric element 1011 in response to applied pressure, output means 1013 that outputs the electrical signal amplified by the amplification means 1012, and transmission means 1014 that transmits the electrical signal outputted from the output means 1013 to an external device (not shown), it is possible to detect the amount and/or applied location of stress applied to the piezoelectric element 1011, by computation processing at the external device (not shown), based on the electrical signal outputted by contact, pressure or shape deformation on the surface of the piezoelectric element 1011. Alternatively, computing means (not shown) may be provided in the sensor 1101, that computes the amount and/or applied location of stress applied to the piezoelectric element 1011, based on the electrical signal outputted from the output means 1013.

The amplification means 1012 may be constructed of different electronic circuits, for example, or it may be constructed as a functional module implemented by a software program that operates on a processor, or it may be constructed of a combination of different electronic circuits and a software program. Examples of processors include a CPU (Central Processing Unit), DSP (Digital Signal Processor), LSI (Large Scale Integration), ASIC (Application Specific Integrated Circuit) and FPGA (Field-Programming Gate Array). The output means 1013 may also be constructed solely of different connectors, for example, or it may be constructed as a communication device integrated with the transmission means 2014. Alternatively, the functions of the amplification means 1012, output means 1013 and transmission means 1014 may be combined in the form of an integrated circuit or microprocessor in which a software program is written. Incidentally, the transmission system using transmission means 1014 may be either wireless or wired, determined as appropriate depending on the sensor to be constructed. In addition, a contact probe may be implemented having the same construction as the sensor described above.

Instead of the amplification means alone, it may also be used in combination with publicly known signal processing means, such as noise-canceling means or means for combined processing with other signals. The order of connection of such means may be modified as appropriate depending on the purpose. Naturally, the electrical signal outputted from the pressure element 1011 may be subjected to signal processing after being directly transmitted to an external device.

Figure 5:
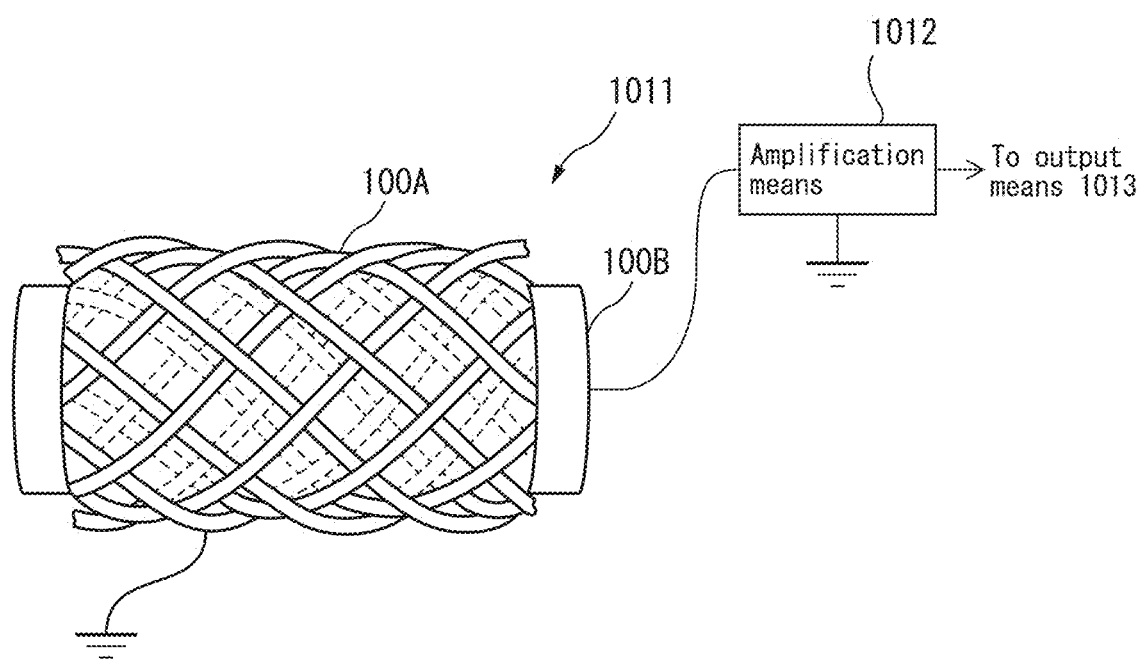
FIG. 5 is a schematic diagram showing an example of connecting a piezoelectric element and amplification means in a sensor comprising a piezoelectric element according to the first invention.

FIG. 5 is a schematic diagram showing an example of connecting a piezoelectric element and amplification means in a sensor comprising a piezoelectric element according to the first invention. The amplification means 1012 of FIG. 5 corresponds to the one explained with reference to FIG. 4, although the illustration in FIG. 5 omits the output means 1013 and transmission means 1014 shown in FIG. 4. When a sensor comprising a piezoelectric element 1011 is to be constructed, for example, a lead wire is connected to the input terminal of the amplification means 1012 from the conductive fiber 100B of the piezoelectric element 1011, and the piezoelectric fibers 100A are connected to a ground (earth) terminal.

The second invention will now be explained in detail.
(Braided Piezoelectric Element)

Figure 6:
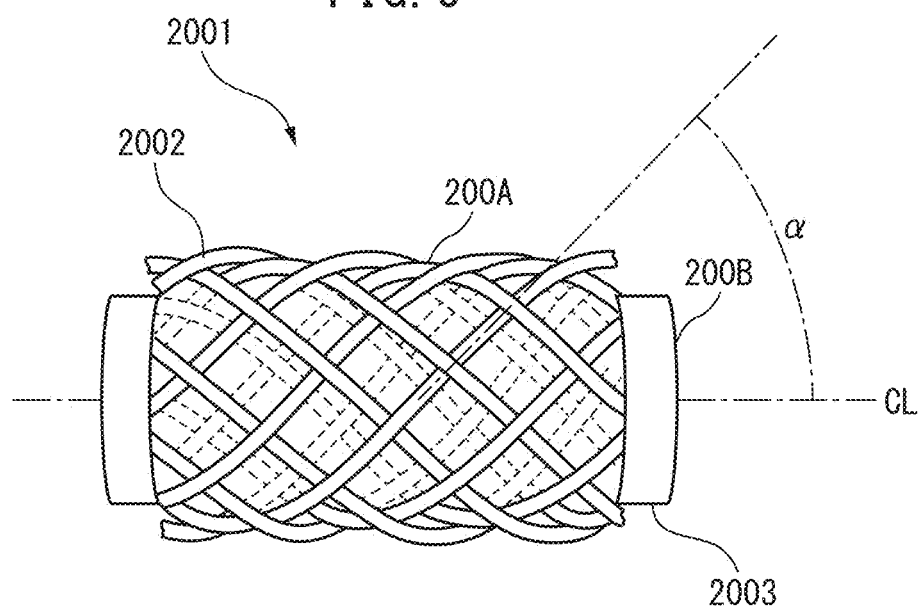
FIG. 6 is a schematic diagram showing an example of the construction of a braided piezoelectric element according to the second invention.

FIG. 6 is a schematic diagram showing an example of the construction of a braided piezoelectric element according to the second invention.

A braided piezoelectric element 2001 comprises a core 2003 formed of a conductive fiber 200B and a sheath 2002 formed of braided piezoelectric fibers 200A covering the core 2003. The piezoelectric fibers 200A may include polylactic acid as the main component. The winding angle α of the piezoelectric fibers 200A with respect to the conductive fiber 200B is between 15° and 750, inclusive.

In the braided piezoelectric element 2001, a plurality of piezoelectric fibers A are closely wound around the outer peripheral surface of at least one conductive fiber 200B. While it is not our intention to be constrained by any particular theory, it is surmised that when deformation is produced in the braided piezoelectric element 2001, stress is produced in each of the piezoelectric fibers 200A by the deformation, producing an electric field in each of the piezoelectric fibers 200A (piezoelectric effect), and as a result a voltage change takes place in the conductive fiber 200B, as superimposition of the electric field of the plurality of piezoelectric fibers 200A wound around the conductive fiber 200B. That is, the electrical signal from the conductive fiber 200B is augmented compared to when the braided sheath 2002 of piezoelectric fibers 200A is not used. This allows a large electrical signal to be extracted with the braided piezoelectric element 2001, even by stress produced by relatively small deformation. Incidentally, the conductive fiber 200B may also consist of a plurality of fibers.

The piezoelectric fibers 200A preferably include polylactic acid as the main component. The term "main component" means that the most abundant component among the components of the piezoelectric fibers 200A is polylactic acid. The percentage of lactic acid units in the polylactic acid is preferably 90 mol % or greater, more preferably 95 mol % or greater and even more preferably 98 mol % or greater.

Also, the winding angle α of the piezoelectric fibers 200A with respect to the conductive fiber 200B is between 15° and 75°, inclusive. That is, the winding angle α of the piezoelectric fibers 200A is between 150 and 75°, inclusive, with respect to the direction of the central axis CL of the conductive fiber 200B (core 2003). For this embodiment, however, the central axis CL of the conductive fiber 200B overlaps with the central axis of the braid of the piezoelectric fibers 200A (sheath 2002) (hereunder also referred to as "braid axis"), and therefore the winding angle α of the piezoelectric fibers 200A may be considered to be between 150 and 75°, inclusive, with respect to the direction of the braid axis of the piezoelectric fibers 200A. From the viewpoint of extracting an even larger electrical signal, the angle α is preferably between 250 and 650, inclusive, more preferably between 350 and 550, inclusive and even more preferably between 400 and 500, inclusive. If the angle α is outside of the angle range, the electric field generated in the piezoelectric fibers 200A will be notably reduced, thereby notably reducing the electrical signal obtained by the conductive fiber 200B.

The angle α may also be considered to be the angle formed between the main direction of the piezoelectric fibers 200A forming the sheath 2002 and the central axis CL of the conductive fiber 200B, and some of the piezoelectric fibers 200A may even be relaxed or fluffed.

The reason for the notable reduction in the electric field produced in the piezoelectric fibers 200A is as follows. The piezoelectric fibers 200A are composed mainly of polylactic acid, and are uniaxially oriented in the direction of the fiber axis of the piezoelectric fibers 200A. Polylactic acid produces an electric field when subjected to shearing stress with respect to the orientation direction (in this case, the direction of the fiber axis of the piezoelectric fibers 200A), but produces little electric field when subjected to tensile stress or compression stress with respect to the orientation direction. Consequently, in order to produce shearing stress on the piezoelectric fibers 200A under deformation parallel to the direction of the braid axis, it is thought to be desirable for the orientation direction of the piezoelectric fibers 200A (polylactic acid) to be in a prescribed angle range with respect to braid axis.

In the braided piezoelectric element 2001, so long as the object of the invention is achieved, combined filaments may be prepared in combination with fibers other than the piezoelectric fibers 200A for the sheath 2002, and combined filaments may be prepared in combination with fibers other than the conductive fiber 200B for the core 2003.

There are no particular restrictions on the length of the braided piezoelectric element composed of the core 2003 of the conductive fiber 200B and the sheath 2002 of the braided piezoelectric fibers 200A. For example, the braided piezoelectric element may be produced in a continuous manner during production, and cut to the necessary length afterwards for use. The length of the braided piezoelectric element is 1 mm to 10 m, preferably 5 mm to 2 m and more preferably 1 cm to 1 m. If the length is too short the convenience of the fiber shape may be lost, and if the length is too long it may become necessary to consider the resistance value of the conductive fiber 200B.

Each of the structural aspects will now be explained in greater detail.

(Conductive Fiber)

The conductive fiber 200B used may be any publicly known one that exhibits conductivity. Examples for the conductive fiber 200B include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber winding. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity. Fibers that have been metal-plated in this manner may be considered to be metal-plated fibers.

The base fiber that has been coated with a metal may be a publicly known fiber, regardless of the presence or absence of conductivity, examples of which include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these and any publicly known fiber may be used, or combinations of these fibers may be used.

The metal to be coated onto the base fiber may be any type that exhibits conductivity and exhibits the effect of the invention. Examples to be used include gold, silver, platinum, copper, nickel, tin, zinc, palladium, indium tin oxide, copper sulfide and the like, as well as their mixtures and alloys.

When an organic fiber coated with a metal with bending resistance is used as the conductive fiber 200B, the conductive fiber is very highly unlikely to break, and the durability and safety of a sensor using the piezoelectric element will be excellent.

The conductive fiber 200B may be a multifilament consisting of a bundle of multiple filaments, or a monofilament consisting of a single filament. A multifilament is preferred from the viewpoint of the long-length stability of the electrical characteristics. In the case of a monofilament (including spun yarn), the monofilament diameter is 1 m to 5000 μm and preferably 2 μm to 100 μm. It is more preferably 3 μm to 50 μm. In the case of a multifilament, the number of filaments is preferably from 1 to 100,000, more preferably 5 to 500 and even more preferably 10 to 100. However, the fineness and number of conductive fibers 200B is the fineness and number of cores 2003 used to prepare the braid, and a multifilament formed of a plurality of single threads (monofilaments) is counted as one conductive fiber 200B. The core 2003 is the overall amount, including fibers other than conductive fibers when they are used.

If the diameter of the fiber is small the strength will be reduced and handling may become difficult, while if the diameter is large there may be some sacrifice of flexibility. The cross-sectional shape of the conductive fiber 200B is preferably circular or elliptical from the viewpoint of design and production of the piezoelectric element, but this is not limitative.

Moreover, a lower electrical resistance is preferred for efficient extraction of electrical output from the piezoelectric polymer, the volume resistivity being preferably no greater than $10^{-1}$ Ω·cm, more preferably no greater than $10^{-2}$ Ω·cm and even more preferably no greater than $10^{-3}$ Ω·cm. However, the resistivity of the conductive fiber 200B is not limited thereto so long as sufficient strength can be obtained for detection of the electrical signal.

For use according to the present invention, the conductive fiber 200B must be resistant to movements such as repeated bending and twisting. As one indicator, a larger knot tenacity is preferred. The knot tenacity can be measured by the method of JIS L1013:2010 8.6. The degree of knot tenacity suitable for the invention is preferably 0.5 cN/dtex or greater, more preferably 1.0 cN/dtex or greater, even more preferably 1.5 cN/dtex or greater and most preferably 2.0 cN/dtex or greater. As another indicator, low flexural rigidity is preferred. Flexural rigidity is generally measured with a measuring apparatus such as a KES-FB2 Pure Bending Tester by KATO TECH CO., LTD. The degree of flexural rigidity suitable for the invention is preferably lower than the carbon fibers TENAX® HTS40-3K by Toho Tenax Co., Ltd. Specifically, the flexural rigidity of the conductive fiber is preferably no greater than $0.05 \times 10^{-4}$ N·m²/m, more preferably no greater than $0.02 \times 10^{-4}$ N·m²/m and even more preferably no greater than $0.01 \times 10^{-4}$ N·m²/m.

(Piezoelectric Fibers)

The piezoelectric polymer used as the material for the piezoelectric fibers 200A may be a polymer exhibiting piezoelectricity such as polyvinylidene fluoride or polylactic acid, but the piezoelectric fibers 200A described above for this embodiment preferably include polylactic acid as the main component. Polylactic acid is readily oriented and exhibits piezoelectricity by stretching after melt spinning, for example, and has excellent productivity since it does not require electric field orientation treatment as is necessary with polyvinylidene fluoride and the like. However, this is not intended to exclude the use of polyvinylidene fluoride and other piezoelectric materials for carrying out the present invention.

Polylactic acid includes poly-L-lactic acid obtained by polymerization of L-lactic acid and L-lactide, poly-D-lactic acid obtained by polymerization of D-lactic acid and D-lactide, and stereocomplex polylactic acid comprising a hybrid structure of these, depending on the crystal structure, and any of these may be used so long as they exhibit piezoelectricity. Poly-L-lactic acid and poly-D-lactic acid are preferred from the viewpoint of a high piezoelectric modulus. Since poly-L-lactic acid and poly-D-lactic acid exhibit opposite polarization against the same stress, they may be used in combination according to the purpose.

The optical purity of polylactic acid is preferably 99% or greater, more preferably 99.3% or greater and even more preferably 99.5% or greater. If the optical purity is less than 99% the piezoelectric modulus may be significantly lowered, potentially making it difficult to obtain a sufficient electrical signal by shape deformation of the piezoelectric fibers A. In particular, the piezoelectric fibers A include poly-L-lactic acid or poly-D-lactic acid as the main component, preferably with an optical purity of 99% or greater.

Piezoelectric fibers 200A composed mainly of polylactic acid are stretched during production, and are uniaxially oriented in their fiber axis direction. Furthermore, preferably the piezoelectric fibers 200A are not only uniaxially oriented in the fiber axis direction but also include polylactic acid crystals, and more preferably they include uniaxially oriented polylactic acid crystals. This is because polylactic acid exhibits higher piezoelectricity by having high crystallinity and being uniaxially oriented.

The crystallinity and uniaxial orientation are determined by the homo PLA crystallinity $X_{homo}$ (%) and crystal orientation Ao (%). The piezoelectric fibers A of the invention preferably have a homo PLA crystallinity $X_{homo}$ (%) and crystal orientation Ao (%) satisfying the following inequality (1).

$$X_{homo} \times Ao \times Ao \div 10^6 \geq 0.26 \quad (1)$$

If inequality (1) is not satisfied, the crystallinity and/or uniaxial orientation will be insufficient, the output value of the electrical signal for operation may be reduced and the sensitivity of the signal for operation in a specific direction may be reduced. The value of the left side of inequality (1) is more preferably 0.28 or greater, and more preferably 0.3 or greater. Each of the values is determined in the following manner.

Homopolylactic Acid Crystallinity $X_{homo}$:

The homopolylactic acid crystallinity $X_{homo}$ is determined from crystal structure analysis by wide-angle X-ray diffraction (WAXD). In wide-angle X-ray diffraction (WAXD), an Ultrax18 X-ray diffraction apparatus by Rigaku Corp. is used by a transmission method, and the X-ray diffraction pattern of a sample is recorded on an imaging plate under the following conditions.
X-ray source: Cu-Kα rays (confocal mirror)
Output: 45 kV×60 mA
Slits: 1st: 1 mmΦ, 2nd: 0.8 mmΦ
Camera length: 120 mm
Elapsed time: 10 minutes
Sample: 35 mg of polylactic acid fibers are aligned to form a 3 cm fiber bundle.

The total scattering intensity $I_{total}$ over the declination in the obtained X-ray diffraction pattern is determined, and the sum $\Sigma I_{HMi}$ of the integrated intensity for each diffraction peak attributed to homopolylactic acid crystals, appearing near $2\theta=16.5°$, 18.5° and 24.3°, is calculated. Based on these values, the homopolylactic acid crystallinity $X_{homo}$ is calculated by the following formula (2).

$$\text{Homopolylactic acid crystallinity } X_{homo}(\%) = \Sigma I_{HMi} / I_{total} \times 100 \quad (2)$$

The value of $\Sigma I_{HMi}$ is calculated by subtracting the background and amorphous diffuse scattering from the total scattering intensity.

(2) Crystal Orientation Ao:

In the X-ray diffraction pattern obtained by the aforementioned wide-angle X-ray diffraction (WAXD), the crystal orientation Ao has an intensity distribution with respect to the declination (°) for the diffraction peaks attributable to homopolylactic acid crystals, appearing near $2\theta=16.5°$ in the radius vector direction, and it is calculated from the sum $\Sigma W_i$ (°) of the half-widths in the obtained distribution profile, using the following formula (3).

$$\text{Crystal orientation } Ao(\%) = (360 - \Sigma W_i) \div 360 \times 100 \quad (3)$$

Incidentally, since polylactic acid is a polyester with relatively rapid hydrolysis, a publicly known hydrolysis preventer such as an isocyanate compound, oxazoline compound, epoxy compound or carbodiimide compound may be added when resistance to moist heat is an issue. Also, if necessary, an antioxidant, plasticizer, photodegradation inhibitor or the like such as a phosphoric acid-based compound may be added to modify the physical properties.

Moreover, polylactic acid may be used as an alloy with another polymer, in which case if polylactic acid is to be used as the main piezoelectric polymer, the amount of the polylactic acid is preferably at least 50 mass % or greater, more preferably 70 mass % or greater and most preferably 90 mass % or greater, based on the total weight of the alloy.

In the case of an alloy, suitable examples of polymers other than polylactic acid include polybutylene terephthalate, polyethylene terephthalate, polyethylene naphthalate copolymer and polymethacrylate, with no limitation to these, and any polymer may be used so long as the piezoelectricity that is the object of the invention is exhibited.

The piezoelectric fibers 200A may be multifilaments consisting of bundles of multiple filaments, or a monofilament consisting of a single filament. In the case of monofilaments (including spun yarn), the monofilament diameter is 1 μm to 5 mm, preferably 5 μm to 2 mm and even more preferably 10 μm to 1 mm. In the case of multifilaments, the monofilament diameter is 0.1 μm to 5 mm, preferably 2 μm to 100 μm and even more preferably 3 μm to 50 μm. The number of filaments for a multifilament is preferably from 1 to 100,000, more preferably 50 to 50,000 and even more preferably 100 to 20,000. However, the fineness and number of piezoelectric fibers 200A is the fineness and number per carrier when preparing the braid, and a multifilament formed of a plurality of single threads (monofilaments) is counted as one piezoelectric fiber 200A. One carrier includes the overall amount, including fibers other than piezoelectric fibers when they are used.

In order to obtain piezoelectric fibers 200A from such a piezoelectric polymer, any publicly known method for forming fibers from a polymer may be employed so long as the effect of the invention is exhibited. For example, a method of forming fibers by extrusion molding of the piezoelectric polymer, a method of forming fibers by melt spinning of the piezoelectric polymer, a method of forming fibers by dry or wet spinning of the piezoelectric polymer, a method of forming fibers by electrostatic spinning of the piezoelectric polymer, or a method of forming a film and then finely cutting it, may be employed. The spinning conditions employed may be according to a publicly known process suitable for the piezoelectric polymer used, and for most cases a melt spinning process may be employed, which facilitates industrial production. After formation of the fibers, the formed fibers may also be stretched. This will form piezoelectric fibers 200A that are uniaxially stretched and oriented, include crystals, and exhibit high piezoelectricity.

In addition, the piezoelectric fibers 200A may be treated by dyeing, twisting, doubling, heat treatment or the like, before braiding of the fibers prepared as described above.

In addition, since the piezoelectric fibers 200A will sometimes become twisted together or broken, or produce fluff, during formation of the braid, their strength and abrasion resistance is preferably high, the strength being preferably 1.5 cN/dtex or greater, more preferably 2.0 cN/dtex or greater, even more preferably 2.5 cN/dtex or greater and most preferably 3.0 cN/dtex or greater. The abrasion resistance can be evaluated by JIS L1095:2010 9.10.2, Method B, with an abrasion pass count of preferably 100 or greater, more preferably 1000 or greater, even more preferably 5000 or greater and most preferably 10,000 or greater. The method of increasing the abrasion resistance is not particularly restricted, and any publicly known method may be used, such as increasing the degree of crystallinity, adding fine particles, or surface processing. Abrasion can also be reduced by coating the fibers with a lubricating agent during processing of the braid.

Also, the difference in the shrinkage factor of the piezoelectric fibers is preferably small compared to the shrinkage factor of the conductive fiber mentioned above. If the difference in shrinkage factors is large, the braid may bend or the fabric may lose flatness in the post-treatment steps after formation of the braid or after formation of the fabric, or when subjected to heat or with passage of time during actual use, often resulting in a weaker piezoelectric signal. When the shrinkage factor has been quantified by the boiling water shrinkage ratio as described below, the boiling water shrinkage ratio of the piezoelectric fibers S(p) and the boiling water shrinkage ratio of the conductive fiber S(c) preferably satisfy the following inequality (4).

$$|S(p)-S(c)| \leq 10 \quad (4)$$

The left side of inequality (4) is more preferably ≤5 and even more preferably ≤3.

The difference in the shrinkage factor of the piezoelectric fibers is also preferably small compared to the shrinkage factor of fibers other than the conductive fiber, such as insulating fibers. If the difference in shrinkage factors is large, the braid may bend or the fabric may lose flatness in the post-treatment steps after formation of the braid or after formation of the fabric, or when subjected to heat or with passage of time during actual use, often resulting in a weaker piezoelectric signal. When the shrinkage factor has been quantified by the boiling water shrinkage ratio, the boiling water shrinkage ratio of the piezoelectric fibers S(p) and the boiling water shrinkage ratio of the insulating fibers S(i) preferably satisfy the following inequality (5).

$$|S(p)-S(i)| \leq 10 \quad (5)$$

The left side of inequality (5) is more preferably ≤5 and even more preferably ≤53.

The shrinkage factor of the piezoelectric fibers is also preferably small. For example, when the shrinkage factor has been quantified by the boiling water shrinkage ratio, the shrinkage factor of the piezoelectric fibers is preferably no greater than 15%, more preferably no greater than 10%, even more preferably no greater than 5% and most preferably no greater than 3%. The means used to lower the shrinkage factor may be any publicly known method, and for example, the shrinkage factor can be lowered by heat treatment to relax the orientation of the amorphous sections or to increase the degree of crystallinity, without any particular restrictions on the timing of heat treatment, which may be after stretching, after twisting, after braiding or after fabric formation. The boiling water shrinkage ratio described above was measured by the following method. A reel with 20 winds was prepared using a sizing reel having a frame circumference of 1.125 m, a 0.022 cN/dtex load was applied, it was suspended from a scale board, and the initial reel length L0 was measured. The reel was then treated for 30 minutes in a boiling water bath at 100° C. and allowed to cool, a load was again applied, it was suspended from the scale board, and the contracted reel length L was measured. The measured L0 and L values were used to calculate the boiling water shrinkage ratio by the following formula (6).

$$\text{Boiling water shrinkage ratio}=(L0-L)/L0 \times 100(\%) \quad (6)$$

(Covering)

The conductive fiber 200B, i.e. the core 2003, has its surface covered by the piezoelectric fibers 200A, i.e. the braided sheath 2002. The thickness of the sheath 2002 covering the conductive fiber 200B is preferably 1 μm to 10 mm, more preferably 5 m to 5 mm, even more preferably 10 μm to 3 mm and most preferably 20 μm to 1 mm. If it is too thin, problems may result in terms of strength, and if it is too thick, the braided piezoelectric element 2001 may become hard and more resistant to deformation. The "sheath 2002" referred to here is the layer adjacent to the core 2003.

In the braided piezoelectric element 2001, the total fineness of the piezoelectric fibers 200A of the sheath 2002 is preferably at least ½ and no greater than 20 times, more preferably at least 1 and no greater than 15 times, and even more preferably at least 2 and no greater than 10 times, the total fineness of the conductive fiber 200B of the core 2003. If the total fineness of the piezoelectric fibers 200A is too small with respect to the total fineness of the conductive fiber 200B, there will be too few piezoelectric fibers 200A surrounding the conductive fiber 200B and the conductive fiber 200B will not be able to sufficiently output an electrical signal, while the conductive fiber 200B may potentially contact with other adjacent conductive fibers. If the total fineness of the piezoelectric fibers 200A is too large with respect to the total fineness of the conductive fiber 200B, there will be too many piezoelectric fibers 200A surrounding the conductive fiber 200B, and the braided piezoelectric element 2001 will become too hard and resistant to deformation. In other words, the braided piezoelectric element 2001 will fail to adequately function as a sensor in both cases.

The total fineness referred to here is the sum of all of the finenesses of the piezoelectric fibers 200A composing the sheath 2002, and in the case of a common 8-strand braid, for example, it is the sum of the finenesses of the 8 strands.

Also, in the braided piezoelectric element 2001, the fineness per piezoelectric fiber 200A of the sheath 2002 is preferably at least ½0 and no greater than 2 times, more preferably at least ⅕ and no greater than 1.5 times, and even more preferably at least ⅒ and no greater than 1 times, the total fineness of the conductive fiber 200B. If the fineness per piezoelectric fiber 200A is too small with respect to the total fineness of the conductive fiber 200B, there will be too few piezoelectric fibers 200A and the conductive fiber 200B will not be able to sufficiently output an electrical signal, while the piezoelectric fibers 200A may potentially undergo breakage. If the fineness per the piezoelectric fiber 200A is too large with respect to the total fineness of the conductive fiber 200B, the piezoelectric fibers 200A will be too thick and the braided piezoelectric element 2001 will become too hard and resistant to deformation. In other words, the braided piezoelectric element 2001 will fail to adequately function as a sensor in both cases.

Incidentally, when metal fiber is used for the conductive fiber 200B or when metal fiber is combined with the conductive fiber 200B or piezoelectric fibers 200A, the fineness proportion is not limited to that mentioned above. This is because according to the invention, the proportion is important from the standpoint of the contact area and coverage factor, i.e. the area and volume. For example, if the specific gravity of each of the fibers exceeds 2, the proportion of the mean cross-sectional area of the fibers is preferably the same as the fineness proportion.

It is preferred for the piezoelectric fibers 200A and the conductive fiber 200B to be as closely bonded as possible, but for improved adhesiveness, an anchor layer or adhesive layer may be provided between the conductive fiber 200B and the piezoelectric fibers 200A.

The covering method employed is a method of using the conductive fiber 200B as the core thread and winding the piezoelectric fibers 200A in a braided fashion around it. On the other hand, the form of the braid of the piezoelectric fibers 200A is not particularly restricted so long as an electrical signal can be outputted in response to stress produced by an applied load, but it is preferably an 8-strand braid or a 16-strand braid with the core 2003.

The form of the conductive fiber 200B and the piezoelectric fibers 200A is not particularly restricted, but they are preferably as nearly concentric as possible. When a multifilament is used as the conductive fiber 200B, the piezoelectric fibers 200A need only be covering so that at least a portion of the surface of the multifilament of the conductive fiber 200B (the peripheral surface of the fiber) is contacting, and the piezoelectric fibers 200A may cover all, or not all, of the filament surfaces (peripheral surfaces of the fibers) of the multifilament. The covering state of the piezoelectric fibers 200A on each filament in the interior forming the multifilament of the conductive fiber 200B may be set as appropriate, in consideration of performance and handleability of the piezoelectric element.

Since the braided piezoelectric element 2001 of the invention has no need for electrodes on its surface, there is no need to further cover the braided piezoelectric element 2001 itself, while it also has the advantage of being less likely to malfunction.

(Production Method)

The braided piezoelectric element 2001 of the invention has the surface of at least one conductive fiber 200B covered by the braided piezoelectric fibers 200A, and the method for its production may be the following, for example. That is, a method of preparing the conductive fiber 200B and the piezoelectric fibers 200A in separate steps, and winding the piezoelectric fibers 200A in braided form around the conductive fiber 200B to cover it. In this case, the covering is preferably carried out as nearly concentrically as possible.

In this case, the preferred spinning and stretching conditions, when using polylactic acid as the piezoelectric polymer forming the piezoelectric fibers 200A, is a melt spinning temperature of preferably 150° C. to 250° C., a stretching temperature of preferably 40° C. to 150° C., a draw ratio of preferably 1.1 to 5.0 and a crystallization temperature of preferably 80° C. to 170° C.

The piezoelectric fibers 200A to be used by winding around the conductive fiber 200B may be multifilaments consisting of bundles of multiple filaments, or monofilaments (including spun yarn). The conductive fiber 200B around which the piezoelectric fibers 200A are to be wound may also be a multifilament consisting of bundles of multiple filaments, or a monofilament (including spun yarn).

The preferred manner of covering is to use the conductive fiber 200B as the core thread and braid the piezoelectric fibers 200A around its periphery in a braided form to prepare a tubular braid to cover it. More specifically, this may be an 8-strand braid or 16-strand braid with the core 2003. However, the piezoelectric fibers 200A may be in the form of a braided tube, for example, with the conductive fiber 200B as the core inserted in the braided tube to cover it.

The braided piezoelectric element 2001 having the surface of the conductive fiber 200B covered with the braided piezoelectric fibers 200A can be obtained by the production method described above.

The braided piezoelectric element 2001 of the invention does not require formation of an electrical signal-detecting electrode on the surface, and it can therefore be produced in a relatively simple manner.

(Protective Layer)

A protective layer may also be provided on the outer surface of the braided piezoelectric element 2001 of the invention. The protective layer preferably has an insulating property, and from the viewpoint of flexibility it is more preferably composed of a polymer. When the protective layer is given an insulating property, naturally the entire protective layer will also be deformed as well and it will be the top of the protective layer that is rubbed, but there are no particular restrictions so long as the external force reaches the piezoelectric fibers 200A and can induce polarization. The protective layer is not limited to being formed by coating of the polymer or the like, and it may instead be a wound film, fabric, fiber or the like, or a combination of these.

The thickness of the protective layer is as small as possible to facilitate transmission of shearing stress to the piezoelectric fibers 200A, but if it is too small, problems may be caused such as breakdown of the protective layer itself, and it is therefore preferably 10 nm to 200 μm, more preferably 50 nm to 50 μm, even more preferably 70 nm to 30 μm and most preferably 100 nm to 10 μm. The shape of the piezoelectric element may also be created by the protective layer.

In addition, an electromagnetic shield layer may be incorporated into the braid structure in order to reduce noise. The electromagnetic shield layer is not particularly restricted, but a conductive substance may be coated, or a conductive film, fabric, fiber or the like may be wound. The volume resistivity of the electromagnetic shield layer is preferably no greater than $10^{-1}$ Ω·cm, more preferably no greater than $10^{-2}$ Ω·cm and even more preferably no greater than $10^{-3}$ Ω·cm. However, the resistivity is not limited to this range so long as the effect of the electromagnetic shield layer can be obtained. The electromagnetic shield layer may be provided on the surface of the piezoelectric fibers 200A of the sheath, or it may be provided on the outer side of the aforementioned protective layer. Naturally, multiple layers of the electromagnetic shield layer and protective layer may be overlaid, the order being suitably determined according to the purpose.

In addition, a plurality of layers made of piezoelectric fibers may be provided, or a plurality of layers made of conductive fibers for signal extraction may be provided. Naturally, the number and order of the protective layer, electromagnetic shield layer, layer made of piezoelectric fibers and layer made of conductive fibers may be determined as appropriate according to the purpose. The winding method may be a method of additionally forming a braid structure over the outer layer of the sheath 2002, or a method of forming a cover ring.

(Function)

The braided piezoelectric element 2001 of the invention can be utilized as a sensor that detects the amount and/or location of application of stress produced when a load is applied to the braided piezoelectric element 2001 by, for example, rubbing of the surface of the braided piezoelectric element 2001, or in other words stress applied to the braided piezoelectric element 2001. In addition, the braided piezoelectric element 2001 of the invention can, of course, extract an electrical signal even if shearing stress is applied to the piezoelectric fibers 200A by pressing force or bending deformation instead of rubbing. For example, the "applied stress" on the braided piezoelectric element 2001 may be frictional force between the surface of the piezoelectric element, i.e. the surfaces of the piezoelectric fibers 200A, and the surface of the contacting object, such as a finger, or it may be resistance in the direction perpendicular to the surface or tip section of the piezoelectric fibers 200A, or resistance against bending deformation of the piezoelectric fibers 200A. The braided piezoelectric element 2001 of the invention can efficiently output a particularly large electrical signal when bending or rubbing has occurred in the direction parallel to the conductive fiber 200B.

The "applied stress" on the braided piezoelectric element 2001 is approximately 1 to 1000 Pa, as a rule, for the level of stress of rubbing of a surface with a finger, for example. Needless to mention, it is possible to detect even a greater degree of applied stress, at the applied location. When input is made with a finger or the like, preferably operation can be performed with a load of between 1 Pa to 500 Pa, inclusive, and more preferably operation can be performed with a load of between 1 Pa and 100 Pa, inclusive. Naturally, operation can be performed even with a load exceeding 500 Pa, as mentioned above.

(Fabric-Like Piezoelectric Element)

Figure 7:
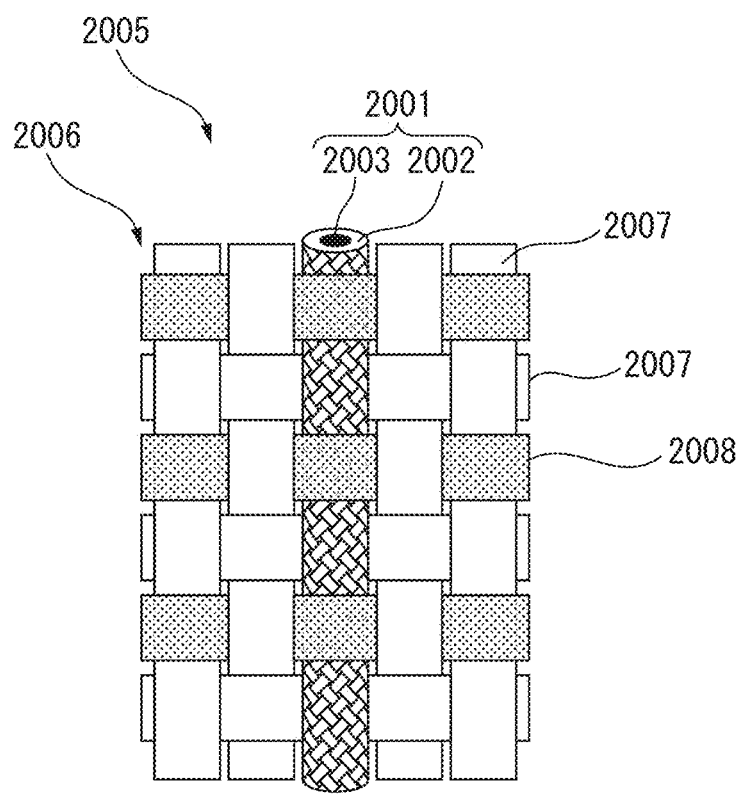
FIG. 7 is a schematic diagram showing an example of the construction of a fabric-like piezoelectric element according to the second invention.

FIG. 7 is a schematic diagram showing an example of the construction of a fabric-like piezoelectric element using a braided piezoelectric element according to the second invention.

The fabric-like piezoelectric element 2005 comprises a fabric 2006 including at least one braided piezoelectric element 2001. The fabric 2006 may be any type of woven or knitted fabric wherein at least one of the fibers (including braids) composing the fabric is a braided piezoelectric element 2001, with no particular limitation so long as the braided piezoelectric element 2001 can exhibit the function of a piezoelectric element. For a fabric, union weaving, mixed knitting or the like may be carried out with other fibers (including braids), so long as the object of the invention is achieved. Naturally, the braided piezoelectric element 2001 may be used as a portion of fibers composing a fabric (for example, warp thread or weft thread), or the braided piezoelectric element 2001 may be embroidered or bonded with a fabric. In the example shown in FIG. 7, the fabric-like piezoelectric element 2005 is a plain weave fabric having at least one braided piezoelectric element 2001 and insulating fibers 2007 arranged as warp thread and the conductive fibers 2008 and insulating fibers 2007 alternately arranged as weft thread. The conductive fibers 2008 may be of the same type as the conductive fiber 200B or a different type of conductive fiber, and the insulating fibers 2007 are described below. All or some of the insulating fibers 2007 and/or conductive fibers 2008 may also be in braided form.

In this case, when the fabric-like piezoelectric element 2005 has deformed by bending or the like, the braided piezoelectric element 2001 also deforms in a manner following that deformation, and the deformation of the fabric-like piezoelectric element 2005 can be detected by the electrical signal outputted from the braided piezoelectric element 2001. Furthermore, since the fabric-like piezoelectric element 2005 can be used as a fabric (woven or knitted fabric), it can be applied as a wearable sensor in the form of clothing, for example.

In addition, in the fabric-like piezoelectric element 2005 shown in FIG. 7, the conductive fibers 2008 are in crossing contact with the braided piezoelectric element 2001. Therefore, the conductive fibers 2008 are in crossing contact with at least portions of the braided piezoelectric element 2001, covering it, thereby blocking at least some of the electromagnetic waves directed toward the braided piezoelectric element 2001 from the exterior. The conductive fibers 2008 are grounded (earthed) so as to have a function of reducing the effects of electromagnetic waves on the braided piezoelectric element 2001. That is, the conductive fibers 2008 can function as an electromagnetic shield for the braided piezoelectric element 2001. Thus, it is possible to significantly increase the S/N ratio of the fabric-like piezoelectric element 2005 even without layering a conductive fabric as an electromagnetic shield above and below the fabric-like piezoelectric element 2005, for example. In this case, the proportion of conductive fibers 2008 in the weft thread crossing with the braided piezoelectric element 2001 (in the case of FIG. 7) is preferably higher from the viewpoint of electromagnetic shielding. Specifically, at least 30%, more preferably at least 40% and even more preferably material 50% of the fibers forming the fabric 2006 and crossing with the braided piezoelectric element 2001, are conductive fibers. In this type of fabric-like piezoelectric element 2005, conductive fibers may be inserted for at least some of the fibers composing the fabric, to allow an electromagnetic wave shield functioning fabric-like piezoelectric element 2005 to be obtained.

Examples for the woven texture of the woven fabric include three foundation weaves such as plain weave, twill weave or satin weave, half-double weaves such as derivative weave, warp backed weave and weft backed weave, and warp velvet weaves. The type of knitted fabric may be a circular knit fabric (weft knitted fabric) or a warp knitted fabric. Examples of preferred textures of circular knit fabrics (weft knitted fabrics) include plain stitch, rib stitch, interlock stitch, purl stitch, tuck stitch, float stitch, rib-and-tuck stitch, lace stitch and plating stitch. Examples of warp braid stitches include single denbigh stitch, single atlas stitch, double cord stitch, half-tricot stitch, lined stitch and jacquard stitch. It may consist of a single layer, or a multilayer with two or more layers. Alternatively, it may be a plush weave or plush stitch, composed of nap sections and ground weave sections comprising cut piles and/or loop piles.

(Multiple Piezoelectric Elements)

Multiple braided piezoelectric elements 2001 may also be used in an arrangement in the fabric-like piezoelectric element 2005. The manner of arrangement may be, for example, using the braided piezoelectric element 2001 for all of the warp thread or weft thread, or the braided piezoelectric elements 2001 may be used for several groups or sections thereof. Also, braided piezoelectric elements 2001 may be used as warp threads at certain sections and braided piezoelectric elements 2001 used as weft threads at other sections.

When a plurality of braided piezoelectric elements 2001 are arranged to form the fabric-like piezoelectric element 2005, an advantage is afforded whereby the manner of arrangement and manner of knitting may be selected within a wide range, since the braided piezoelectric elements 2001 do not need electrodes on the surface.

When a plurality of braided piezoelectric elements 2001 are arranged, electrical signals can be efficiently extracted because the distance between conductive fibers B is short.

(Insulating Fiber)

In the fabric-like piezoelectric element 2005, insulating fibers may also be used at sections other than the braided piezoelectric element 2001 (and conductive fibers 2008). In this case, the insulating fibers used may be fibers of a material and shape that are stretchable, in order to improve the flexibility of the fabric-like piezoelectric element 2005.

By situating insulating fibers in this manner at sections other than the braided piezoelectric element 2001 (and conductive fibers 2008), it is possible to increase the operativity of the fabric-like piezoelectric element 2005 (for example, the ease of movement for a wearable sensor).

Such insulating fibers that are used need only have a volume resistivity of $10^6$ Ω·cm or greater, more preferably $10^8$ Ω·cm or greater and even more preferably $10^{10}$ Ω·cm or greater.

Examples of insulating fibers to be used include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. There is no restriction to these, however, and any publicly known insulating fibers may be used as desired. These insulating fibers may also be used in combination, or combined with fibers having no insulating property to form fibers with an overall insulating property.

Fibers with various publicly known cross-sectional shapes may also be used.

(Technology for Use of Piezoelectric Element)

The piezoelectric element of the invention in any desired form, such as the braided piezoelectric element 2001 or fabric-like piezoelectric element 2005, can output contact, pressure and shape deformation on the surface as an electrical signal, and therefore it can be utilized as a sensor (device) that detects the amount of stress and/or the location of stress applied to the piezoelectric element. In addition, the electrical signal can be used as a power generating element, to serve as an electric power source to drive another device, or for storage. Specifically, this may include electric power generation by use at movable parts that autonomously move, such as those of a human, animal, robot or machine, electric power generation on the surface of a structure subjected to pressure from a shoe sole, mat or exterior, and electric power generation by shape deformation in a fluid. For generation of an electrical signal by shape deformation in a fluid, an electrostatic substance in a fluid may be adsorbed, or its adhesion inhibited.

Figure 8:
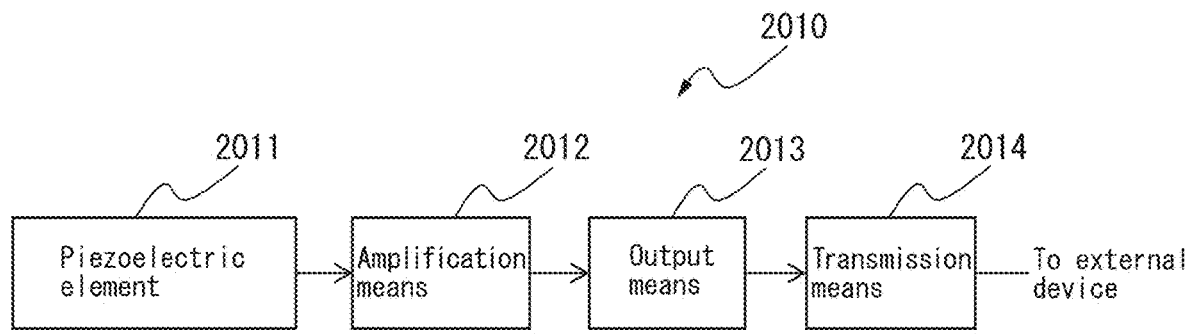
FIG. 8 is a block diagram showing a device comprising a piezoelectric element according to the second invention.

FIG. 8 is a block diagram showing a device comprising a piezoelectric element of the invention. The device 2010 comprises a piezoelectric element 2011 (e.g. a braided piezoelectric element 2001 or fabric-like piezoelectric element 2005), amplification means 2012 that amplifies an electrical signal outputted from the piezoelectric element 2011 in response to applied pressure, output means 2013 that outputs the electrical signal amplified at the amplification means 2012, and transmission means 2014 that transmits the electrical signal outputted from the output means 2013 to an external device (not shown). By using the device 2010, it is possible to detect the amount and/or applied location of stress applied to a piezoelectric element, by computation processing at an external device (not shown), based on an electrical signal outputted by contact, pressure or shape deformation on the surface of a piezoelectric element 2011. Alternatively, computing means (not shown) may be provided in the device 2010, that computes the amount and/or applied location of stress applied to the piezoelectric element 2011, based on the electrical signal outputted from the output means 2013.

The amplification means 2012 may be constructed of different electronic circuits, for example, or it may be constructed as a functional module implemented by a software program that operates on a processor, or it may be constructed of a combination of different electronic circuits and a software program. Examples of processors include a CPU (Central Processing Unit), DSP (Digital Signal Processor), LSI (Large Scale Integration), ASIC (Application Specific Integrated Circuit) and FPGA (Field-Programming Gate Array). The output means 2013 may also be constructed solely of different connectors, for example, or it may be constructed as a communication device integrated with the transmission means 2014. Alternatively, the functions of the amplification means 2012, output means 2013 and transmission means 2014 may be combined in the form of an integrated circuit or microprocessor in which a software program is written. Incidentally, the transmission system using transmission means 2014 may be either wireless or wired, determined as appropriate depending on the sensor to be constructed.

Instead of the amplification means alone, it may also be used in combination with publicly known signal processing means, such as noise-canceling means or means for combined processing with other signals. The order of connection of such means may be modified as appropriate depending on the purpose. Naturally, the electrical signal outputted from the piezoelectric element 2011 may be subjected to signal processing after being directly transmitted to an external device.

Figure 9:
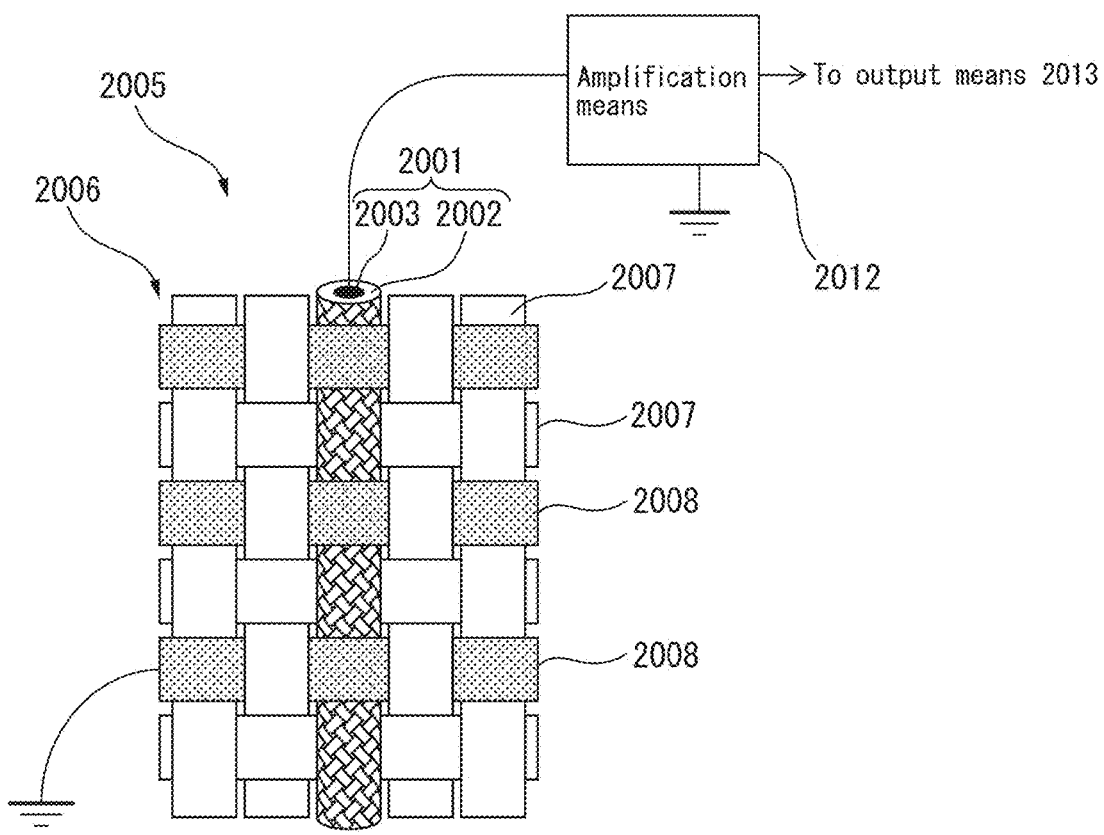
FIG. 9 is a schematic diagram showing an example of the construction of a device comprising a fabric-like piezoelectric element according to the second invention.
Figure 10:
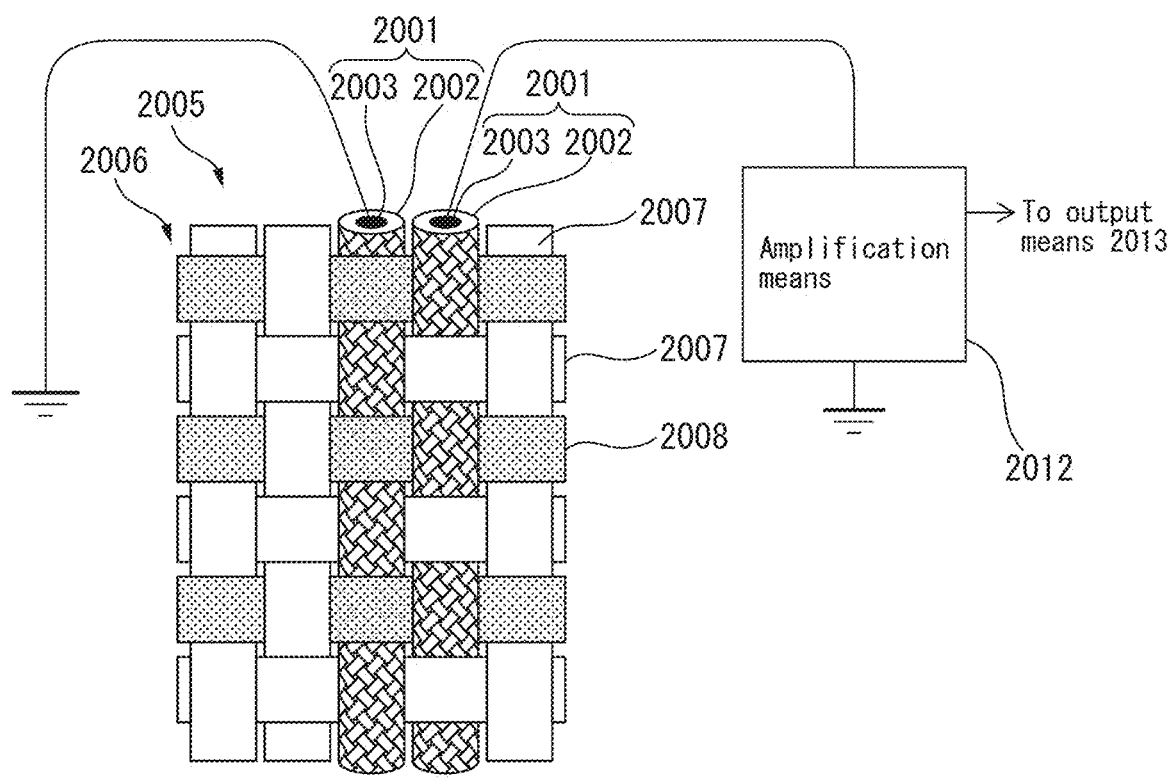
FIG. 10 is a schematic diagram showing another example of the construction of a device comprising a fabric-like piezoelectric element according to the second invention.

FIG. 9 and FIG. 10 are schematic diagrams showing examples of the construction of a device comprising a braid fabric-like piezoelectric element according to an embodiment. The amplification means 2012 of FIG. 9 and FIG. 10 correspond to the one explained with reference to FIG. 8, although the illustrations in FIG. 9 and FIG. 10 omit the output means 2013 and transmission means 2014 shown in FIG. 8. When a device is constructed comprising a fabric-like piezoelectric element 2005, a lead wire is connected from the core 2003 of the braided piezoelectric element 2001 to an input terminal of the amplification means 2012, while a braided piezoelectric element separate from the braided piezoelectric element 2001 that is connected to the input terminal of the amplification means 2012, or a conductive fiber 2008, is connected to a ground (earth) terminal. For example, in the fabric-like piezoelectric element 2005 shown in FIG. 9, a lead wire from the core 2003 of the braided piezoelectric element 2001 is connected to the input terminal of the amplification means 2012, and the conductive fibers 2008 contacting with the braided piezoelectric element 2001 in a crossing manner are grounded (earthed).

Alternatively, when multiple braided piezoelectric elements 2001 are arranged in the fabric-like piezoelectric element 2005 as shown in FIG. 10, for example, one lead wire from the core 2003 of one braided piezoelectric element 2001 is connected to the input terminal of the amplification means 2012, while a lead wire from the core 2003 of another braided piezoelectric element 2001 alongside the braided piezoelectric element 2001 is grounded (earthed).

Since the device 2010 of the invention is flexible and may be used in any form such as braided or fabric-like, it has a very wide range of potential uses. Specific examples for the device 2010 of the invention may be clothing that includes caps, gloves and socks, touch panels in the form of supporters or handkerchiefs, and surface pressure-sensitive sensors for humans or animals, such as sensors that detect bending, twisting or stretching of the joint sections of gloves or bands or supporters, for example. When used for a human, for example, it may be used as an interface for detection of contact or movement and collection of data regarding movement of a joint being used for medical purposes, or for amusement, or for movement of lost tissue or a robot. In addition, it may be used as a surface pressure-sensitive sensor in a stuffed doll simulating an animal or human form, or a robot, or as a sensor for sensing of bending, twisting or stretching of joints. It may still further be used as a surface pressure-sensitive sensor or shape deformation sensor in beddings such as sheets or pillows, shoe soles, gloves, chairs, mats, bags, flags or the like.

In addition, since the device 2010 of the invention is in braided or fabric form and is flexible, it may be used as a surface pressure-sensitive sensor or shape deformation sensor by attachment or covering on the surface of all or portions of various structures.

Furthermore, since the device 2010 of the invention can generate a sufficient electrical signal simply by rubbing the surface of the braided piezoelectric element 2001, it can be used in touch input devices such as touch sensors, or in pointing devices. Moreover, since positional information and shape information in the height direction of an object to be measured can be obtained by rubbing the surface of the object to be measured with the braided piezoelectric element 2001, it can be used in surface form measurement and the like.

The third invention will now be explained in detail.
(Braided Piezoelectric Element)

Figure 12:
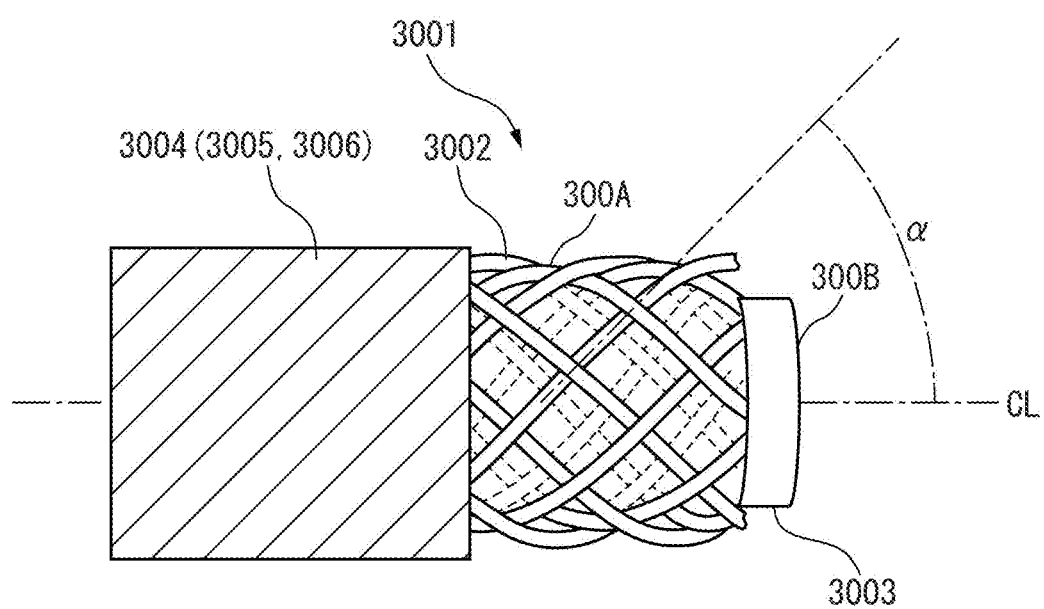
FIG. 12 is a schematic diagram showing an example of the construction of a braided piezoelectric element according to the third invention.

FIG. 12 is a schematic diagram showing an example of the construction of a braided piezoelectric element according to an embodiment.

The braided piezoelectric element 3001 comprises a core 3003 formed of a conductive fiber 300B, a sheath 3002 formed of braided piezoelectric fibers 300A covering the core 3003, and a conductive layer 3004 covering the sheath 3002.

The coverage factor of the sheath 3002 by the conductive layer 3004 is preferably 25% or greater. The coverage factor referred to here is the ratio of the area of the conductive substance 3005 in the conductive layer 3004 when the conductive layer 3004 is projected onto the sheath 3002, and the surface area of the sheath 3002, the value being preferably 25% or greater, more preferably 50% or greater and even more preferably 75% or greater. If the coverage factor of the conductive layer 3004 is less than 25%, the noise signal reducing effect may not be adequately exhibited. When the conductive substance 3005 is not exposed on the surface of the conductive layer 3004, such as when fibers encapsulating the conductive substance 3005 are used as the conductive layer 3004 to cover the sheath 3002, the ratio of the area of the fibers projected onto the sheath 3002 and the surface area of the sheath 3002 may be used as the coverage factor.

The conductive substance 3005 is the conductive substance in the conductive layer 3004, and any publicly known substance qualifies.

In the braided piezoelectric element 3001, a plurality of piezoelectric fibers 300A are closely wound around the outer peripheral surface of at least one conductive fiber 300B. While it is not our intention to be constrained by any particular theory, it is surmised that when deformation is produced in the braided piezoelectric element 3001, stress is produced in each of the piezoelectric fibers 300A by the deformation, producing an electric field in each of the piezoelectric fibers 300A (piezoelectric effect), and as a result a voltage change takes place in the conductive fiber 300B, as superimposition of the electric field of the plurality of piezoelectric fibers 300A wound around the conductive fiber 300B. That is, the electrical signal from the conductive fiber 300B is augmented compared to when the braided sheath 3002 of piezoelectric fibers 300A is not used. This allows a large electrical signal to be extracted with the braided piezoelectric element 3001, even by stress produced by relatively small deformation. Incidentally, the conductive fiber 300B may also consist of a plurality of fibers.

The piezoelectric fibers 300A preferably include polylactic acid as the main component. The term "main component" means that the most abundant component among the components of the piezoelectric fibers 300A is polylactic acid. The percentage of lactic acid units in the polylactic acid is preferably 90 mol % or greater, more preferably 95 mol % or greater and even more preferably 98 mol % or greater.

Also, the winding angle α of the piezoelectric fibers 300A with respect to the conductive fiber 300B is between 150 and 75°, inclusive. That is, the winding angle α of the piezoelectric fibers 300A is between 150 and 75°, inclusive, with respect to the direction of the central axis CL of the conductive fiber 300B (core 3003). For this embodiment, however, the central axis CL of the conductive fiber 300B overlaps with the central axis of the braid of the piezoelectric fibers 300A (sheath 3002) (hereunder also referred to as "braid axis"), and therefore the winding angle α of the piezoelectric fibers 300A may be considered to be between 150 and 75°, inclusive, with respect to the direction of the braid axis of the piezoelectric fibers 300A. From the viewpoint of extracting an even larger electrical signal, the angle α is preferably between 250 and 650, inclusive, more preferably between 350 and 550, inclusive and even more preferably between 400 and 500, inclusive. If the angle α is outside of the angle range, the electric field generated in the piezoelectric fibers 300A will be notably reduced, thereby notably reducing the electrical signal obtained by the conductive fiber 300B.

The angle α may also be considered to be the angle formed between the main direction of the piezoelectric fibers 300A forming the sheath 3002 and the central axis CL of the conductive fiber 300B, and some of the piezoelectric fibers 300A may even be relaxed or fluffed.

The reason for the notable reduction in the electric field produced in the piezoelectric fibers 300A is as follows. The piezoelectric fibers 300A are composed mainly of polylactic acid, and are uniaxially oriented in the direction of the fiber axis of the piezoelectric fibers 300A. Polylactic acid produces an electric field when subjected to shearing stress with respect to the orientation direction (in this case, the direction of the fiber axis of the piezoelectric fibers 300A), but produces little electric field when subjected to tensile stress or compression stress with respect to the orientation direction. Consequently, in order to produce shearing stress on the piezoelectric fibers 300A under deformation parallel to the direction of the braid axis, it is thought to be desirable for the orientation direction of the piezoelectric fibers 300A (polylactic acid) to be in a prescribed angle range with respect to the braid axis.

In the braided piezoelectric element 3001, so long as the object of the invention is achieved, combined filaments may be prepared in combination with fibers other than the piezoelectric fibers 300A for the sheath 3002, and combined filaments may be prepared in combination with fibers other than the conductive fiber 300B for the core 3003.

There are no particular restrictions on the length of the braided piezoelectric element composed of the core 3003 of the conductive fiber 300B, the sheath 3002 of braided piezoelectric fibers 300A, and the conductive layer 3004 covering the sheath 3002. For example, the braided piezoelectric element may be produced in a continuous manner during production, and cut to the necessary length afterwards for use. The length of the braided piezoelectric element is 1 mm to 10 m, preferably 5 mm to 2 m and more preferably 1 cm to 1 m. If the length is too short the convenience of the fiber shape may be lost, and if the length is too long it may become necessary to consider the resistance value of the conductive fiber 300B.

Each of the structural aspects will now be explained in greater detail.

(Conductive Fiber)

The conductive fiber 300B used may be any publicly known one that exhibits conductivity. Examples for the conductive fiber 300B include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber winding. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity. Fibers that have been metal-plated in this manner may be considered to be metal-plated fibers.

The base fiber that has been coated with a metal may be a publicly known fiber, regardless of the presence or absence of conductivity, examples of which include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these and any publicly known fiber may be used, or combinations of these fibers may be used.

The metal to be coated onto the base fiber may be any type that exhibits conductivity and exhibits the effect of the invention. Examples to be used include gold, silver, platinum, copper, nickel, tin, zinc, palladium, indium tin oxide, copper sulfide and the like, as well as their mixtures and alloys.

When an organic fiber coated with a metal with bending resistance is used as the conductive fiber 300B, the conductive fiber is very highly unlikely to break, and the durability and safety of a sensor using the piezoelectric element will be excellent.

The conductive fiber 300B may be a multifilament consisting of a bundle of multiple filaments, or a monofilament consisting of a single filament. A multifilament is preferred from the viewpoint of the long-length stability of the electrical characteristics. In the case of a monofilament (including spun yarn), the monofilament diameter is 1 μm to 5000 μm and preferably 2 μm to 100 μm. It is more preferably 3 μm to 50 μm. In the case of a multifilament, the number of filaments is preferably from 1 to 100,000, more preferably 5 to 500 and even more preferably 10 to 100. However, the fineness and number of conductive fibers 300B is the fineness and number of cores 3003 used to prepare the braid, and a multifilament formed of a plurality of single threads (monofilaments) is counted as one conductive fiber 300B. The core 3003 is the overall amount, including fibers other than conductive fibers when they are used.

If the diameter of the fiber is small the strength will be reduced and handling may become difficult, while if the diameter is large there may be some sacrifice of flexibility. The cross-sectional shape of the conductive fiber 300B is preferably circular or elliptical from the viewpoint of design and production of the piezoelectric element, but this is not limitative.

Moreover, a lower electrical resistance is preferred for efficient extraction of electrical output from the piezoelectric polymer, the volume resistivity being preferably no greater than $10^{-1}$ Ω·cm, more preferably no greater than $10^{-2}$ Ω·cm and even more preferably no greater than $10^{-3}$ Ω·cm. However, the resistivity of the conductive fiber 300B is not limited thereto so long as sufficient strength can be obtained for detection of the electrical signal.

For use according to the present invention, the conductive fiber 300B must be resistant to movements such as repeated bending and twisting. As one indicator, a larger knot tenacity is preferred. The knot tenacity can be measured by the method of JIS L1013:2010 8.6. The degree of knot tenacity suitable for the invention is preferably 0.5 cN/dtex or greater, more preferably 1.0 cN/dtex or greater, even more preferably 1.5 cN/dtex or greater and most preferably 2.0 cN/dtex or greater. As another indicator, low flexural rigidity is preferred. Flexural rigidity is generally measured with a measuring apparatus such as a KES-FB2 Pure Bending Tester by KATO TECH CO., LTD. The degree of flexural rigidity suitable for the invention is preferably lower than the carbon fibers TENAX® HTS40-3K by Toho Tenax Co., Ltd. Specifically, the flexural rigidity of the conductive fiber is preferably no greater than $0.05 \times 10^{-4}$ N·m$^2$/m, more preferably no greater than $0.02 \times 10^{-4}$ N·m$^2$/m and even more preferably no greater than $0.01 \times 10^{-4}$ N·m$^2$/m.

(Piezoelectric Fibers)

The piezoelectric polymer used as the material for the piezoelectric fibers 300A may be a polymer exhibiting piezoelectricity such as polyvinylidene fluoride or polylactic acid, but the piezoelectric fibers 300A described above for this embodiment preferably include polylactic acid as the main component. Polylactic acid is readily oriented and exhibits piezoelectricity by stretching after melt spinning, for example, and has excellent productivity since it does not require electric field orientation treatment as is necessary with polyvinylidene fluoride and the like. However, this is not intended to exclude the use of polyvinylidene fluoride and other piezoelectric materials for carrying out the present invention.

Polylactic acid includes poly-L-lactic acid obtained by polymerization of L-lactic acid and L-lactide, poly-D-lactic acid obtained by polymerization of D-lactic acid and D-lactide, and stereocomplex polylactic acid comprising a hybrid structure of these, depending on the crystal structure, and any of these may be used so long as they exhibit piezoelectricity. Poly-L-lactic acid and poly-D-lactic acid are preferred from the viewpoint of a high piezoelectric modulus. Since poly-L-lactic acid and poly-D-lactic acid exhibit opposite polarization against the same stress, they may be used in combination according to the purpose.

The optical purity of polylactic acid is preferably 99% or greater, more preferably 99.3% or greater and even more preferably 99.5% or greater. If the optical purity is less than 99% the piezoelectric modulus may be significantly lowered, potentially making it difficult to obtain a sufficient electrical signal by shape deformation of the piezoelectric fibers 300A. In particular, the piezoelectric fibers 300A include poly-L-lactic acid or poly-D-lactic acid as the main component, preferably with an optical purity of 99% or greater.

Piezoelectric fibers 300A composed mainly of polylactic acid are stretched during production, and are uniaxially oriented in their fiber axis direction. Furthermore, preferably the piezoelectric fibers 300A are not only uniaxially oriented in the fiber axis direction but also include polylactic acid crystals, and more preferably they include uniaxially oriented polylactic acid crystals. This is because polylactic acid exhibits higher piezoelectricity by having high crystallinity and being uniaxially oriented.

The crystallinity and uniaxial orientation are determined by the homo PLA crystallinity $X_{homo}$ (%) and crystal orientation Ao (%). The piezoelectric fibers A of the invention preferably have a homo PLA crystallinity $X_{homo}$ (%) and crystal orientation Ao (%) satisfying the following inequality (1).

$$X_{homo} \times Ao \times Ao \div 10^6 \geq 0.26 \quad (1)$$

If inequality (1) is not satisfied, the crystallinity and/or uniaxial orientation will be insufficient, the output value of the electrical signal for operation may be reduced and the sensitivity of the signal for operation in a specific direction may be reduced. The value of the left side of inequality (1) is more preferably 0.28 or greater, and more preferably 0.3 or greater. Each of the values is determined in the following manner.

Homopolylactic Acid Crystallinity $X_{homo}$:

The homopolylactic acid crystallinity $X_{homo}$ is determined from crystal structure analysis by wide-angle X-ray diffraction (WAXD). In wide-angle X-ray diffraction (WAXD), an Ultrax18 X-ray diffraction apparatus by Rigaku Corp. is used by a transmission method, and the X-ray diffraction pattern of a sample is recorded on an imaging plate under the following conditions.

X-ray source: Cu-Kα rays (confocal mirror)
Output: 45 kV×60 mA
Slits: 1st: 1 mmΦ, 2nd: 0.8 mmΦ
Camera length: 120 mm
Elapsed time: 10 minutes
Sample: 35 mg of polylactic acid fibers are aligned to form a 3 cm fiber bundle.

The total scattering intensity $I_{tot}dl$ over the declination in the obtained X-ray diffraction pattern is determined, and the sum $\Sigma I_{HMi}$ of the integrated intensity for each diffraction peak attributed to homopolylactic acid crystals, appearing near 2θ=16.50, 18.50 and 24.30, is calculated. Based on these values, the homopolylactic acid crystallinity $X_{homo}$ is calculated by the following formula (2).

$$\text{Homopolylactic acid crystallinity } X_{homo}(\%) = \Sigma I_{HMi} / I_{total} \times 100 \quad (2)$$

The value of $\Sigma I_{HMi}$ is calculated by subtracting the background and amorphous diffuse scattering from the total scattering intensity.

(2) Crystal Orientation Ao:

In the X-ray diffraction pattern obtained by the aforementioned wide-angle X-ray diffraction (WAXD), the crystal orientation Ao has an intensity distribution with respect to the declination (°) for the diffraction peaks attributable to homopolylactic acid crystals, appearing near 2θ=16.50 in the radius vector direction, and it is calculated from the sum $\Sigma_{Wi}$ (°) of the half-widths in the obtained distribution profile, using the following formula (3).

$$\text{Crystal orientation } Ao(\%) = (360 - \Sigma W_i) \div 360 \times 100 \quad (3)$$

Incidentally, since polylactic acid is a polyester with relatively rapid hydrolysis, a publicly known hydrolysis preventer such as an isocyanate compound, oxazoline compound, epoxy compound or carbodiimide compound may be added when resistance to moist heat is an issue. Also, if necessary, an antioxidant, plasticizer, photodegradation inhibitor or the like such as a phosphoric acid-based compound may be added to modify the physical properties.

Moreover, polylactic acid may be used as an alloy with another polymer, in which case if polylactic acid is to be used as the main piezoelectric polymer, the amount of the polylactic acid is preferably at least 50 mass % or greater, more preferably 70 mass % or greater and most preferably 90 mass % or greater, based on the total weight of the alloy.

In the case of an alloy, suitable examples of polymers other than polylactic acid include polybutylene terephthalate, polyethylene terephthalate, polyethylene naphthalate copolymer and polymethacrylate, with no limitation to these, and any polymer may be used so long as the piezoelectricity that is the object of the invention is exhibited.

The piezoelectric fibers 300A may be multifilaments consisting of bundles of multiple filaments, or a monofilament consisting of a single filament. In the case of monofilaments (including spun yarn), the monofilament diameter is 1 μm to 5 mm, preferably 5 μm to 2 mm and even more preferably 10 μm to 1 mm. In the case of multifilaments, the monofilament diameter is 0.1 μm to 5 mm, preferably 2 μm to 100 μm and even more preferably 3 μm to 50 μm. The number of filaments for a multifilament is preferably from 1 to 100,000, more preferably 50 to 50,000 and even more preferably 100 to 20,000. However, the fineness and number of piezoelectric fibers 300A is the fineness and number per carrier when preparing the braid, and a multifilament formed of a plurality of single threads (monofilaments) is counted as one piezoelectric fiber 300A. One carrier includes the overall amount, including fibers other than piezoelectric fibers when they are used.

In order to obtain piezoelectric fibers 300A from such a piezoelectric polymer, any publicly known method for forming fibers from a polymer may be employed so long as the effect of the invention is exhibited. For example, a method of forming fibers by extrusion molding of the piezoelectric polymer, a method of forming fibers by melt spinning of the piezoelectric polymer, a method of forming fibers by dry or wet spinning of the piezoelectric polymer, a method of forming fibers by electrostatic spinning of the piezoelectric polymer, or a method of forming a film and then finely cutting it, may be employed. The spinning conditions employed may be according to a publicly known process suitable for the piezoelectric polymer used, and for most cases a melt spinning process may be employed, which facilitates industrial production. After formation of the fibers, the formed fibers may also be stretched. This will form piezoelectric fibers 300A that are uniaxially stretched and oriented, include crystals, and exhibit high piezoelectricity.

In addition, the piezoelectric fibers 300A may be treated by dyeing, twisting, doubling, heat treatment or the like, before braiding of the fibers prepared as described above.

(3)

In addition, since the piezoelectric fibers 300A will sometimes become twisted together or broken, or produce fluff, during formation of the braid, their strength and abrasion resistance is preferably high, the strength being preferably 1.5 cN/dtex or greater, more preferably 2.0 cN/dtex or greater, even more preferably 2.5 cN/dtex or greater and most preferably 3.0 cN/dtex or greater. The abrasion resistance can be evaluated by JIS L1095:2010 9.10.2, Method B, with an abrasion pass count of preferably 100 or greater, more preferably 1000 or greater, even more preferably 5000 or greater and most preferably 10,000 or greater. The method of increasing the abrasion resistance is not particularly restricted, and any publicly known method may be used, such as increasing the degree of crystallinity, adding fine particles, or surface processing. Abrasion can also be reduced by coating the fibers with a lubricating agent during processing of the braid.

Also, the difference in the shrinkage factor of the piezoelectric fibers is preferably small compared to the shrinkage factor of the conductive fiber mentioned above. If the difference in shrinkage factors is large, the braid may bend or the fabric may lose flatness in the post-treatment steps after formation of the braid or after formation of the fabric, or when subjected to heat or with passage of time during actual use, often resulting in a weaker piezoelectric signal. When the shrinkage factor has been quantified by the boiling water shrinkage ratio as described below, the boiling water shrinkage ratio of the piezoelectric fibers S(p) and the boiling water shrinkage ratio of the conductive fiber S(c) preferably satisfy the following inequality (4).

$$|S(p)-S(c)| \leq 10 \quad (4)$$

The left side of inequality (4) is more preferably ≤5 and even more preferably ≤3.

The difference in the shrinkage factor of the piezoelectric fibers is also preferably small compared to the shrinkage factor of fibers other than the conductive fiber, such as insulating fibers. If the difference in shrinkage factors is large, the braid may bend or the fabric may lose flatness in the post-treatment steps after formation of the braid or after formation of the fabric, or when subjected to heat or with passage of time during actual use, often resulting in a weaker piezoelectric signal. When the shrinkage factor has been quantified by the boiling water shrinkage ratio, the boiling water shrinkage ratio of the piezoelectric fibers S(p) and the boiling water shrinkage ratio of the insulating fibers S(i) preferably satisfy the following inequality (5).

$$|S(p)-S(i)| \leq 10 \quad (5)$$

The left side of inequality (5) is more preferably ≤5 and even more preferably ≤3.

The shrinkage factor of the piezoelectric fibers is also preferably small. For example, when the shrinkage factor has been quantified by the boiling water shrinkage ratio, the shrinkage factor of the piezoelectric fibers is preferably no greater than 15%, more preferably no greater than 10%, even more preferably no greater than 5% and most preferably no greater than 3%. The means used to lower the shrinkage factor may be any publicly known method, and for example, the shrinkage factor can be lowered by heat treatment to relax the orientation of the amorphous sections or to increase the degree of crystallinity, without any particular restrictions on the timing of heat treatment, which may be after stretching, after twisting, after braiding or after fabric formation. The boiling water shrinkage ratio described above was measured by the following method. A reel with 20 winds was prepared using a sizing reel having a frame circumference of 1.125 m, a 0.022 cN/dtex load was applied, it was suspended from a scale board, and the initial reel length L0 was measured. The reel was then treated for 30 minutes in a boiling water bath at 100° C. and allowed to cool, a load was again applied, it was suspended from the scale board, and the contracted reel length L was measured. The measured L0 and L values were used to calculate the boiling water shrinkage ratio by the following formula (6).

$$\text{Boiling water shrinkage ratio} = (L0-L)/L0 \times 100(\%) \quad (6)$$

(Covering)

The conductive fiber 300B, i.e. the core 3003, has its surface covered by the piezoelectric fibers 300A, i.e. the braided sheath 3002. The thickness of the sheath 3002 covering the conductive fiber 300B is preferably 1 μm to 10 mm, more preferably 5 μm to 5 mm, even more preferably 10 μm to 3 mm and most preferably 20 μm to 1 mm. If it is too thin, problems may result in terms of strength, and if it is too thick, the braided piezoelectric element 3001 may become hard and more resistant to deformation. The "sheath 3002" referred to here is the layer adjacent to the core 3003.

In the braided piezoelectric element 3001, the total fineness of the piezoelectric fibers 300A of the sheath 3002 is preferably at least ½ and no greater than 20 times, more preferably at least 1 and no greater than 15 times, and even more preferably at least 2 and no greater than 10 times, the total fineness of the conductive fiber 300B of the core 3003. If the total fineness of the piezoelectric fibers 300A is too small with respect to the total fineness of the conductive fiber 300B, there will be too few piezoelectric fibers 300A surrounding the conductive fiber 300B and the conductive fiber 300B will not be able to sufficiently output an electrical signal, while the conductive fiber 300B may potentially contact with other adjacent conductive fibers. If the total fineness of the piezoelectric fibers 300A is too large with respect to the total fineness of the conductive fiber 300B, there will be too many piezoelectric fibers 300A surrounding the conductive fiber 300B, and the braided piezoelectric element 3001 will become too hard and resistant to deformation. In other words, the braided piezoelectric element 3001 will fail to adequately function as a sensor in both cases.

The total fineness referred to here is the sum of all of the finenesses of the piezoelectric fibers 300A composing the sheath 3002, and in the case of a common 8-strand braid, for example, it is the sum of the finenesses of the 8 strands.

Also, in the braided piezoelectric element 3001, the fineness per piezoelectric fiber 300A of the sheath 3002 is preferably at least 1/20 and no greater than 2 times, more preferably at least 1/15 and no greater than 1.5 times, and even more preferably at least 1/10 and no greater than 1 times, the total fineness of the conductive fiber 300B. If the fineness per piezoelectric fiber 300A is too small with respect to the total fineness of the conductive fiber 300B, there will be too few piezoelectric fibers 300A and the conductive fiber 300B will not be able to sufficiently output an electrical signal, while the piezoelectric fibers 300A may potentially undergo breakage. If the fineness per piezoelectric fiber 300A is too large with respect to the total fineness of the conductive fiber 300B, the piezoelectric fibers 300A will be too thick and the braided piezoelectric element 3001 will become too hard and resistant to deformation. In other words, the braided piezoelectric element 3001 will fail to adequately function as a sensor in both cases.

Incidentally, when metal fiber is used for the conductive fiber 300B or when metal fiber is combined with the conductive fiber 300B or piezoelectric fibers 300A, the fineness proportion is not limited to that mentioned above. This is because according to the invention, the proportion is important from the standpoint of the contact area and coverage factor, i.e. the area and volume. For example, if the specific gravity of each of the fibers exceeds 2, the proportion of the mean cross-sectional area of the fibers is preferably the same as the fineness proportion.

It is preferred for the piezoelectric fibers 300A and the conductive fiber 300B to be as closely bonded as possible, but for improved adhesiveness, an anchor layer or adhesive layer may be provided between the conductive fiber 300B and the piezoelectric fibers 300A.

The covering method adopted is a method of using the conductive fiber 300B as the core thread and winding the piezoelectric fibers 300A in a braided fashion around it. On the other hand, the form of the braid of the piezoelectric fibers 300A is not particularly restricted so long as an electrical signal can be outputted in response to stress produced by an applied load, but it is preferably an 8-strand braid or a 16-strand braid with the core 3003.

The form of the conductive fiber 300B and the piezoelectric fibers 300A is not particularly restricted, but they are preferably as nearly concentric as possible. When a multifilament is used as the conductive fiber 300B, the piezoelectric fibers 300A need only be covering so that at least a portion of the surface of the multifilament of the conductive fiber 300B (the peripheral surface of the fiber) is contacting, and the piezoelectric fibers 300A may cover all, or not all, of the filament surfaces (peripheral surfaces of the fibers) of the multifilament. The covering state of the piezoelectric fibers A on each filament in the interior forming the multifilament of the conductive fiber 300B may be set as appropriate, in consideration of performance and handleability of the piezoelectric element.

Since the braided piezoelectric element 3001 of the invention has no need for electrodes on its surface, there is no need to further cover the braided piezoelectric element 3001 itself, while it also has the advantage of being less likely to malfunction.

(Conductive Layer)

The form of the conductive layer 3004 may be a coating, or a film, fabric or fiber winding, or even a combination of these.

A coating used to form the conductive layer 3004 need only include a substance that exhibits conductivity, and various publicly known substances may be used. Examples include metals, conductive polymers, or polymers dispersing conductive fillers.

When the conductive layer 3004 is to be formed by winding a film, the film used is obtained by forming a film of a conductive polymer or a polymer dispersing a conductive filler, or the film used may have a conductive layer formed on the surface.

When the conductive layer 3004 is to be formed by winding a fabric, the fabric used has the conductive fiber 3006 described below as the constituent component.

When the conductive layer 3004 is to be formed by winding a fiber, the method of winding may be as a cover ring, knitted fabric, braid or the like. The fiber used is a conductive fiber 3006, and the conductive fiber 3006 may be of the same type as the conductive fiber 300B mentioned above or a different type of conductive fiber. Examples for the conductive fiber 3006 include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber winding. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity. Fibers that have been metal-plated in this manner may be considered to be metal-plated fibers.

The base fiber that has been coated with a metal may be a publicly known fiber, regardless of the presence or absence of conductivity, examples of which include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these and any publicly known fiber may be used, or combinations of these fibers may be used.

The metal to be coated onto the base fiber may be any type that exhibits conductivity and exhibits the effect of the invention. Examples to be used include gold, silver, platinum, copper, nickel, tin, zinc, palladium, indium tin oxide, copper sulfide and the like, as well as their mixtures and alloys.

When an organic fiber coated with a metal with bending resistance is used as the conductive fiber 3006, the conductive fiber is very highly unlikely to break, and the durability and safety of a sensor using the piezoelectric element will be excellent.

The conductive fiber 3006 may be a multifilament consisting of a bundle of multiple filaments, or a monofilament consisting of a single filament. A multifilament is preferred from the viewpoint of the long-length stability of the electrical characteristics. In the case of a monofilament (including spun yarn), the monofilament diameter is 1 µm to 5000 µm and preferably 2 µm to 100 µm. It is more preferably 3 µm to 50 µm. In the case of a multifilament, the number of filaments is preferably from 1 to 100,000, more preferably 5 to 500 and even more preferably 10 to 100.

If the diameter of the fiber is small the strength will be reduced and handling may become difficult, while if the diameter is large there may be some sacrifice of flexibility. The cross-sectional shape of the conductive fiber 3006 is preferably circular or elliptical from the viewpoint of design and production of the piezoelectric element, but this is not limitative.

Moreover, a lower electrical resistance is preferred for an increased effect of suppressing noise signal, the volume resistivity being preferably no greater than $10^{-1}$ Ω·cm, more preferably no greater than $10^{-2}$ Ω·cm and even more preferably no greater than $10^{-3}$ Ω·cm. However, the resistivity is not limited to this range so long as the effect of suppressing noise signal can be obtained.

For use according to the present invention, the conductive fiber 3006 must be resistant to movements such as repeated bending and twisting. As one indicator, a larger knot tenacity is preferred. The knot tenacity can be measured by the method of JIS L1013:2010 8.6. The degree of knot tenacity suitable for the invention is preferably 0.5 cN/dtex or greater, more preferably 1.0 cN/dtex or greater, even more preferably 1.5 cN/dtex or greater and most preferably 2.0 cN/dtex or greater. As another indicator, low flexural rigidity is preferred. Flexural rigidity is generally measured with a measuring apparatus such as a KES-FB2 Pure Bending Tester by KATO TECH CO., LTD. The degree of flexural rigidity suitable for the invention is preferably lower than the carbon fibers TENAX® HTS40-3K by Toho Tenax Co., Ltd. Specifically, the flexural rigidity of the conductive fiber is preferably no greater than $0.05 \times 10^{-4}$ N·m²/m, more preferably no greater than $0.02 \times 10^{-4}$ N·m²/m and even more preferably no greater than $0.01 \times 10^{-4}$ N·m²/m.

(Production Method)

The braided piezoelectric element 3001 of the invention has the surface of at least one conductive fiber 300B covered by the braided piezoelectric fibers 300A, and the method for its production may be the following, for example. That is, it may be a method of preparing the conductive fiber 300B and the piezoelectric fibers 300A in separate steps, and winding the piezoelectric fibers 300A in braided form around the conductive fiber 300B to cover it. In this case, the covering is preferably carried out as nearly concentrically as possible.

In this case, the preferred spinning and stretching conditions, when using polylactic acid as the piezoelectric polymer forming the piezoelectric fibers 300A, is a melt spinning temperature of preferably 150° C. to 250° C., a stretching temperature of preferably 40° C. to 150° C., a draw ratio of preferably 1.1 to 5.0 and a crystallization temperature of preferably 80° C. to 170° C.

The piezoelectric fibers 300A to be used by winding around the conductive fiber 300B may be multifilaments consisting of bundles of multiple filaments, or monofilaments (including spun yarn). The conductive fiber 300B around which the piezoelectric fibers 300A are to be wound may also be a multifilament consisting of bundles of multiple filaments, or a monofilament (including spun yarn).

The preferred manner of covering is to use the conductive fiber 300B as the core thread and braid the piezoelectric fibers 300A around its periphery in a braided form to prepare a tubular braid to cover it. More specifically, this may be an 8-strand braid or 16-strand braid with the core 3003. However, the piezoelectric fibers 300A may be in the form of a braided tube, for example, with the conductive fiber 300B as the core inserted in the braided tube to cover it.

The conductive layer 3004 is produced by coating or fiber winding, but fiber winding is preferred from the viewpoint of facilitating production. The method of fiber winding may be a cover ring, knitted fabric or braid, and the production may employ any method.

By the production method described above it is possible to obtain a braided piezoelectric element 3001 having the surface of the conductive fiber 300B covered with the braided piezoelectric fibers 300A, and further having the conductive layer 3004 around its periphery.

The braided piezoelectric element 3001 of the invention does not require formation of an electrical signal-detecting electrode on the surface, and it can therefore be produced in a relatively simple manner.

(Protective Layer)

A protective layer may also be provided on the outer surface of the braided piezoelectric element 3001 of the invention. The protective layer preferably has an insulating property, and from the viewpoint of flexibility it is more preferably composed of a polymer. When the protective layer is given an insulating property, naturally the protective layer will also be deformed as well and it will be the protective layer that is rubbed, but there are no particular restrictions so long as the external force reaches the piezoelectric fibers A and can induce polarization. The protective layer is not limited to being formed by coating of the polymer or the like, and it may instead be a wound film, fabric, fiber or the like, or a combination of these.

The thickness of the protective layer is as small as possible to facilitate transmission of shearing stress to the piezoelectric fibers 300A, but if it is too small, problems may be caused such as breakdown of the protective layer itself, and it is therefore preferably 10 nm to 200 µm, more preferably 50 nm to 50 µm, even more preferably 70 nm to 30 µm and most preferably 100 nm to 10 µm. The shape of the piezoelectric element may also be created by the protective layer.

In addition, a plurality of layers made of piezoelectric fibers may be provided, or a plurality of layers made of conductive fibers for signal extraction may be provided. Naturally, the number and order of the protective layer, layer made of piezoelectric fibers and layer made of conductive fibers may be determined as appropriate according to the purpose. The winding method may be a method of additionally forming a braid structure over the outer layer of the sheath 3002, or a method of forming a cover ring.

(Function)

The braided piezoelectric element 3001 of the invention can be utilized as a sensor that detects the amount and/or location of application of stress produced when a load is applied to the braided piezoelectric element 3001 by, for example, rubbing of the surface of the braided piezoelectric element 3001, or in other words stress applied to the braided piezoelectric element 3001. In addition, the braided piezoelectric element 3001 of the invention can, of course, extract an electrical signal even if shearing stress is applied to the piezoelectric fibers 300A by pressing force or bending deformation instead of rubbing. For example, the "applied stress" on the braided piezoelectric element 3001 may be frictional force between the surface of the piezoelectric element, i.e. the surfaces of the piezoelectric fibers 300A, and the surface of the contacting object, such as a finger, or it may be resistance in the direction perpendicular to the surface or tip section of the piezoelectric fibers 300A, or resistance against bending deformation of the piezoelectric fibers 300A. In particular, the braided piezoelectric element 3001 of the invention can efficiently output a large electrical signal when bending or rubbing has occurred in the direction parallel to the conductive fiber 300B.

The "applied stress" on the braided piezoelectric element 3001 is approximately 1 to 1000 Pa, as a rule, for the level of stress of rubbing of a surface with a finger, for example. Needless to mention, it is possible to detect even a greater degree of applied stress, at the applied location. When input is made with a finger or the like, preferably operation can be performed with a load of between 1 Pa to 500 Pa, inclusive, and more preferably operation can be performed with a load of between 1 Pa and 100 Pa, inclusive. Naturally, operation can be performed even with a load exceeding 500 Pa, as mentioned above.

Also, by calculating the change in electrostatic capacity between the conductive fiber 300B of the core of the braided piezoelectric element 3001, and the conductive layer 3004, it is possible to detect deformation caused by pressure applied to the braided piezoelectric element 3001. Furthermore, when multiple braided piezoelectric elements 3001 are used in combination, the change in electrostatic capacity between the conductive layers 3004 of each of the braided piezoelectric elements 3001 may be calculated to detect deformation caused by pressure applied to the braided piezoelectric element 3001.

(Fabric-Like Piezoelectric Element)

Figure 13:
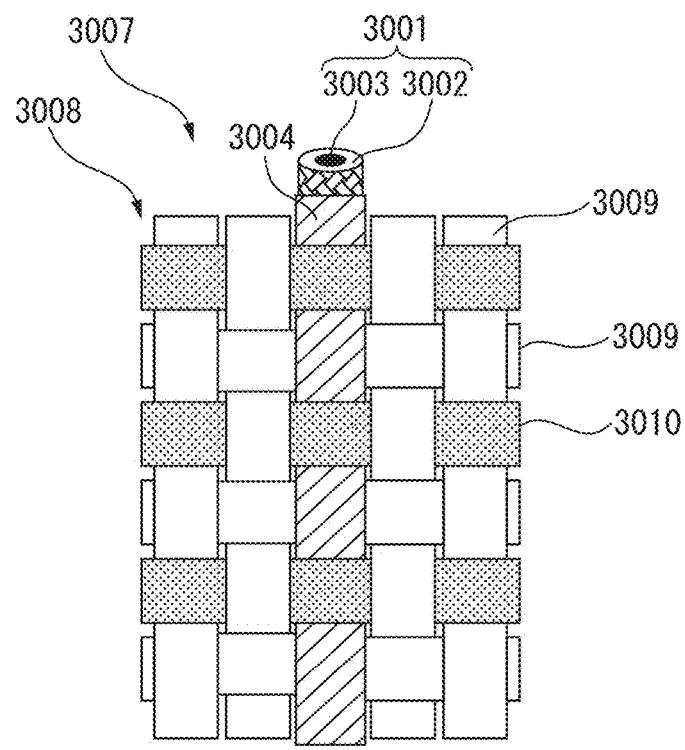
FIG. 13 is a schematic diagram showing an example of the construction of a fabric-like piezoelectric element according to the third invention.

FIG. 13 is a schematic diagram showing an example of the construction of a fabric-like piezoelectric element using a braided piezoelectric element according to an embodiment.

The fabric-like piezoelectric element 3007 comprises a fabric 3008 including at least one braided piezoelectric element 3001. The fabric 3008 may be any type of woven or knitted fabric wherein at least one of the fibers (including braids) composing the fabric is a braided piezoelectric element 3001, with no particular limitation so long as the braided piezoelectric element 3001 can exhibit the function of a piezoelectric element. For a fabric, union weaving, mixed knitting or the like may be carried out with other fibers (including braids), so long as the object of the invention is achieved. Naturally, the braided piezoelectric element 3001 may be used as a portion of fibers composing a fabric (for example, warp thread or weft thread), or the braided piezoelectric element 3001 may be embroidered or bonded with a fabric. In the example shown in FIG. 13, the fabric-like piezoelectric element 3007 is a plain weave fabric having at least one braided piezoelectric element 3001 and insulating fibers 3009 arranged as warp thread and the conductive fibers 3010 and insulating fibers 3009 alternately arranged as weft thread. The conductive fibers 3010 may be of the same type as the conductive fiber 300B or a different type of conductive fiber, and the insulating fibers 3009 are described below. All or some of the insulating fibers 3009 and/or conductive fibers 3010 may also be in braided form.

In this case, when the fabric-like piezoelectric element 3007 has deformed by bending or the like, the braided piezoelectric element 3001 also deforms in a manner following that deformation, and the deformation of the fabric-like piezoelectric element 3007 can be detected by the electrical signal outputted from the braided piezoelectric element 3001. Furthermore, since the fabric-like piezoelectric element 3007 can be used as a fabric (woven or knitted fabric), it can be applied as a wearable sensor in the form of clothing, for example.

In addition, in the fabric-like piezoelectric element 3007 shown in FIG. 13, the conductive fibers 3010 are in crossing contact with the braided piezoelectric element 3001. Therefore, the conductive fibers 3010 are in crossing contact with at least portions of the braided piezoelectric element 3001, covering it, thereby blocking at least some of the electromagnetic waves directed toward the braided piezoelectric element 3001 from the exterior. The conductive fibers 3010 are grounded (earth) so as to have a function of reducing the effects of electromagnetic waves on the braided piezoelectric element 3001. That is, the conductive fibers 3010 can function as an electromagnetic shield for the braided piezoelectric element 3001. Thus, it is possible to significantly increase the S/N ratio (signal-to-noise ratio) of the fabric-like piezoelectric element 3007 even without layering a conductive fabric as an electromagnetic shield above and below the fabric-like piezoelectric element 3007, for example. In this case, the proportion of conductive fibers 3010 in the weft thread crossing with the braided piezoelectric element 3001 (in the case of FIG. 13) is preferably higher from the viewpoint of electromagnetic shielding. Specifically, at least 30%, more preferably at least 40% and even more preferably material 50% of the fibers forming the fabric 3008 and crossing with the braided piezoelectric element 3001, are conductive fibers. In this type of fabric-like piezoelectric element 3007, conductive fibers may be inserted for at least some of the fibers composing the fabric, to allow an electromagnetic wave shield functioning fabric-like piezoelectric element 3007 to be obtained.

Examples for the woven texture of the woven fabric include three foundation weaves such as plain weave, twill weave or satin weave, half-double weaves such as derivative weave, warp backed weave and weft backed weave, and warp velvet weaves. The type of knitted fabric may be a circular knit fabric (weft knitted fabric) or a warp knitted fabric. Examples of preferred textures of circular knit fabrics (weft knitted fabrics) include plain stitch, rib stitch, interlock stitch, purl stitch, tuck stitch, float stitch, rib-and-tuck stitch, lace stitch and plating stitch. Examples of warp braid stitches include single denbigh stitch, single atlas stitch, double cord stitch, half-tricot stitch, lined stitch and jacquard stitch. It may consist of a single layer, or a multilayer with two or more layers. Alternatively, it may be a plush weave or plush stitch, composed of nap sections and ground weave sections comprising cut piles and/or loop piles.

(Multiple Piezoelectric Elements)

Multiple braided piezoelectric elements 3001 may also be used in an arrangement in the fabric-like piezoelectric element 3007. The manner of arrangement may be, for example, using the braided piezoelectric element 3001 for all of the warp thread or weft thread, or the braided piezoelectric elements 3001 may be used several groups or sections thereof. Also, braided piezoelectric elements 3001 may be used as warp threads at certain sections and braided piezoelectric elements 3001 used as weft threads at other sections.

When a plurality of braided piezoelectric elements 3001 are arranged to form the fabric-like piezoelectric element 3007, an advantage is afforded whereby the manner of arrangement and manner of knitting may be selected within a wide range, since the braided piezoelectric elements 3001 do not need electrodes on the surface.

When a plurality of braided piezoelectric elements 3001 are arranged, electrical signals can be efficiently extracted because the distance between conductive fibers 300B is short.

(Insulating Fiber)

In the fabric-like piezoelectric element 3007, insulating fibers may also be used at sections other than the braided piezoelectric element 3001 (and conductive fibers 3010). In this case, the insulating fibers used may be fibers of a material and shape that are stretchable, in order to improve the flexibility of the fabric-like piezoelectric element 3007.

By situating insulating fibers in this manner at sections other than the braided piezoelectric element 3001 (and conductive fibers 3010), it is possible to increase the operativity of the fabric-like piezoelectric element 3007 (for example, the ease of movement for a wearable sensor).

Such insulating fibers that are used need only have a volume resistivity of $10^6$ Ω·cm or greater, or more preferably $10^8$ Ω·cm or greater and even more preferably $10^{10}$ Ω·cm or greater.

Examples of insulating fibers to be used include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. There is no restriction to these, however, and any publicly known insulating fibers may be used as desired. These insulating fibers may also be used in combination, or combined with fibers having no insulating property to form fibers with an overall insulating property.

Fibers with various publicly known cross-sectional shapes may also be used.

(Technology for Use of Piezoelectric Element)

The piezoelectric element of the invention in any desired form, such as the braided piezoelectric element 3001 or fabric-like piezoelectric element 3007, can output contact, pressure and shape deformation on the surface as an electrical signal, and therefore it can be utilized as a sensor (device) that detects the amount of stress and/or the location of stress applied to the piezoelectric element. In addition, the electrical signal can be used as a power generating element, to serve as an electric power source to drive another device, or for storage. Specifically, this may include electric power generation by use at movable parts that autonomously move, such as those of a human, animal, robot or machine, electric power generation on the surface of a structure subjected to pressure from a shoe sole, mat or exterior, and electric power generation by shape deformation in a fluid. For generation of an electrical signal by shape deformation in a fluid, an electrostatic substance in a fluid may be adsorbed, or its adhesion inhibited.

Figure 14:
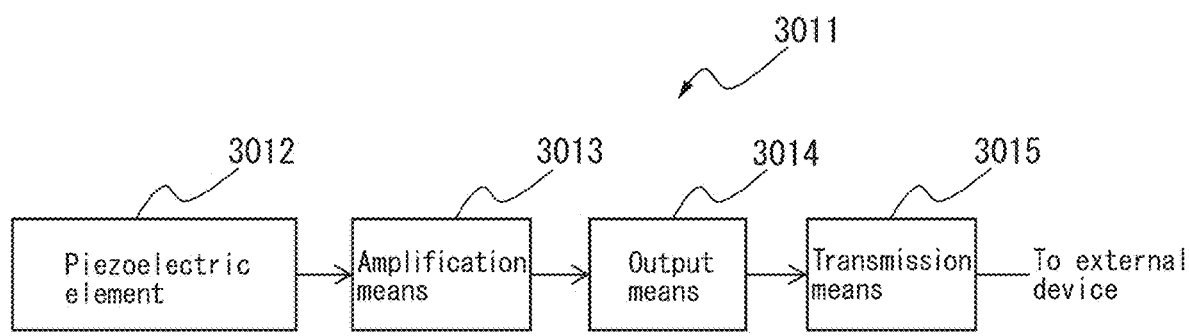
FIG. 14 is a block diagram showing a device comprising a piezoelectric element according to the third invention.

FIG. 14 is a block diagram showing a device comprising a piezoelectric element of the invention. The device 3011 comprises a piezoelectric element 3012 (e.g. a braided piezoelectric element 3001 or fabric-like piezoelectric element 3007), amplification means 3013 that amplifies an electrical signal outputted from the piezoelectric element 3012 in response to applied pressure, output means 3014 that outputs the electrical signal amplified at the amplification means 3013, and transmission means 3015 that transmits the electrical signal outputted from the output means 3014 to an external device (not shown). By using the device 3011, it is possible to detect the amount and/or applied location of stress applied to a piezoelectric element, by computation processing at an external device (not shown), based on an electrical signal outputted by contact, pressure or shape deformation on the surface of a piezoelectric element 3012. Alternatively, computing means (not shown) may be provided in the device 3011, that computes the amount and/or applied location of stress applied to the piezoelectric element 3012, based on the electrical signal outputted from the output means 3014.

The amplification means 3013 may be constructed of different electronic circuits, for example, or it may be constructed as a functional module implemented by a software program that operates on a processor, or it may be constructed of a combination of different electronic circuits and a software program. Examples of processors include a CPU (Central Processing Unit), DSP (Digital Signal Processor), LSI (Large Scale Integration), ASIC (Application Specific Integrated Circuit) and FPGA (Field-Programming Gate Array). The output means 3014 may also be constructed solely of different connectors, for example, or it may be constructed as a communication device integrated with the transmission means 3015. Alternatively, the functions of the amplification means 3013, output means 3014 and transmission means 3015 may be combined in the form of an integrated circuit or microprocessor in which a software program is written. Incidentally, the transmission system using transmission means 3015 may be either wireless or wired, determined as appropriate depending on the sensor to be constructed.

Instead of the amplification means alone, it may also be used in combination with publicly known signal processing means, such as noise-canceling means or means for combined processing with other signals. The order of connection of such means may be modified as appropriate depending on the purpose. Naturally, the electrical signal outputted from the piezoelectric element 3012 may be subjected to signal processing after being directly transmitted to an external device.

Figure 15:
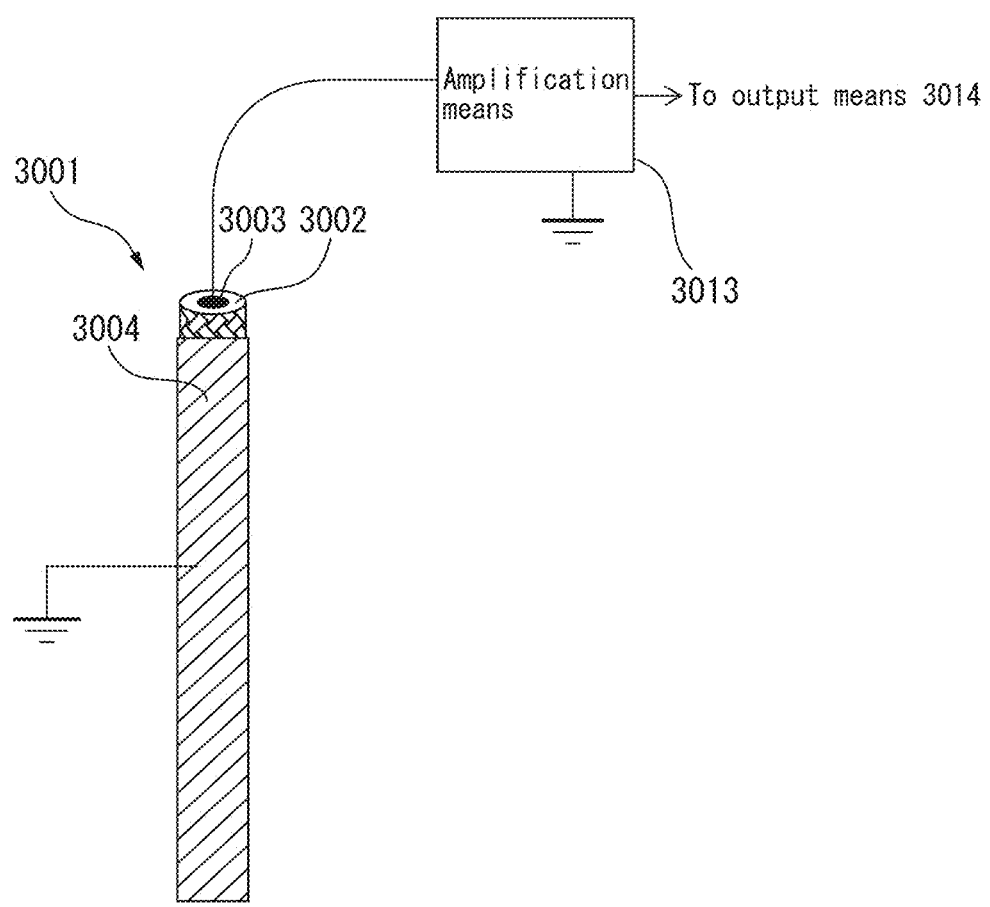
FIG. 15 is a schematic diagram showing an example of the construction of a device comprising a braided piezoelectric element according to the third invention.

FIG. 15 is a schematic diagram showing an example of the construction of a device comprising a braided piezoelectric element according to an embodiment. The amplification means 3013 of FIG. 15 corresponds to the one explained with reference to FIG. 14, although the illustration in FIG. 15 omits the output means 3014 and transmission means 3015 shown in FIG. 14. When a device is constructed comprising a braided piezoelectric element 3001, a lead wire is connected from the core 3003 of the braided piezoelectric element 3001 to an input terminal of the amplification means 3013, while the conductive layer 3004 of the braided piezoelectric element 3001 is connected to a ground (earth) terminal. For example, as shown in FIG. 15, in the braided piezoelectric element 3001, a lead wire from the core 3003 of the braided piezoelectric element 3001 is connected to the input terminal of the amplification means 3013, and the conductive layer 3004 of the braided piezoelectric element 3001 is grounded (earthed).

Figure 16:
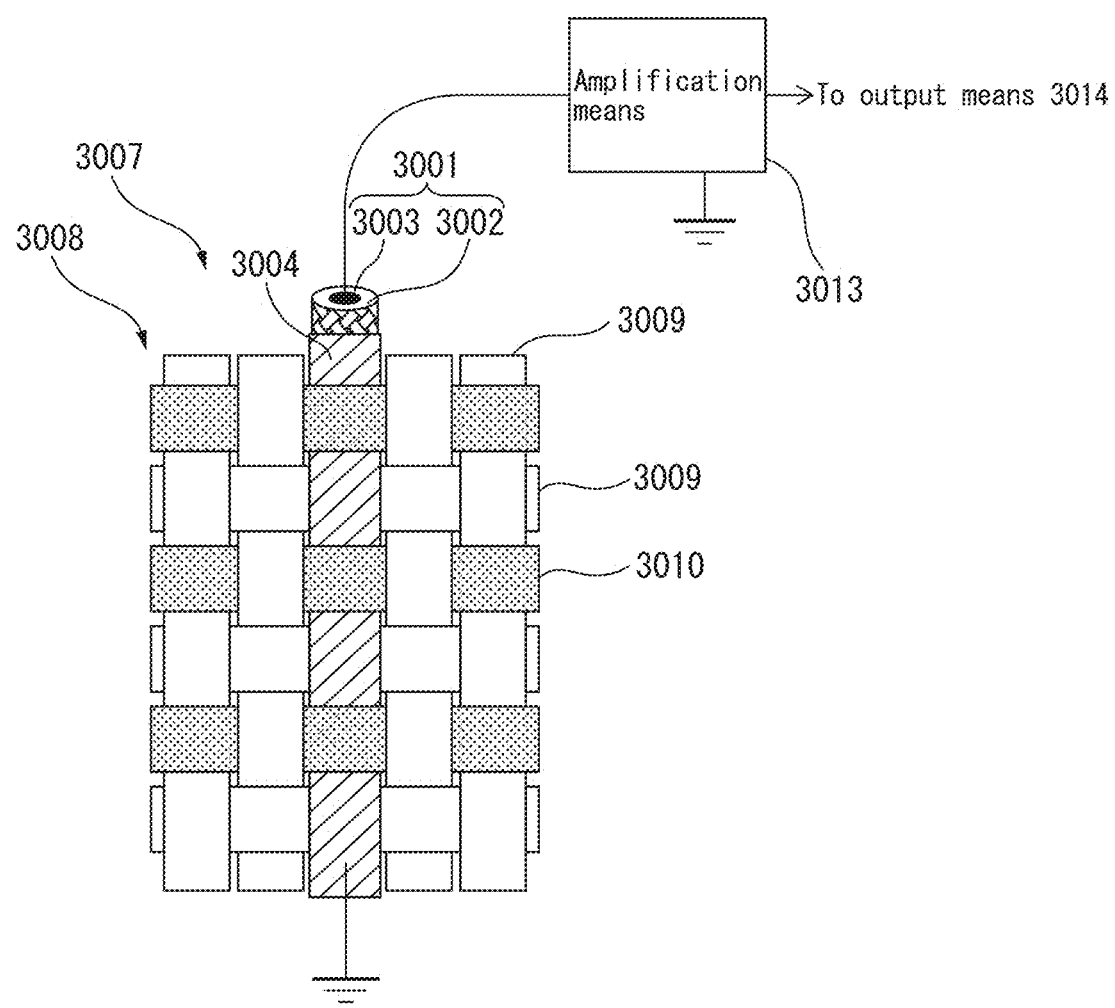
FIG. 16 is a schematic diagram showing an example of the construction of a device comprising a fabric-like piezoelectric element according to the third invention.
Figure 17:
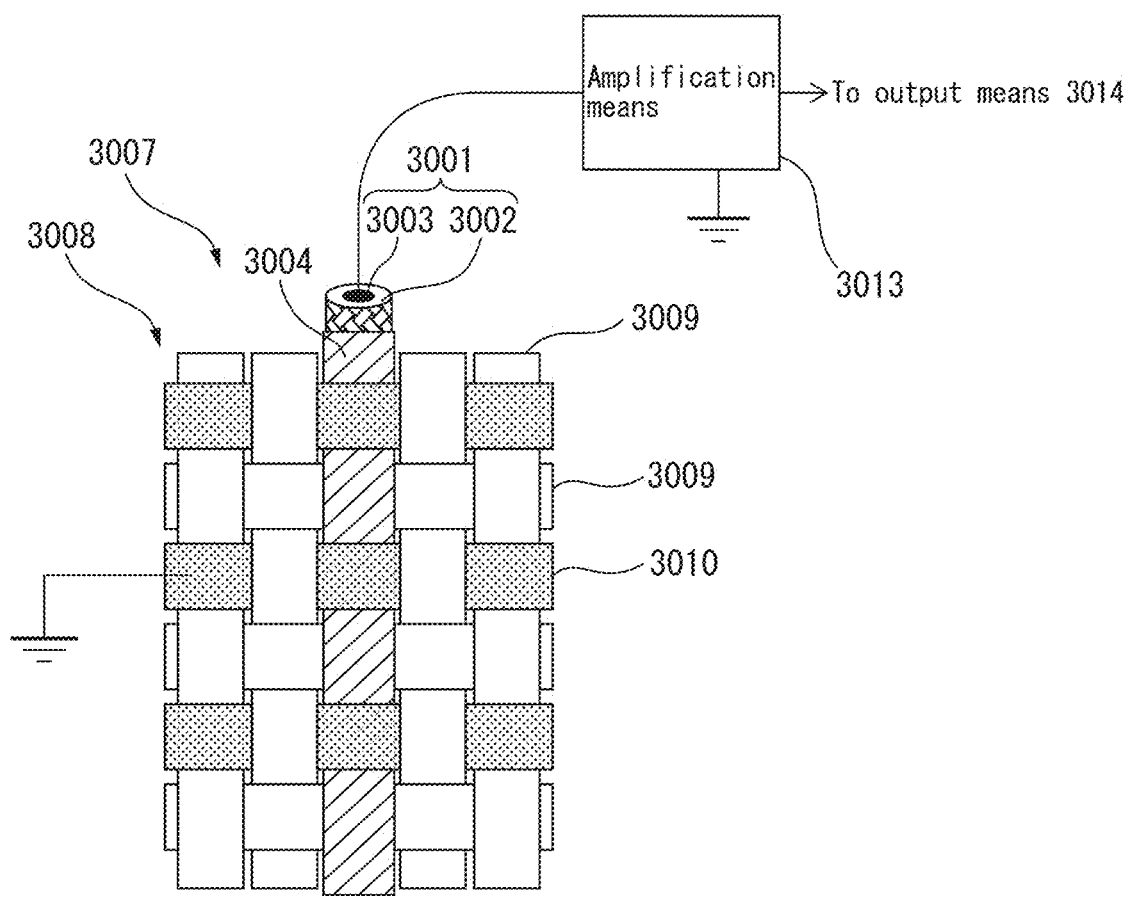
FIG. 17 is a schematic diagram showing another example of the construction of a device comprising a fabric-like piezoelectric element according to the third invention.
Figure 18:
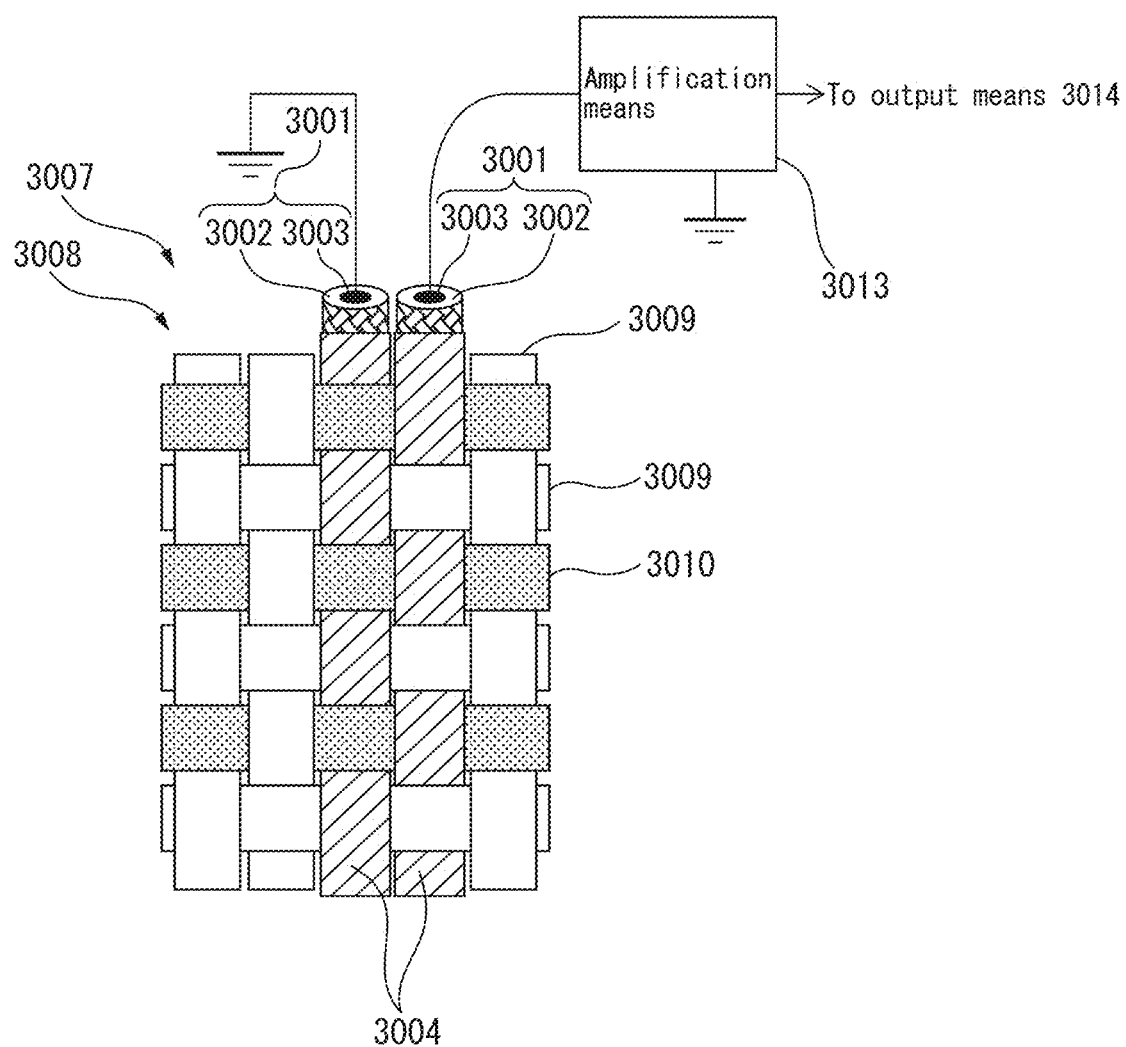
FIG. 18 is a schematic diagram showing another example of the construction of a device comprising a fabric-like piezoelectric element according to the third invention.

FIGS. 16 to 18 are schematic diagrams showing examples of the construction of a device comprising a braided fabric-like piezoelectric element according to an embodiment. The amplification means 3013 in each of FIGS. 16 to 18 corresponds to the one explained with reference to FIG. 14, although the illustrations in FIGS. 16 to 18 omit the output means 3014 and transmission means 3015 shown in FIG. 14. When a device is constructed comprising the fabric-like piezoelectric element 3007, a lead wire is connected from the core 3003 of the braided piezoelectric element 3001 to an input terminal of the amplification means 3013, while the conductive layer 3004 of the braided piezoelectric element 3001, or the conductive fiber 3010 of the fabric-like piezoelectric element 3007, or a braided piezoelectric element that is separate from the braided piezoelectric element 3001 connected to the input terminal of the amplification means 3013, is connected to a ground (earth) terminal. For example, as shown in FIG. 16, in the fabric-like piezoelectric element 3007, a lead wire from the core 3003 of the braided piezoelectric element 3001 is connected to the input terminal of the amplification means 3013, and the conductive layer 3004 of the braided piezoelectric element 3001 is grounded (earthed). Moreover, in the fabric-like piezoelectric element 3007 shown in FIG. 17, for example, a lead wire from the core 3003 of the braided piezoelectric element 3001 is connected to the input terminal of the amplification means 3013, and the conductive fibers 3010 contacting with the braided piezoelectric element 3001 in a crossing manner are grounded (earthed). Also, when multiple braided piezoelectric elements 3001 are arranged in the fabric-like piezoelectric element 3007 as shown in FIG. 18, for example, one lead wire from the core 3003 of one braided piezoelectric element 3001 is connected to the input terminal of the amplification means 3013, while a lead wire from the core 3003 of another braided piezoelectric element 3001 alongside the braided piezoelectric element 3001 is grounded (earthed).

Since the device 3011 of the invention is flexible and may be used in any form such as braided or fabric-like, it has a very wide range of potential uses. Specific examples for the device 3011 of the invention may be clothing that includes caps, gloves and socks, touch panels in the form of supporters or handkerchiefs, and surface pressure-sensitive sensors for humans or animals, such as sensors that detect bending, twisting or stretching of the joint sections of gloves or bands or supporters, for example. When used for a human, for example, it may be used as an interface for detection of contact or movement and collection of data regarding movement of a joint being used for medical purposes, or for amusement, or for movement of lost tissue or a robot. In addition, it may be used as a surface pressure-sensitive sensor in a stuffed doll simulating an animal or human form, or a robot, or as a sensor for sensing of bending, twisting or stretching of joints. It may still further be used as a surface pressure-sensitive sensor or shape deformation sensor in beddings such as sheets or pillows, shoe soles, gloves, chairs, mats, bags, flags or the like.

In addition, since the device 3011 of the invention is in braided or fabric form and is flexible, it may be used as a surface pressure-sensitive sensor or shape deformation sensor by attachment or covering on the surface of all or portions of various structures.

Furthermore, since the device 3011 of the invention can generate a sufficient electrical signal simply by rubbing the surface of the braided piezoelectric element 3001, it can be used in touch input devices such as touch sensors, or in pointing devices. Moreover, since positional information and shape information in the height direction of an object to be measured can be obtained by rubbing the surface of the object to be measured with the braided piezoelectric element 3001, it can be used in surface form measurement and the like.

As another mode of the invention, a braided piezoelectric element may be provided comprising a core formed of a conductive fiber and a sheath formed of braided piezoelectric fibers covering the core, wherein the pull-out strength of the conductive fibers is 0.1 N or greater, so that a fiber-like piezoelectric element can be provided that allows a large electrical signal to be extracted even by stress produced with relatively small deformation, and a piezoelectric element can also be provided that has low variation in signal strength with respect to deformation and excellent reproducibility of signal strength even with repeated use.

More specifically, in the braided piezoelectric element of this mode, a plurality of piezoelectric fibers are closely wound around the outer peripheral surface of at least one conductive fiber. While it is not our intention to be constrained by any particular theory, it is surmised that when deformation is produced in the braided piezoelectric element, stress is produced in each of the piezoelectric fibers by the deformation, producing an electric field in each of the piezoelectric fibers (piezoelectric effect), and as a result a voltage change takes place in the conductive fiber, as superimposition of the electric field of the plurality of piezoelectric fibers wound around the conductive fiber. During this time, it is important for the signal strength detected via the conductive fiber as the core, to not change its state of contact with the piezoelectric fibers as the sheath. It is important for the pull-out strength of the core, as the mechanical property value of the braided piezoelectric element indicating the state of contact, to be 0.1 N or greater. The pull-out strength is dependent on the contact area and normal force between the conductive fiber and the piezoelectric fibers, and in particular the normal force is thought to depend on the tensile force of the piezoelectric fiber wind when the braid is formed. Also, presumably with a pull-out strength of 0.1 N or greater, the piezoelectric fibers are wound around the conductive fiber in an elastically deformed state and are sufficiently contacting. Thus, presumably there is no change in its state of contact even during deformation, and an element can be obtained having excellent reproducibility even with repeated deformation. Moreover, in a braided piezoelectric element, the electrical signal from the conductive fiber will sometimes be greater than when the state of contact of conductive fiber with the braided sheath of the piezoelectric fibers is insufficient, i.e. when the pull-out strength is low. Incidentally, the conductive fiber may also consist of a plurality of fibers.

The pull-out strength is 0.1 N or greater, preferably 0.5 N or greater and more preferably 1 N or greater. The pull-out strength is most preferably equal to or greater than the strength of the conductive fiber. If the pull-out strength is less than 0.1 N, on the other hand, this is a state of insufficiently generated normal force, i.e. a state of insufficient contact, and the state of contact will vary under deformation. As a result, reproducibility with repeated deformation will not be obtainable, and use as a sensor will become difficult.

The pull-out strength can be measured by the following method. First, the braid is cut to a 7 cm length, a 1 cm length of sheath is straightened at both ends to expose the core, and one end is cut only at the core while the other end is cut only at the sheath. While in this state, the core alone and the sheath alone at either end are gripped, and the maximum strength is measured while pulling at a speed of 50 cm/min. When it is difficult to ensure a length of 5 cm at the evaluating section, the pull-out strength of the braid of an arbitrary length is measured and converted to a strength per 5 cm.

As another mode of the invention, a braided piezoelectric element may be provided comprising a core formed of a conductive fiber and a sheath formed of braided piezoelectric fibers covering the core, and having a bending recovery of 70 or greater, whereby a fiber-like piezoelectric element can be provided that allows a large electrical signal to be extracted even by stress produced with relatively small deformation, and that has satisfactory repeated reproducibility of electrical signals.

More specifically, in the braided piezoelectric element according to this mode, the bending recovery is the value defined by the following formula (10).

$$X = L/3 \times 100 \tag{Formula 10}$$

Figure 33:
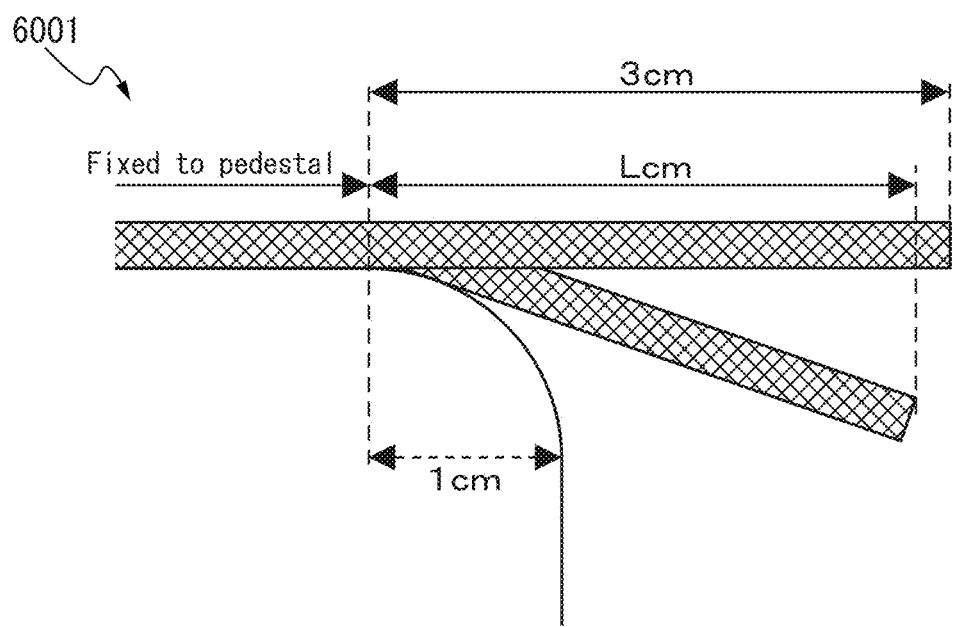
FIG. 33 is a diagram showing an apparatus that measures bending recovery.

X: Bending recovery
L: Braid protruding distance after bending recovery measurement test The braid protruding distance L after the test is measured by the following method. That is, in the apparatus shown in FIG. 33, first the braided piezoelectric element 6001 is fixed while protruding 3 cm from a pedestal having a corner with a curvature radius of 1 cm, and then the braided piezoelectric element 6001 is bent along the pedestal so that the surface of the braid facing the pedestal contacts the pedestal over its entire area. The external force applied to the braided piezoelectric element 6001 is then immediately removed. After the bent braided piezoelectric element 6001 has been restored by stress, the distance of protrusion from the pedestal is measured and the value is recorded as L. The units for L are cm. When the braid short and protrusion of 3 cm is difficult to obtain, substitution may be performed with the following formula (11), using the length of the protruding section as L0.

$$X = L/L0 \times 100 \tag{Formula 11}$$

The core and/or sheath may include, within a range in which the braided piezoelectric element 6001 still adequately functions as a sensor, a filament to adjust the bending recovery for a bending recovery of 70 or greater (hereunder referred to as "bending recovery-adjusting filament"). The cross-sectional area of the bending recovery-adjusting filament is 0.001 to 1.0 mm$^2$, preferably 0.005 to 0.5 mm$^2$ and more preferably 0.01 to 0.3 mm$^2$. If the bending recovery-adjusting filament is too thin the bending recovery will not reach or exceed 70, and if the bending recovery-adjusting filament is too thick the flexibility of the braided piezoelectric element 6001 will be lost. The proportion of the bending recovery-adjusting filament with respect to the core and/or sheath is preferably no greater than 50%, more preferably no greater than 30% and even more preferably no greater than 10%. If the proportion of the bending recovery-adjusting filament with respect to the core and/or sheath is too low the bending recovery will not reach or exceed 70, and if the proportion of the bending recovery-adjusting filament is too high the flexibility of the braided piezoelectric element will be lost, or the electrical signal obtained from the braided piezoelectric element may be too low. The bending recovery-adjusting filament may be used alone as a single filament when preparing the braid structure, or it may be combined with the filaments of the core and/or sheath. By including a bending recovery-adjusting filament in the core and/or sheath, the braided piezoelectric element will more easily return to its original state after having been deformed, and therefore the repeated reproducibility of electrical signals will be improved.

The braided piezoelectric element may include, within a range such that the braided piezoelectric element 6001 still functions as a sensor, a covering layer on the outer side of the sheath so that the bending recovery is 70 or greater. The thickness of the covering layer is 0.05 to 2.0 mm, preferably 0.04 mm to 1.0 mm and more preferably 0.03 to 0.5 mm. If the covering layer is too thin the bending recovery will fail to reach or exceed 70, and if the covering layer is too thick the flexibility of the braided piezoelectric element may be lost, or electrical signals obtained from the braided piezoelectric element may be reduced. By including a covering layer on the outer side of the sheath, the braided piezoelectric element will more easily return to its original state after having been deformed, and therefore the repeated reproducibility of electrical signals will be improved. Furthermore, including a covering layer will increase the constraining force of the sheath, so that stress will be efficiently applied to the piezoelectric fibers and the signal strength may thus be increased.

The core and/or sheath may include, within a range such that the braided piezoelectric element still functions as a sensor, a highly elastic fiber so that the bending recovery is 70 or greater. The elastic modulus of the highly elastic fiber is 15.0 GPa, preferably 30.0 GPa or greater, more preferably 0.0 GPa or greater and even more preferably 100.0 GPa or greater. If the elastic modulus of the highly elastic fiber is low, the bending recovery will not reach or exceed 70, and if the elastic modulus of the highly elastic fiber is too high the flexibility of the braided piezoelectric element will be lost. The proportion of the highly elastic fiber with respect to the core and/or sheath is preferably no greater than 50%, more preferably no greater than 30% and even more preferably no greater than 10%. If the proportion of the highly elastic fiber with respect to the core and/or sheath is too low the bending recovery will not reach or exceed 70, and if the proportion of the bending recovery-adjusting filament is too high the flexibility of the braided piezoelectric element will be lost, or the electrical signal obtained from the braided piezoelectric element may be too low. The highly elastic fiber may be used alone as a single filament when preparing the braid structure, or it may be combined with the filaments of the core and/or sheath. By including a highly elastic fiber in the core and/or sheath, the braided piezoelectric element will more easily return to its original state after having been deformed, and therefore the repeated reproducibility of electrical signals will be improved.

The bending recovery-adjusting filament may also be included in the core and/or sheath. The cross-sectional area of the bending recovery-adjusting filament is 0.001 to 1.0 mm$^2$, preferably 0.005 to 0.5 mm$^2$ and more preferably 0.01 to 0.3 mm$^2$. If the bending recovery-adjusting filament is too thin the bending recovery will not reach or exceed 70, and if the bending recovery-adjusting filament is too thick the flexibility of the braided piezoelectric element will be lost.

A known filament may be used for the bending recovery-adjusting filament. For example, a synthetic polymer filament may be used, such as a polyester filament, nylon filament, acrylic filament, polyethylene filament, polypropylene filament, vinyl chloride filament, aramid filament, polysulfone filament, polyether filament or polyurethane filament. The bending recovery-adjusting filament is not limited to these, and any publicly known filament may be used. Such filaments may also be used in combination. The bending recovery-adjusting filament used may be a fiber with various known cross-sectional shapes. The bending recovery-adjusting filament may be either a monofilament or a multifilament. When the bending recovery-adjusting filament is a multifilament, the total of the single thread cross-sectional areas is considered to be the cross-sectional area.

Highly elastic fiber may be included in the core and/or sheath. The elastic modulus of the highly elastic fiber is 15.0 GPa, preferably 20.0 GPa or greater, more preferably 30.0 GPa or greater and even more preferably 50.0 GPa or greater. If the elastic modulus of the highly elastic fiber is low, the bending recovery will not reach or exceed 70, and if the elastic modulus of the highly elastic fiber is too high the flexibility of the braided piezoelectric element will be lost. The proportion of the highly elastic fiber with respect to the core and/or sheath is preferably no greater than 50%, more preferably no greater than 30% and even more preferably no greater than 10%. If the proportion of the highly elastic fiber with respect to the core and/or sheath is too low the bending recovery will not reach or exceed 70, and if the proportion of the bending recovery-adjusting filament is too high the flexibility of the braided piezoelectric element will be lost. By including a highly elastic fiber in the core and/or sheath, the braided piezoelectric element will more easily return to its original state after having been deformed, and therefore the repeated reproducibility of electrical signals will be improved.

Any known fiber with an elastic modulus of 15.0 GPa or greater may be used as the highly elastic fiber. Examples include aramid fiber, PBO fiber, LCP fiber, ultrahigh molecular weight polyethylene fiber, carbon fiber, metal fiber, glass fiber and ceramic fiber. Combinations of these may also be used. The high-strength fiber also has not only high elasticity, but also preferably has ductility of 1% or greater, more preferably 3% or greater and even more preferably 5% or greater. If the ductility is low, the fiber may break when the braid has been deformed, not only impairing the quality but also preventing improvement in the repeated reproducibility of electrical signals.

As another mode of the invention, a fabric-like piezoelectric element may be provided comprising a fabric including two or more braided piezoelectric elements, each of the two or more braided piezoelectric elements having a core formed of a conductive fiber and a sheath formed of braided piezoelectric fibers covering the core, whereby a fiber-like piezoelectric element can be provided that efficiently extracts electricity even by stress produced with relatively small deformation, to allow detection regarding the type of movement, and particularly twisting.

Figure 34:
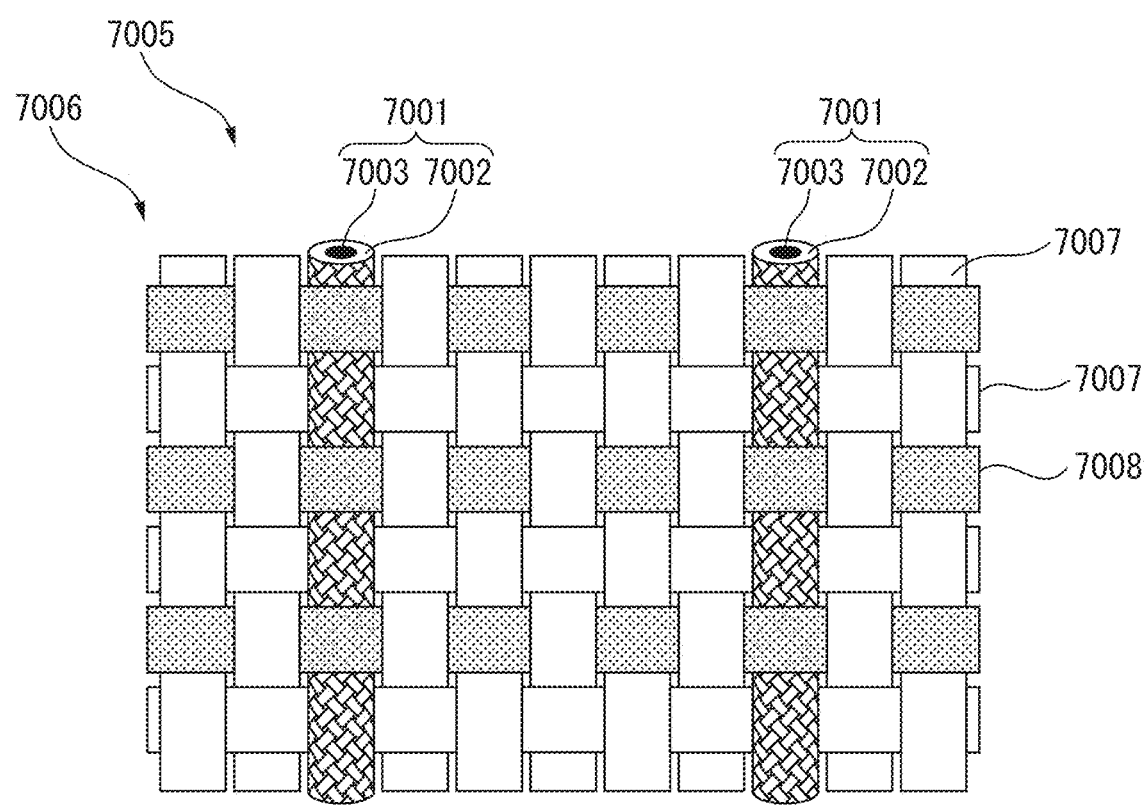
FIG. 34 is a schematic diagram showing an example of the construction of a fabric-like piezoelectric element.

FIG. 34 is a schematic diagram showing an example of the construction of a fabric-like piezoelectric element using a braided piezoelectric element according to an embodiment. The fabric-like piezoelectric element 7005 comprises a fabric 7006 including two or more braided piezoelectric elements 7001, the braided piezoelectric elements 7001 being arranged essentially in a parallel fashion. The fabric 7006 may be any type of woven or knitted fabric wherein at least two of the fibers (including braids) composing the fabric is a braided piezoelectric element 7001, with no particular limitation so long as the braided piezoelectric element 7001 can exhibit the function of a piezoelectric element. In the example shown in FIG. 34, the fabric-like piezoelectric element 7005 is a plain weave fabric having two or more braided piezoelectric elements 7001 and insulating fibers 7007 arranged as warp thread and the conductive fibers 7008 and insulating fibers 7007 alternately arranged as weft thread. All or some of the insulating fibers 7007 and/or conductive fibers 7008 may also be in braided form.

The braided piezoelectric elements 7001 emit a piezoelectric signal when deformed, the signal varying in magnitude and shape depending on the manner of deformation. In the case of the fabric-like piezoelectric element 7005 shown in FIG. 34, when the fabric-like piezoelectric element 7005 has undergone bending deformation of a line perpendicular to the two braided piezoelectric elements 7001 as the bending section, the two braided piezoelectric elements 7001 undergo the same deformation. Thus, the same signal is detected from the two braided piezoelectric elements 7001. In the case of complex deformation such as twisting, on the other hand, different deformation will be induced in the two braided piezoelectric elements 7001, and the signal generated by each braided piezoelectric element 7001 will differ. Based on this principle, it is possible to combine multiple braided piezoelectric elements 7001 and comparatively compute the signal generated at each braided piezoelectric element 7001, to analyze complex deformation of the braided piezoelectric elements 7001. For example, it is possible to detect complex deformation such as twisting based on results obtained by comparing the polarity, amplitude and phase of the signal generated at each braided piezoelectric element 7001.

The plurality of braided piezoelectric elements 7001 are arranged essentially in a parallel fashion, each preferably separated by at least 0.5 cm, more preferably separated by at least 1.0 cm and even more preferably separated by at least 3.0 cm. If the distance between the braided piezoelectric elements 7001 is too small, both braided piezoelectric elements 7001 will be less likely to have different deformation when twisting deformation is applied, which is undesirable. Incidentally, no such limitation applies when they are to be used for detection of bending deformation. When braided piezoelectric elements that are not to be used for signal detection are included in a fabric, the distance between a braided piezoelectric element and another braided piezoelectric element may be less than 0.5 cm.

By combining a plurality of braided piezoelectric elements 7001 and comparatively computing the signal generated by each braided piezoelectric element 7001 as explained above, it is possible to analyze complex deformation such as twisting, thereby allowing application in a wearable sensor in the form of clothing, for example. In this case, when the fabric-like piezoelectric element 7005 has deformed by bending or the like, the braided piezoelectric element 7001 also deforms in a manner following that deformation, and the deformation of the fabric-like piezoelectric element 7005 can be detected based on the electrical signal outputted from the braided piezoelectric element 7001. Furthermore, since the fabric-like piezoelectric element 7005 can be used as a fabric (woven or knitted fabric), it can be applied as a wearable sensor in the form of clothing, for example.

Figure 35:
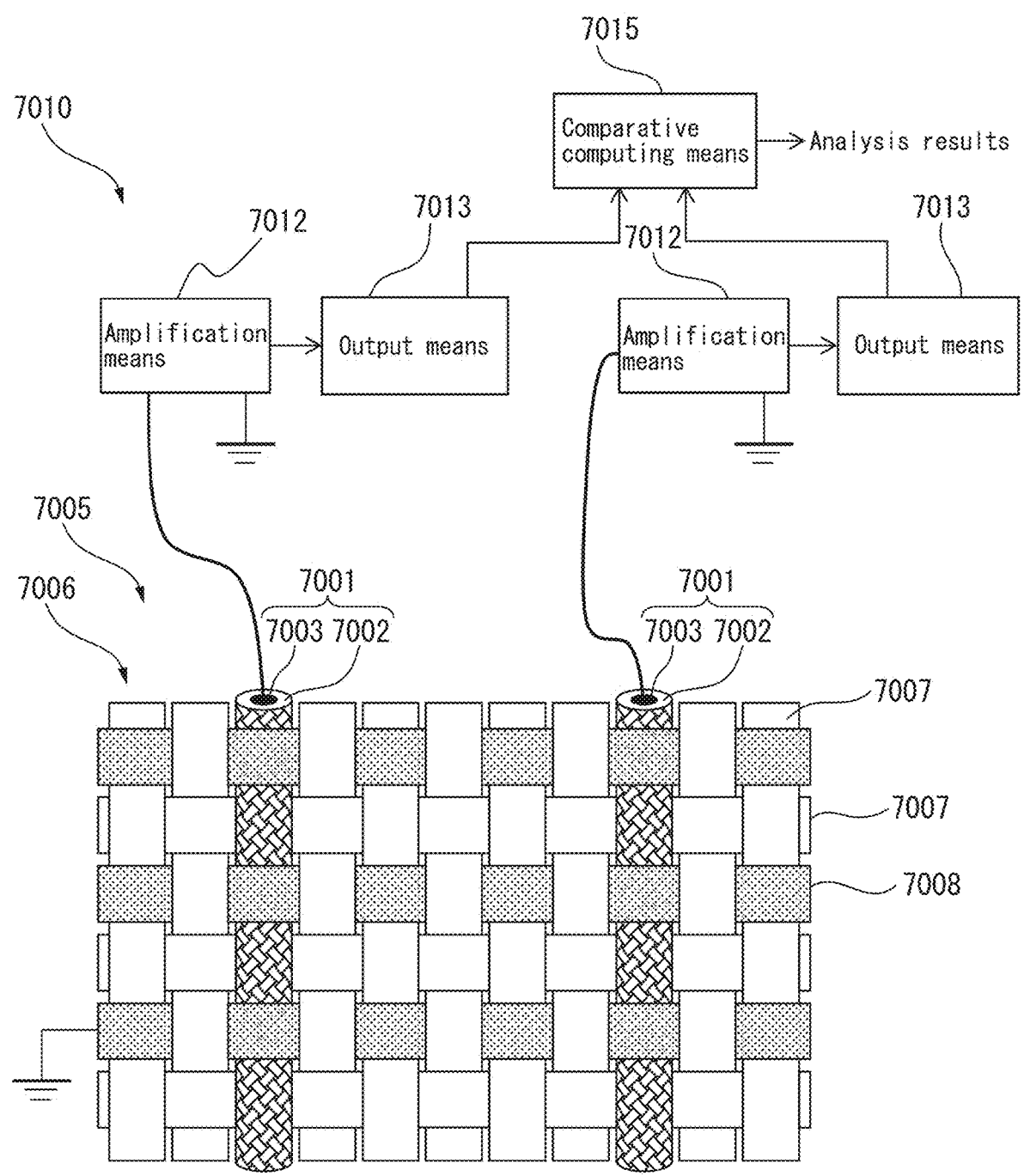
FIG. 35 is a schematic diagram showing an example of the construction of a device comprising a fabric-like piezoelectric element.

FIG. 35 is a schematic diagram showing an example of the construction of a device 7010 comprising a braided fabric-like piezoelectric element according to an embodiment. In FIG. 35, at the final stage of the output means 7013 there is provided comparative computing means 7015 that comparatively computes the electrical signal of each braided piezoelectric element 7001 outputted from the output means 7013, to analyze deformation of the piezoelectric elements 11. When a device is constructed comprising a fabric-like piezoelectric element 7005, a lead wire is connected from the core 7003 of the braided piezoelectric element 7001 to an input terminal of the amplification means 7012, while a separate braided piezoelectric element from the braided piezoelectric element 7001 connected to the input terminal of the amplification means 7012, or a conductive fiber 7008, is connected to a ground (earth) terminal. For example, in the fabric-like piezoelectric element 7005 as shown in FIG. 35, a lead wire from the core 7003 of the braided piezoelectric element 7001 is connected to the input terminal of the amplification means 7012, and the conductive fibers 7008 contacting with the braided piezoelectric element 7001 in a crossing manner are grounded (earthed). Although the comparative computing means 7015 is provided in the device 7010 in FIG. 35, the comparative computing means 7015 may instead be provided in an external device.

As a separate mode of the invention, there is provided a fabric-like sensor having a braided piezoelectric element comprising a core formed of conductive fiber and a sheath formed of braided piezoelectric fibers covering the core, and also a fabric-like element comprising a separate conductive fiber situated adjacent to the braided piezoelectric element, to which is connected:

an electronic circuit connected to the core of the braided piezoelectric element and comprising an algorithm that detects a signal derived from the piezoelectricity of the sheath of the braided piezoelectric element, and an electronic circuit connected to both the conductive fiber of the core of the braided piezoelectric element and the separate conductive fiber, and comprising an algorithm that detects the electrostatic capacity between the two conductive fibers, whereby it is possible to provide a fiber-like piezoelectric element capable of extracting a large electrical signal even from stress produced by relatively small deformation, and to also provide a highly functional sensor combining a system that detects changes in electrostatic capacity.

Figure 36:
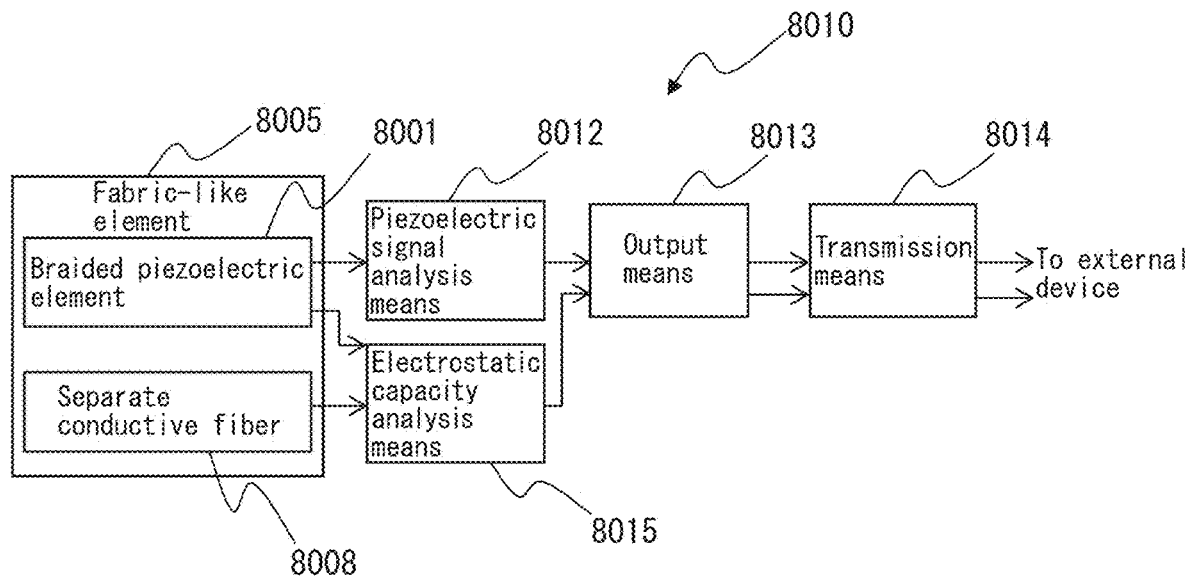
FIG. 36 is a block diagram showing a device comprising a fabric-like element according to an embodiment.

FIG. 36 is a block diagram showing a device 8010 comprising a fabric-like element 8005 according to this mode. The device 8010 comprises a braided piezoelectric element 8001, piezoelectric signal analysis means 8012 that amplifies an electrical signal outputted from the braided piezoelectric element 8001 in response to deformation or applied pressure, electrostatic capacity analysis means 8015 that detects the degree of change in electrostatic capacity that varies in response to stretching and applied pressure, output means 8013 that outputs the electrical signal amplified by the piezoelectric signal analysis means 8012 and the degree of change in electrostatic capacity detected at the electrostatic capacity analysis means 8015, and transmission means 8014 that transmits the electrical signal outputted from the output means 8013 to an external device (not shown). By using the device 8010, it is possible to detect the amount and/or applied location of applied stress and stretching of a fabric-like element, by computation processing at an external device (not shown), based on an electrical signal outputted by contact, pressure or shape deformation on the surface of the fabric-like element 8005. Alternatively, computing means (not shown) may be provided in the device 8010, that computes the amount and/or applied location of applied stress or stretching of the fabric-like element 8005, based on the electrical signal outputted from the output means 8013. Also, at an early stage of the piezoelectric signal analysis means 8012 and electrostatic capacity analysis means 8015 there may be provided separating means (not shown) that separates the piezoelectric signals from the braided piezoelectric elements and the electrostatic capacity-detecting signal between the braided piezoelectric elements and the separate conductive fiber. Incidentally, the transmission system using transmission means 8014 may be either wireless or wired, determined as appropriate depending on the sensor to be constructed.

The fabric-like sensor according to this mode is connected with an electronic circuit that is connected to the core of the braided piezoelectric element 8001 and comprises an algorithm that detects signals derived from piezoelectricity of the sheath of the braided piezoelectric element 8001 (piezoelectric signal analysis means 8012), and an electronic circuit that is connected to both the conductive fiber of the core of the braided piezoelectric element and the separate conductive fiber, and comprises an algorithm that detects the electrostatic capacity between these two conductive fibers (electrostatic capacity analysis means 8015).

As mentioned above, at an early stage of the piezoelectric signal analysis means 8012 and electrostatic capacity analysis means 8015 there is preferably provided separating means that separates the piezoelectric signal from the braided piezoelectric element 8001 and the electrostatic capacity-detecting signal between the braided piezoelectric element 8001 and the separate conductive fiber 8008.

According to a preferred example of the separating means, the piezoelectric signal and the electrostatic capacity signal are intermittently measured while alternately switching between a period of applying the algorithm that detects the signal derived from the piezoelectricity of the sheath of the braided piezoelectric element by the electronic circuit connected to the core of the braided piezoelectric element 8001, and a period of applying the algorithm that detects the electrostatic capacity between the conductive fiber of the core of the braided piezoelectric element, and the separate conductive fiber, by the electronic circuit connected to both of the two conductive fibers. By setting a sufficiently short switching time, both of the signals may be considered to be measured simultaneously, if the operating speed is on the level of the human body.

Another preferred example of the separating means is measurement by detecting the electrostatic capacity at a relatively high frequency (preferably 1 kHz or higher and more preferably 100 kHz or higher) by application of an alternating current voltage, and then, when the signal derived from the piezoelectric signal is of a relatively low frequency (for example, <1 kHz), such as when monitoring human body activity, separating the component derived from the piezoelectric signal from the component of the electrostatic capacity-detecting alternating current signal by filter processing, and simultaneously applying the algorithm for detection of the piezoelectric signal and the algorithm for detection of the electrostatic capacity, in parallel.

Instead of the amplification means alone, it may also be used in combination with publicly known signal processing means, such as noise-canceling means or means for combined processing with other signals. The order of connection of such means may be modified as appropriate depending on the purpose. Naturally, the electrical signal outputted from the fabric-like element 8005 may be subjected to signal processing after being directly transmitted to an external device.

Furthermore, since the device 8010 of this mode can generate a sufficient electrical signal simply by rubbing the surface of the braided piezoelectric element 8001, it can be used in touch input devices such as touch sensors, or in pointing devices. Moreover, since positional information and shape information in the height direction of an object to be measured can be obtained by rubbing the surface of the object to be measured with the braided piezoelectric element 8001, it can be used in surface form measurement and the like. In addition to the use described above, it may be used as a sensor to simultaneously monitor change in pressing force on a fabric or stretchability, by analysis of electrostatic capacity, in combination with a piezoelectric signal, for use in a high-performance input device or pointing device or wearable interface.

In particular, while bending can be specifically detected by piezoelectric signals in a braided piezoelectric element, since it is difficult to detect information relating to the position of bending by that alone, it may be combined with analysis of electrostatic capacity to allow detection of positional information relating to the pressed location, and therefore both of these may be analyzed to allow the overall difference in shape deformation undergone by the sensor, and specifically the location of bending, the degree of bending, the location of twisting, the degree of twisting or the presence or absence of pressing force, to be easily ascertained by a simple construction, thus expanding its range of applications as a wearable sensor that responds to various types of input stimulation. Furthermore, since the structural members are simple, it is possible to minimize static electricity arising from rubbing between structural members, which is one of the causes of noise signal generation, and also to improve the feel during use by the wearer, which is a requirement for wearable materials.

As another mode of the invention, there is provided a sensor having a braided piezoelectric element fixed in a fibrous structure, whereby a fiber-like piezoelectric element device can be provided that is capable of subsequent addition of sensor functions, without restricting movement or handleability.

More specifically, the method of fixing the braided piezoelectric element for this mode may be any desired method suitable for the object of measurement and the purpose of use. Examples include a method of attachment using a pressure-sensitive adhesive such as paste or a bonding material, a method of fixing by a magnet, heat or a clip, a method of stitching or sewing, such as embroidery, on a fabric-like object, a method of fixing by twisting with the braided piezoelectric element located on the surface or inside a braided object, or a method of training a braid onto an object and packing the braid together with the object, although there is no limitation to these methods. The braided piezoelectric element does not need to be immobilized in a straight line, and may be fixed as desired in a curved manner or the like to conform to the object used and the purpose of use.

As a separate mode of the invention there is provided a flat braided piezoelectric element comprising a fabric that includes a braided piezoelectric element comprising a core formed of conductive fiber and a sheath formed of braided piezoelectric fibers covering the core, the piezoelectric fibers including polylactic acid as the main component, and the winding angle of the piezoelectric fibers with respect to the conductive fiber being between 150 and 75°, inclusive, wherein the fabric is a flat braided fabric formed so as to cover multiple core threads with arbitrary fibers, and the flat braided piezoelectric element employs the braided piezoelectric elements for at least two or more of the multiple core threads, whereby a flat braided piezoelectric element can be provided that can extract a large electrical signal even in response to stress produced by relatively small deformation, and that can detect types of movement and particularly movement relating to twisting.

Figure 37:
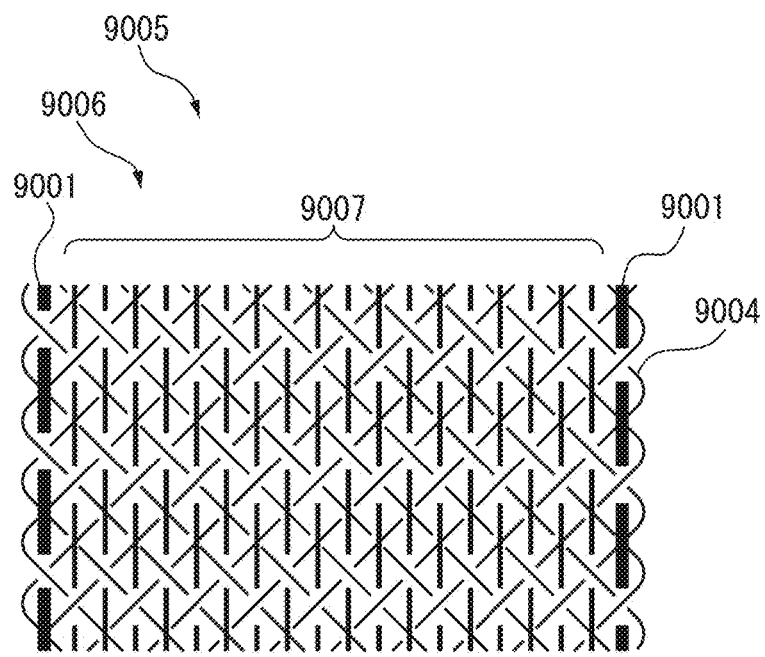
FIG. 37 is a schematic diagram showing an example of the construction of a flat braided piezoelectric element according to an embodiment.

FIG. 37 is a schematic diagram showing an example of the construction of a flat braided piezoelectric element according to an embodiment.

The flat braided piezoelectric element 9005 comprises a flat braid 9006 including two or more braided piezoelectric elements 9001. The flat braid 9006 is not a common flat braid, but rather a flat braid having a core thread 9007 situated parallel to the warp direction of the braid threads, and forming a braid covering its periphery. It may be any type of flat braid wherein at least two of the fibers (including braids) composing the fabric is a braided piezoelectric element 9001, with no particular limitation so long as the braided piezoelectric element 9001 can exhibit the function of a piezoelectric element. The flat braid may be formed by union weaving, mixed knitting or the like, with other fibers (including braids), so long as the object of the invention is achieved. Naturally, the braided piezoelectric element 9001 may be used as the core thread 9007 or as a portion of the braid threads covering the core thread 9007, or the braided piezoelectric element 9001 may be embroidered or bonded with a fabric. In the example shown in FIG. 37, the flat braided piezoelectric element 9005 is a flat braid having two or more braided piezoelectric elements 9001 and fibers 9004 arranged around the core thread 9007. Any desired fibers may be used for the core thread 9007 and fibers 9004, with no particular limitations. However, in the flat braided piezoelectric element 9005 shown in FIG. 35, the fibers 9004 are in crossing contact with the braided piezoelectric elements 9001. By using conductive fibers for at least some of the fibers 9004 and grounding (earthing) them, it is possible to reduce the effects of electromagnetic waves on the braided piezoelectric element 9001. That is, by using conductive fibers as the fibers 9004, they can function as an electromagnetic shield for the braided piezoelectric element 9001. It is thereby possible to significantly increase the S/N ratio of the flat braided piezoelectric element 9005 even without layering a conductive fabric for electromagnetic shielding above and below the flat braided piezoelectric element 9005, for example. In this case, a higher proportion of conductive fibers among the fibers 9004 is preferred from the viewpoint of electromagnetic shielding, with 30% or greater being more preferred. This limitation does not apply, however, when the flat braided piezoelectric element 9005 exhibits electromagnetic shielding power by covering or the like. The fibers 9004, 9007 may also be braided.

The braided piezoelectric element 9001 emits a piezoelectric signal when it has undergone deformation, and the signal obtained is a signal with plus/minus reversal depending on the orientation of the deformation. In the case of the flat braided piezoelectric element 9005 shown in FIG. 37, when the flat braided piezoelectric element 9005 has undergone bending deformation, the two braided piezoelectric elements 9001 deform in the same direction, as deformation occurs. Consequently, if a positive signal leaves one braided piezoelectric element 9001, a positive signal will also leave the other braided piezoelectric element 9001. On the other hand, when twisting deformation has been applied to the flat braided piezoelectric element 9005, the two braided piezoelectric elements 9001 deform in mutually opposite directions. Therefore, if a positive signal leaves one braided piezoelectric element 9001, a negative signal will leave the other braided piezoelectric element 9001.

The braided piezoelectric elements 9001 are preferably arranged essentially in parallel, with mutual separation of at least 1 cm. If the spacing distance between the two braided piezoelectric elements 9001 is too small, both braided piezoelectric elements 9001 will be less likely to deform in opposite directions when twisting deformation has been applied, which is undesirable. Incidentally, this limitation does not apply when it is not to be used for detection of twisting. When braided piezoelectric elements that are not to be used for signal detection are included in a flat braid, the distance between a braided piezoelectric element and another braided piezoelectric element may be less than 1 cm.

The texture of the flat braid may be any desired texture, such as crossing of right-wound threads and left-wound threads, entangling with the core thread, or winding at an angle with the core thread.

By combining the signals from multiple braided piezoelectric elements 9001 as described above, it is possible to ascertain different types of movement such as bending and twisting. If combined with the detected signal strengths, the type of movement and the degree of the deformation can be obtained, thereby allowing application as a wearable sensor in the form of clothing, for example.

When one or both of the braided piezoelectric elements 9001 are arranged to form the flat braided piezoelectric element 9005, an advantage is afforded in that the manner of arrangement and manner of combination may be selected within a wide range, since the braided piezoelectric elements 9001 do not need electrodes on the surface. Moreover, when one or both of the braided piezoelectric elements 9001 are arranged, electrical signals can be efficiently extracted because the distance between conductive fibers is short.

The fourth invention will now be explained in detail.

The object of the fourth invention is achieved by a transducer composed of at least two sheets or fabrics, at least one of the sheets or fabrics comprising the following layer A, and at least one of the layers other than layer A comprising the following layer B.

Layer A: A flat transducer that outputs or inputs an electrical signal, including a piezoelectric unit wherein a conductive fiber and a piezoelectric fiber are arranged on approximately the same plane so as to provide electrical connection, the transducer having a function of mutually converting between stress in a specific location or direction and an electrical signal as selective output or input.

Layer B: A flat transducer that outputs or inputs an electrical signal, the transducer having a function of mutually converting between a signal in a specific location or direction differing from that of layer A or a signal of a different type than that of layer A, and an electrical signal as selective output or input.

In addition, by situating the following layer C between layer A and layer B as necessary, the object of the present application is more easily achieved.

Layer C: A layer having the function of reducing noise caused by electrical interference between layer A and layer B.

Each of the structural aspects will now be explained.
(Layer A)

Layer A is a sheet-like or fabric-like transducer that outputs or inputs an electrical signal, including a piezoelectric unit wherein conductive fibers and piezoelectric fibers, described below, are arranged on approximately the same plane so as to provide electrical connection, the transducer having a function of mutually converting between stress in a specific location or direction and an electrical signal as selective output or input.
(Conductive Fiber)

The conductive fiber may be of any type that exhibits conductivity and any publicly known type may be used, examples of which include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber winding. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity.

The base fiber that has been coated with a metal may be a publicly known fiber, regardless of the presence or absence of conductivity, examples of which include polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these and any publicly known fiber may be used, or combinations of these fibers may be used.

The metal to be coated onto the base fiber may be any type that exhibits conductivity and exhibits the effect of the invention.

Examples to be used include gold, silver, platinum, copper, nickel, tin, zinc, palladium, indium tin oxide, copper sulfide and the like, as well as their mixtures and alloys.

The conductive fiber used may be a multifilament consisting of a bundle of multiple filaments, or a monofilament consisting of a single filament. Using a multifilament is preferred from the viewpoint of the long-term stability of the electrical characteristics. The diameter of a monofilament is 1 μm to 5000 μm, and preferably 2 μm to 100 μm. It is more preferably 3 μm to 50 μm. The number of filaments is preferably from 1 to 100,000, more preferably 5 to 500 and even more preferably 10 to 100. If the diameter is small the strength will be reduced and handling may become difficult, while if the diameter is large there may be some sacrifice of flexibility. The cross-sectional shape of the conductive fiber is preferably circular or elliptical from the viewpoint of design and production of the piezoelectric element, but this is not limitative.

Moreover, a lower electrical resistance is preferred for efficient extraction of electrical output from the piezoelectric polymer, the volume resistivity being preferably no greater than $10^{-1}$ Ω·cm, more preferably no greater than $10^{-2}$ Ω·cm and even more preferably no greater than $10^{-3}$ Ω·cm. However, the resistivity of the conductive fiber is not limited thereto so long as strong signal detection can be obtained.
(Piezoelectric Fibers)

The piezoelectric fibers are fibers with a piezoelectric property. The piezoelectric fibers are preferably made of a piezoelectric polymer. The piezoelectric polymer used may be a polymer that exhibits piezoelectricity, such as polyvinylidene fluoride or polylactic acid, but it is preferably one including mainly polylactic acid. Polylactic acid is readily oriented and exhibits piezoelectricity by stretching after melt spinning, and has excellent productivity since it does not require electric field orientation treatment as is necessary with polyvinylidene fluoride and the like. A piezoelectric fiber composed of polylactic acid has low polarization with tension and compression stress in the axial direction and thus has poor function as a piezoelectric element, whereas it produces relatively large electrical output under shearing stress, which is preferable for a piezoelectric element of the invention having a construction in which shearing stress tends to be applied to the piezoelectric polymer.

The piezoelectric polymer preferably includes mainly polylactic acid. The term "mainly" means preferably 90 mol % or greater, more preferably 95 mol % or greater and even more preferably 98 mol % or greater.

Polylactic acid includes poly-L-lactic acid obtained by polymerization of L-lactic acid and L-lactide, poly-D-lactic acid obtained by polymerization of D-lactic acid and D-lactide, and stereocomplex polylactic acid comprising a hybrid structure of these, depending on the crystal structure, and any of these may be used so long as they exhibit piezoelectricity. Poly-L-lactic acid and poly-D-lactic acid are preferred from the viewpoint of a high piezoelectric modulus. Since poly-L-lactic acid and poly-D-lactic acid exhibit opposite polarization against the same stress, they may be used in combination according to the purpose. The optical purity of the polylactic acid is preferably 99% or greater, more preferably 99.3% or greater and even more preferably 99.5% or greater. If the optical purity is less than 99% the piezoelectric modulus may be significantly lowered, potentially making it difficult to obtain sufficient electrical output by shape deformation of the piezoelectric fibers. The piezoelectric polymer includes mainly poly-L-lactic acid or poly-D-lactic acid, preferably with an optical purity of 99% or greater.

The piezoelectric fibers are preferably uniaxially oriented in the fiber axis direction of the fiber and include crystals, and more preferably they are uniaxially oriented polylactic acid with crystals. This is because polylactic acid exhibits high piezoelectricity in a crystalline state and when uniaxially oriented.

Since polylactic acid is a polyester with relatively rapid hydrolysis, a publicly known hydrolysis preventer such as an isocyanate compound, oxazoline compound, epoxy compound or carbodiimide compound may be added when resistance to moist heat is an issue. Also, if necessary, an antioxidant, plasticizer, photodegradation inhibitor or the like such as a phosphoric acid-based compound may be added to modify the physical properties.

Moreover, polylactic acid may be used as an alloy with another polymer, in which case if polylactic acid is to be used as the main piezoelectric polymer, the amount of the polylactic acid is preferably at least 50 wt % or greater, more preferably 70 wt % or greater and most preferably 90 wt % or greater, based on the total weight of the alloy.

In the case of an alloy, suitable examples of polymers other than polylactic acid include polybutylene terephthalate, polyethylene terephthalate, polyethylene naphthalate copolymer and polymethacrylate, with no limitation to these, and any polymer may be used so long as the piezoelectricity that is the object of the invention is exhibited.

The piezoelectric fibers used may be multifilaments consisting of bundles of multiple filaments, or monofilaments consisting of single filaments. Using multifilaments is preferred from the viewpoint of the long-term stability of the electrical characteristics. The diameter of a monofilament is 1 μm to 5000 μm, and preferably 2 μm to 100 μm. It is more preferably 3 μm to 50 μm. The number of filaments is preferably from 1 to 100,000, more preferably 5 to 500 and even more preferably 10 to 100.

In order to obtain a piezoelectric fiber from the piezoelectric polymer, any publicly known method for forming a fiber from a polymer may be employed so long as the effect of the invention can be exhibited, such as a method of forming a fiber by extrusion molding of a piezoelectric polymer, a method of forming a fiber by melt spinning of a piezoelectric polymer, a method of forming a fiber by dry or wet spinning of a piezoelectric polymer, or a method of forming a fiber by electrostatic spinning of a piezoelectric polymer. The spinning conditions employed may be according to a publicly known process suitable for the piezoelectric polymer used, and for most cases a melt spinning process may be employed, which facilitates industrial production.

As mentioned above, when the piezoelectric polymer is polylactic acid, it will exhibit greater piezoelectricity if oriented by uniaxial stretching and if it contains crystals, and therefore the fiber is preferably stretched.

(On Approximately the Same Plane)

In the piezoelectric element of the invention, the conductive fiber and the piezoelectric fibers are arranged on approximately the same plane. Here, "on approximately the same plane" means that the fiber axes are situated approximately on a plane, where "approximately" includes any areas of thickness produced at the crossing points between the fibers.

For example, the form in which one piezoelectric fiber is aligned parallel between two parallel conductive fibers is a form that is on approximately the same plane. Even if the fiber axis of the one piezoelectric fiber is inclined in a state that is not parallel to the two parallel conductive fibers, it is still on approximately the same plane. Also, even if one conductive fiber and one piezoelectric fiber are aligned parallel while another conductive fiber is crossing with the aligned conductive fiber and piezoelectric fiber, it is still on approximately the same plane.

By being arranged on approximately a plane, the piezoelectric units can be easily combined to form a fabric-like piezoelectric element, and utilizing the piezoelectric element in the form of a fabric can increase the freedom of shape design for the transducer. Woven fabrics, knitted fabrics and nonwoven fabrics are examples of the type of fabric for the invention.

The relationship between the piezoelectric fibers and conductive fibers is selected as appropriate depending on the shape deformation that is to be detected.

(Order of Arrangement)

The arrangement of the fibers in the piezoelectric unit is not particularly restricted so long as the conductive fibers and piezoelectric fibers are arranged so as to provide electrical connection. For example, when the piezoelectric unit comprises two conductive fibers and one piezoelectric fiber, the arrangement is preferably in the order: conductive fiber, piezoelectric fiber, conductive fiber. Such an arrangement will eliminate contact between the two conductive fibers of the piezoelectric unit, allowing effective functioning as a piezoelectric unit without applying other means to the conductive fiber, such as covering with an insulating material.

It is preferred to have contact points where the conductive fibers and piezoelectric fibers are mutually in physical contact, but electrical connection can be provided even without physical contact so long as the spacing between the conductive fibers and piezoelectric fibers is in a range of no greater than 4 mm. The spacing between the conductive fibers and piezoelectric fibers is preferably no greater than 3 mm, more preferably no greater than 2 mm, even more preferably no greater than 1 mm and most preferably no greater than 0.5 mm. If the spacing is greater than 4 mm, the electrical output may be lower with shape deformation of the piezoelectric fibers, and use as a transducer may become difficult.

The form may be, for example, one in which two conductive fibers are arranged in parallel and one piezoelectric fiber is situated so as to intersect the two conductive fibers. Alternatively, two conductive fibers may be arranged as warp thread (or weft thread), and one piezoelectric fiber arranged as weft thread (or warp thread). In this case, the two conductive fibers are preferably not in contact with each other, and there may be employed a form in which preferably an insulating material, such as insulating fibers, is situated between the two conductive fibers, or a form in which the insulating material covers only the surfaces where the conductive fibers tend to contact, while the conductive fiber directly contacts with the piezoelectric fibers.

(Insulating Fiber)

The piezoelectric unit of the invention includes insulating fibers, and the insulating fibers will sometimes be situated between the conductive fibers and piezoelectric fibers in such a manner that the conductive fibers in the piezoelectric unit do not contact the other conductive fibers or the piezoelectric fibers. In this case, the insulating fibers used may be fibers of a material and shape that are stretchable, in order to improve the flexibility of the fabric. In addition, the conductive fibers in the piezoelectric unit will sometimes be situated in such a manner as not to contact with the other conductive fibers and piezoelectric fibers in the piezoelectric unit.

By situating the insulating fibers in the piezoelectric unit in this manner, there will be no contact of the conductive fibers even when several piezoelectric units have been combined, and the performance as a transducer can be improved.

Such insulating fibers that are used need only have a volume resistivity of $10^6$ Ω·cm or greater, or more preferably $10^8$ Ω·cm or greater and even more preferably $10^{10}$ Ω·cm or greater.

Examples of insulating fibers to be used include polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. There is no restriction to these, however, and any publicly known insulating fibers may be used as desired. These insulating fibers may also be used in combination, or combined with fibers having no insulating property to form fibers with an overall insulating property.

The insulating fibers used may be a multifilament consisting of a bundle of multiple filaments, or a monofilament consisting of a single filament. Using multifilaments is preferred from the viewpoint of the long-term stability of the insulating property. When used as a monofilament the filament diameter is 1 μm to 5000 μm, and preferably 50 μm to 1000 μm. When used as a multifilament the monofilament diameter is 0.1 μm to 5000 μm, and preferably 2 μm to 100 μm. It is more preferably 3 μm to 50 μm. The number of filaments for a multifilament is preferably from 1 to 100,000, more preferably 5 to 500 and even more preferably 10 to 100.

Moreover, fibers of various publicly known shapes may be used, for the purpose of imparting flexibility to the fabric.

(Combination Forms of Piezoelectric Units)

According to the invention, a woven or knitted fabric containing a plurality of piezoelectric units aligned in parallel is preferred. Such a form will allow the freedom of shape deformation (flexibility) of the piezoelectric element to be increased.

Such a woven or knitted fabric form includes multiple piezoelectric units, with no limitations so long as it can exhibit function as a piezoelectric element. Knitting or weaving using a common loom or knitting machine may be carried out to obtain a woven fabric or knitted fabric form. When multiple piezoelectric units are to be introduced into a single fabric, it may be fabricated in a continuous manner during weaving or knitting, or it may be fabricated by joining together separately prepared fabrics.

Examples for the woven texture of the woven fabric include three foundation weaves such as plain weave, twill weave or satin weave, half-double weaves such as derivative weave, warp backed weave and weft backed weave, and warp velvet weaves.

The type of knitted fabric may be a circular knit fabric (weft knitted fabric) or a warp knitted fabric. Examples of preferred textures of circular knit fabrics (weft knitted fabrics) include plain stitch, rib stitch, interlock stitch, purl stitch, tuck stitch, float stitch, rib-and-tuck stitch, lace stitch and plating stitch. Examples of warp braid stitches include single denbigh stitch, single atlas stitch, double cord stitch, half-tricot stitch, lined stitch and jacquard stitch. It may consist of a single layer, or a multilayer with two or more layers. Alternatively, it may be a plush weave or plush stitch, composed of nap sections and ground weave sections comprising cut piles and/or loop piles.

Incidentally, when the piezoelectric units are present by being incorporated into a woven texture or knitted texture, bent sections will be present in the piezoelectric fibers themselves, but smaller bent sections of the piezoelectric fibers are preferred in order to cause piezoelectric performance as a piezoelectric element to be more efficiently exhibited. Among woven fabrics and knitted fabrics, therefore, woven fabrics are preferred.

In this case as well, since smaller bent sections of the piezoelectric fibers will result in piezoelectric performance being more efficiently exhibited, as mentioned above, a twill weave is preferred over a plain weave as the woven texture, and a satin weave is preferred over a twill weave. Among satin weaves in particular, a step number in the range of 3 to 7 is preferred because a high level of woven texture retention and piezoelectric performance will be exhibited.

Because the polylactic acid of the piezoelectric fiber is susceptible to electrostatic charge, it may tend to exhibit malfunctioning. In such cases, the piezoelectric fibers that are to extract signals may be grounded (earthed) for use. The method of grounding (earthing) is preferably placement of a conductive fiber separately from the signal-extracting conductive fiber. In this case, the volume resistivity of the conductive fiber is preferably no greater than $10^{-1}$ Ω·cm, more preferably no greater than $10^{-2}$ Ω·cm and even more preferably no greater than $10^{-3}$ Ω·cm.

(Selectivity of Location or Direction)

The transducer of layer A has the function of selectively converting stress at a specific location or direction into an electrical signal as output or input. The function of selectively converting stress at a specific location into an electrical signal is a function whereby the strength or sign of an electrical signal changes depending on the location at which stress has been applied, an example being a transducer that has a linear or point-like piezoelectric unit on the plane of layer A and detects only stress at that piezoelectric unit. Another preferred example is a transducer that has a plurality of straight linear or point-like piezoelectric units on the plane of layer A, and that detects stress on each piezoelectric unit as electrical signals on separate channels. The function of selectively converting stress in a specific direction into an electrical signal is a function whereby the strength or sign of an electrical signal changes depending on the direction in which stress has been applied, i.e. the ratio of each component of the stress tensor, an example being a transducer that outputs a particularly strong electrical signal for shearing stress ax: but does not output an electrical signal for stress components other than $\sigma_{xz}$, assuming that the x-axis is the fiber axis of the piezoelectric fiber forming the piezoelectric unit of layer A, and the x-y plane is the plane formed by layer A. The transducer of layer A preferably has both a function of selectively converting stress at a specific location into an electrical signal as output or input, and a function of selectively converting stress in a specific direction into an electrical signal as output or input.

Figure 20:
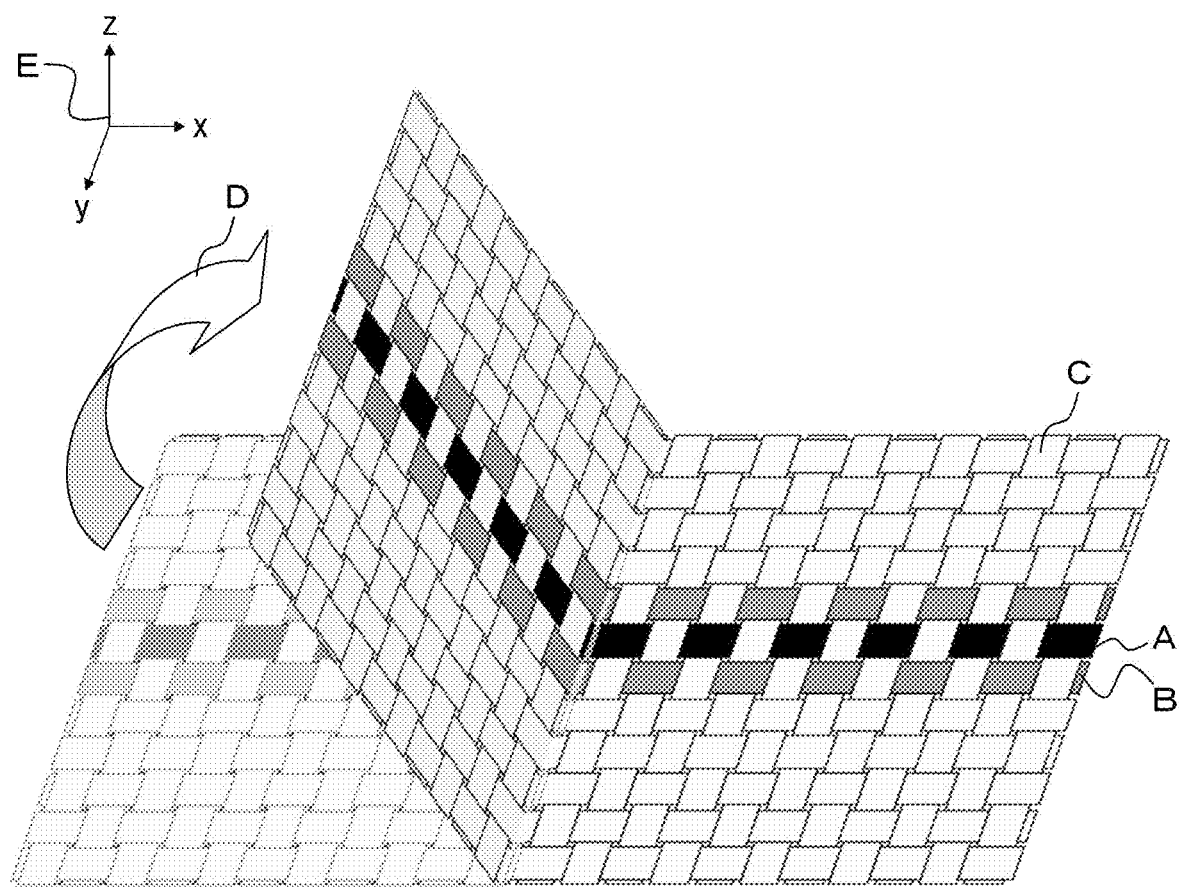
FIG. 20 is a structure that selectively detects bending in a specific direction, with a woven texture for layer A.
Figure 21:
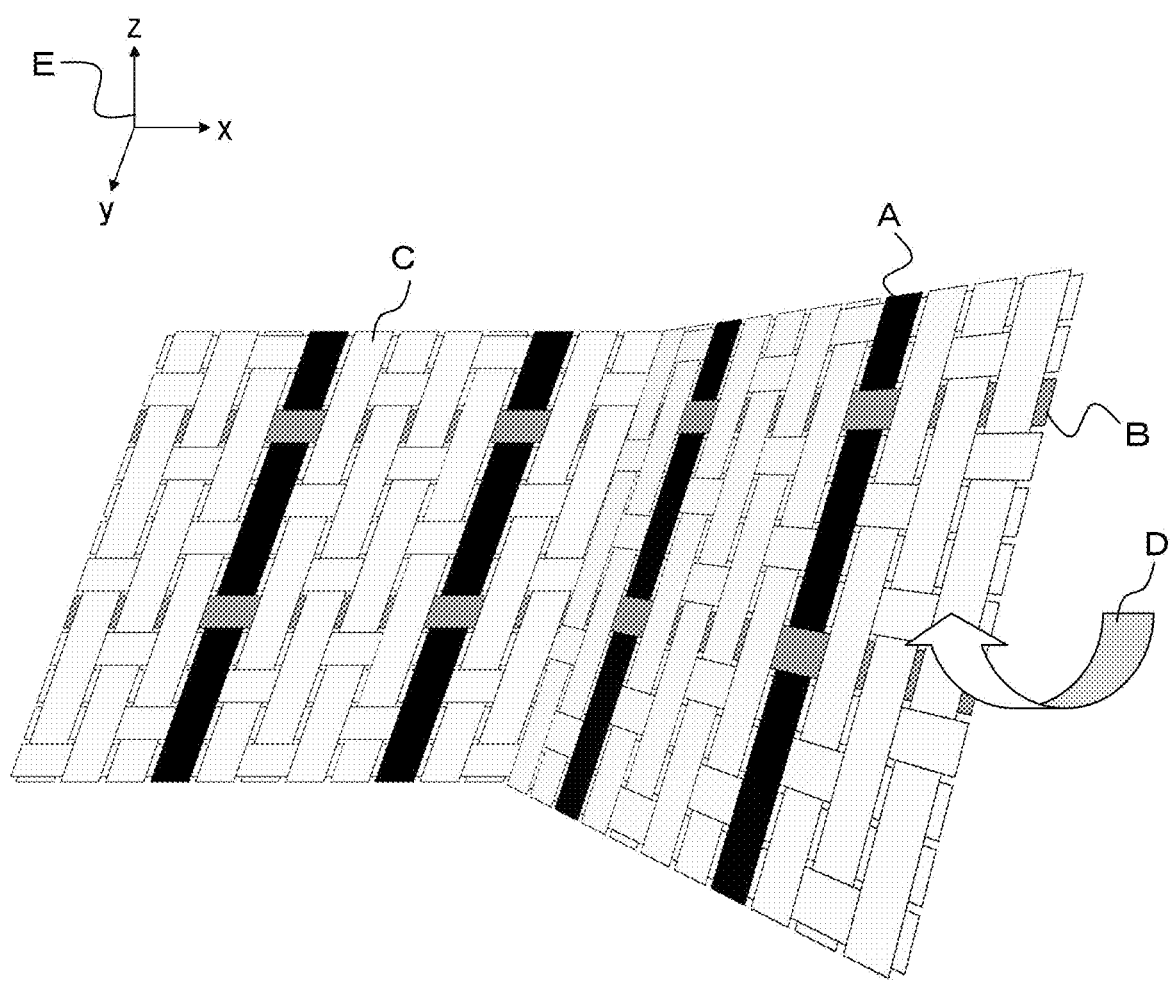
FIG. 21 is a structure that selectively detects twisting, with a woven texture for layer A.
Figure 22:
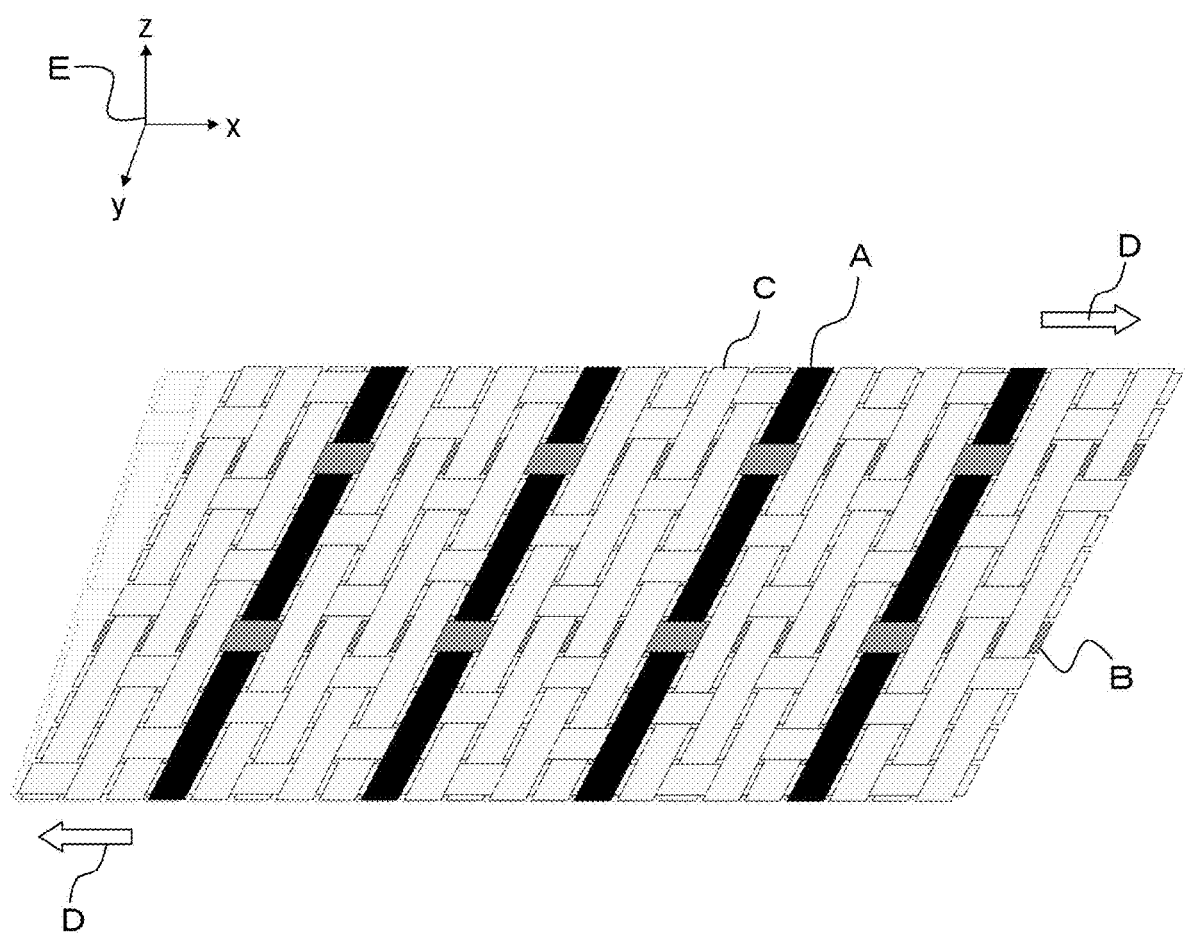
FIG. 22 is a structure that selectively detects slipping deformation, with a woven texture for layer A.

The woven texture of layer A, or if necessary the woven texture disposed in layer B, is appropriately selected depending on the location and shape of deformation to be detected. For example, when bending in a specific direction is to be detected, the piezoelectric fibers and conductive fibers are preferably in a parallel relationship, which will allow selective detection of bending in the direction in which curvature of the piezoelectric fibers A and conductive fibers B increases, as shown in FIG. 20. When twisting is to be detected as shown in FIG. 21 or slipping deformation is to be detected as shown in FIG. 22, the piezoelectric fibers A and conductive fibers B are preferably in a direct relationship, in a satin weave structure. When deformation at a specific location is to be detected, the piezoelectric unit comprising piezoelectric fibers A and a conductive fiber B is situated at the specific location and the signal from the conductive fiber B of the piezoelectric unit is analyzed, to allow deformation at the specific location to be detected. In the case of a woven texture in which the piezoelectric fibers A and conductive fibers B are in a parallel relationship, deformation in a linear location can be detected, while in the case of a woven texture in which the piezoelectric fibers A and conductive fibers B are in a direct relationship, deformation at point locations can be detected.

(Multiple Piezoelectric Elements)

Multiple piezoelectric elements may also be used in arrangement. The manner of arrangement may be on one level in one dimension, or overlaid in two dimensions, or use by weaving into a fabric, or formation in a braided manner. A fabric-like or braided piezoelectric element can also be realized in this manner. For a fabric or braided form, blending, union weaving or mixed knitting in combination with fibers other than those of the piezoelectric element, or incorporation into a resin or the like, may be carried out so long as the object of the invention is achieved.

(Layer B)

Layer B is a flat transducer that outputs or inputs an electrical signal, the transducer having a function of mutually converting between a signal in a specific location or direction differing from that of layer A or a signal of a different type than that of layer A, and an electrical signal as selective output or input. It may be an element having the same working principle as layer A or it may be constructed of an element with a different working principle, but its selectively for the type or location or direction of the signal detected or outputted differs from layer A.

Preferred examples of elements with different working principles than layer A to be disposed in layer B include a thermocouple, resistance thermometer sensor, photodiode, electrostatic capacitive pressure detector, a film resistance pressure detector, a stretch sensor employing a rubber-like resistor, an electrostatic capacitive elastic sensor, a stress detector employing a piezoelectric ceramic, a stress detector employing a piezoelectric polymer film, or a potential gauge that employs electrodes. When a fabric-like piezoelectric element is used as layer A, a fabric-like element is preferably used for layer B as well in order to avoid impairing the flexibility and air permeability.

When a woven fabric-type transducer with the same working principle as layer A is used for layer B, it is possible to take advantage of the ability to selectively detect stress in a specific location or direction by a woven texture, as explained above.

Figure 23:
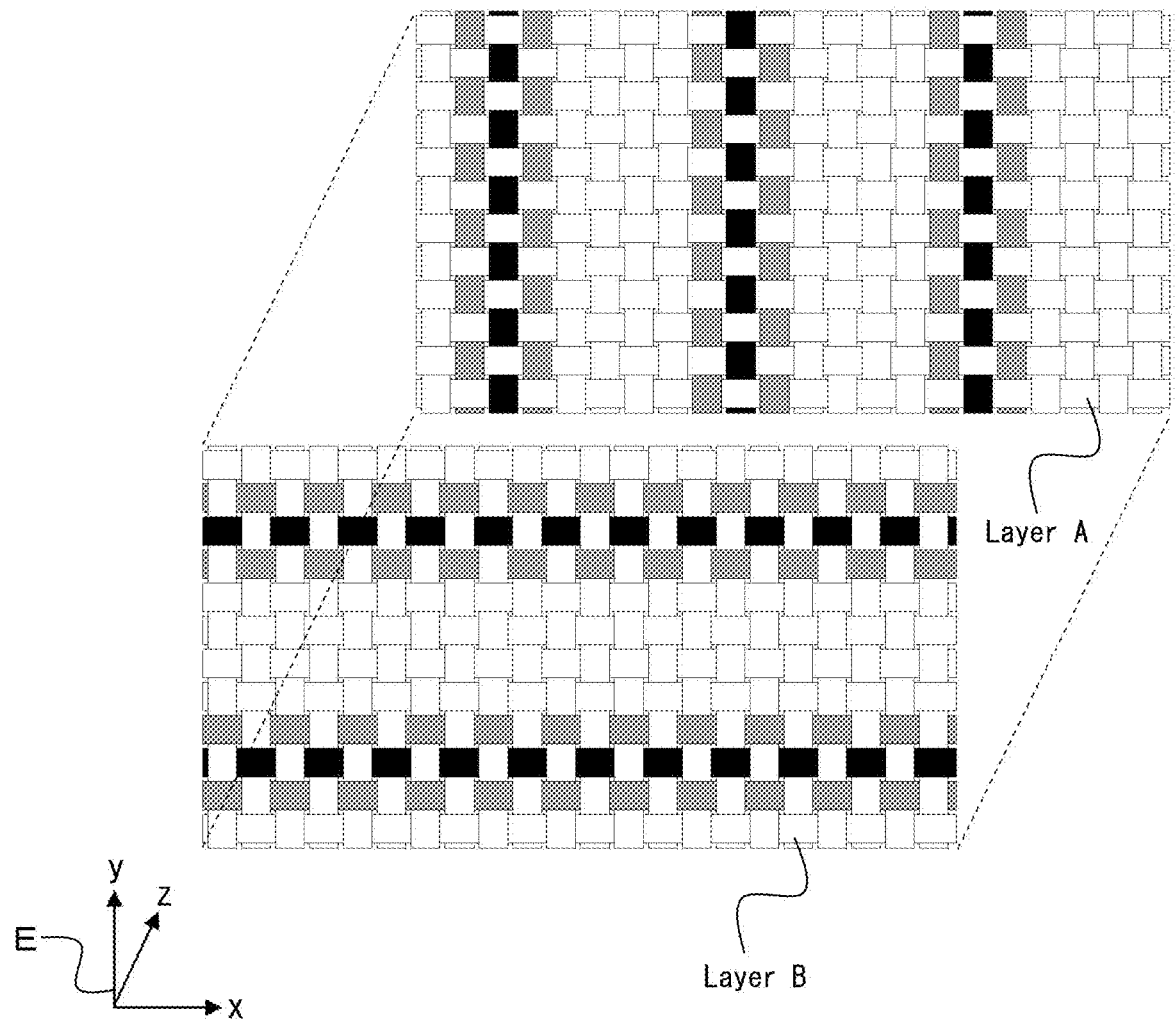
FIG. 23 is a schematic diagram of a sensor with a layered plain weave fabric.

As one example, with a sensor employing a composited fabric with plain weave fabrics for layer A and layer B overlaid as shown in FIG. 23, wherein the directions of the piezoelectric fibers and conductive fibers are rotated 90 degrees, the output strength ratio of the electrical signals of layer A and layer B varies depending on the direction in which the fabric is bent, thereby allowing the direction of bending to be detected in detail by analysis. In addition, since the detection locations are distributed in a banded fashion in both layer A and layer B, overlaying layer A and layer B with 90-degree rotation allows an element to be obtained that has grid-like detection locations. If an electrical signal input channel is set for each separate piezoelectric unit, then the signals of the piezoelectric units can be integrally analyzed to produce a sensor that allows analysis of what manner of bending deformation has been generated at which of the detection points located on the grid. An even more preferred example is a construction wherein layer C described below is sandwiched between layer A and layer B.

Figure 24:
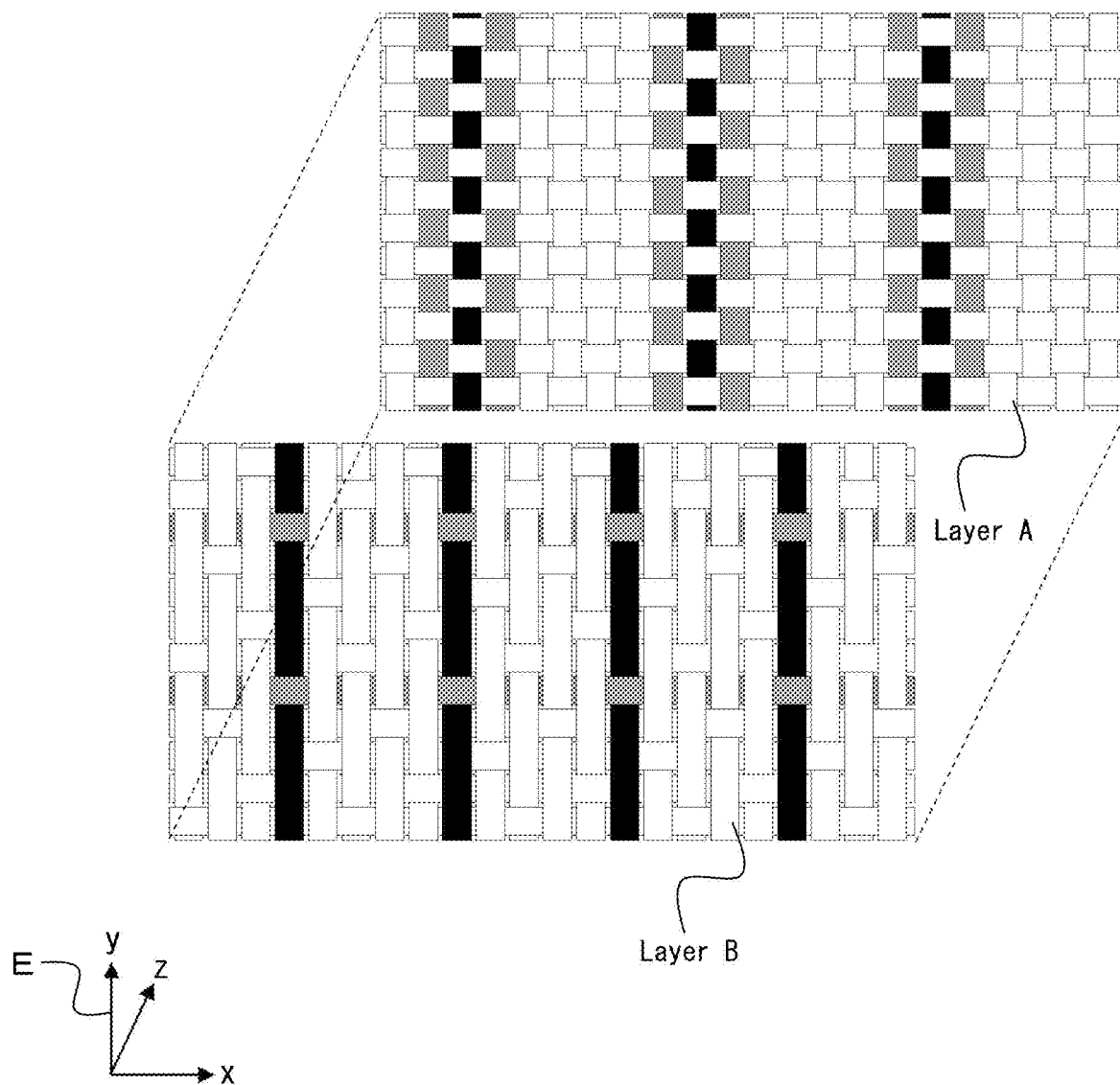
FIG. 24 is a schematic diagram of a sensor with a layered plain weave fabric and satin weave.

Another example is a sensor employing a composite fabric using a plain weave fabric for layer A and a satin weave fabric for layer B in an overlaid manner, as shown in FIG. 24. Since layer A detects the rate of bending of the fabric, i.e. displacement of the fabric outside of the plane (the z-axial direction in the drawing) simultaneously as layer B detects the rate of slipping deformation, i.e. displacement of the fabric within the plane (within the x-y plane), it is possible to detect the rate of three-dimensional displacement of the fabric. In addition, if the same plain weave fabric and satin weave fabric are overlaid with a different angle, the sensor can also analyze the direction of deformation and the location of deformation as in the examples mentioned above. An even more preferred example is a construction wherein layer C described below is sandwiched between layer A and layer B.

Using a transducer in layer B that has a different working principle than layer A is preferred for the advantage of allowing signals to be detected that cannot be detected by the transducer of layer A. For example, the transducer of layer A works on the principle of piezoelectricity and can only generate a signal while the element is operating, being unable to perform shape detection when the element is inactivated. Thus, a particularly preferred form is overlaying with a sensor for layer B that can detect the state of deformation even when the element is deactivated, such as an electrostatic capacitive pressure sensor or elastic sensor, or a stretch sensor using a rubber resistor.

Figure 25:
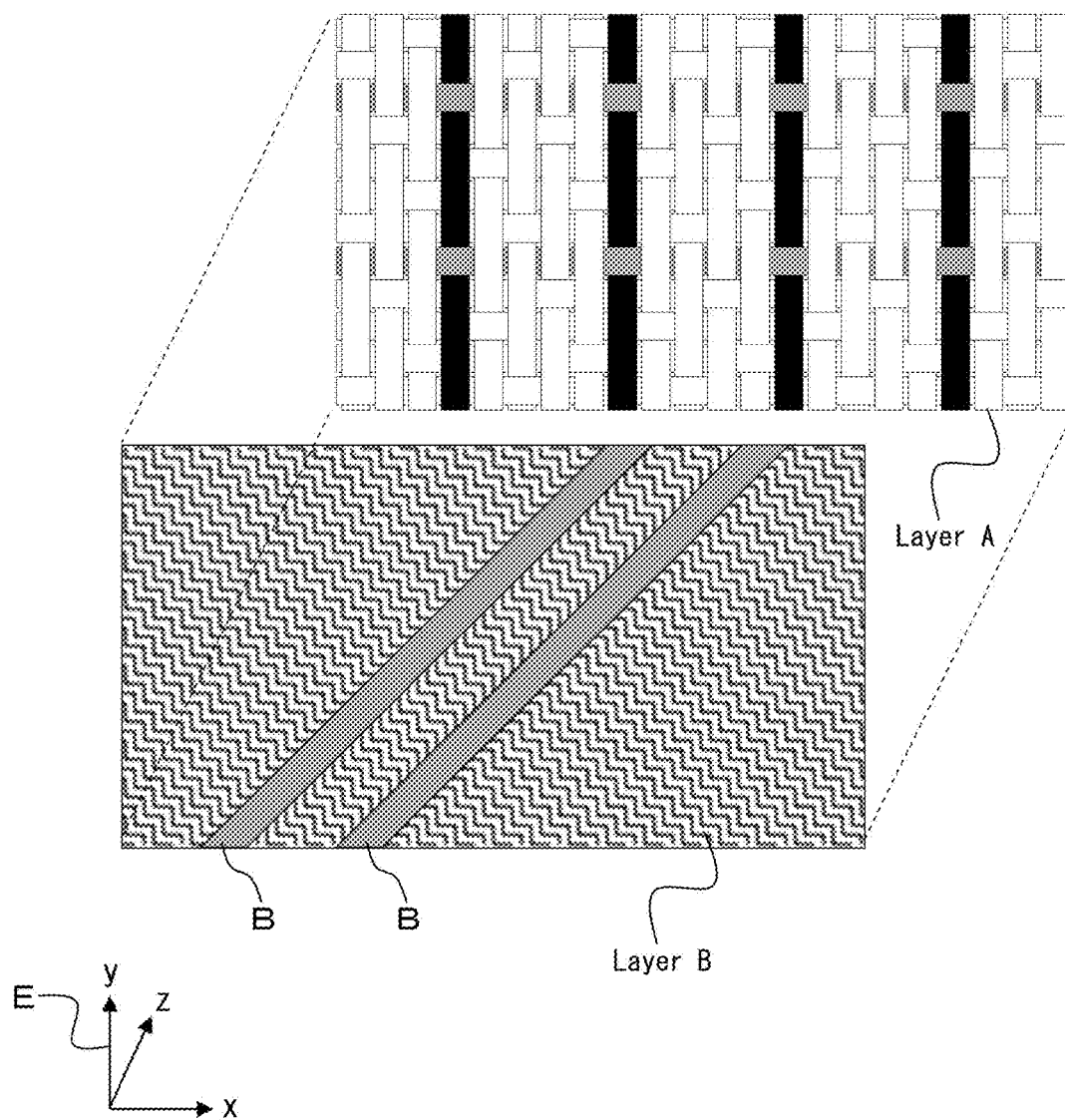
FIG. 25 is a schematic diagram of a sensor with a layered satin weave fabric and electrostatic capacitive elastic sensor.

An example of such a form is a sensor in which a satin weave fabric is used for layer A and an electrical capacitance-type stretch sensor having two conductive fibers disposed in a parallel manner in a flexible fabric is used for layer B, in an overlaid composite manner, as shown in FIG. 25. Since layer A detects the rate of slipping deformation action, i.e. displacement within the plane of the fabric (within the x-y plane), while layer B simultaneously detects the state of stretching in the direction perpendicular to the conductive fibers of the fabric (the direction (x, y, z)=(1, −1, 0) in the drawing), the state of slipping action and stretching, i.e. the displacement rate and the displacement state, can be simultaneously detected. Advantages are therefore provided, such as the ability for supplementary detection of displacement (whether displacement is continuing or not) in a dormant state, when layer A cannot perform detection, by layer B, and the ability to cut noise generated in layer B by approach of the human body, using the signal of layer A that is generated only when stretching actually takes place. An even more preferred example is a construction wherein layer C described below is sandwiched between layer A and layer B.

(Layer C)

Layer C is a layer (not shown) having the function of reducing noise caused by electrical interference between layer A and layer B. Noise by electrical interference may be noise due to electrostatic interaction, noise due to electromagnetic induction effects or noise due to short circuiting or discharge, for example. Since both layer A and layer B input and output electrical signals, layer C is preferably situated between layer A and layer B so that their respective functions can be adequately exhibited.

One example for layer C is an anti-static layer that cuts electrostatic interaction between layer A and layer B, allowing noise produced by electrostatic interaction to be reduced. The anti-static layer used may be any common one so long as it is a sheet-like or fabric-like anti-static material, but using a fabric-like element between layer A and layer B will avoid interfering with their flexibility and air permeability, and therefore preferably a fabric-like anti-static material is also used for layer C.

Another example for layer C is an insulating layer that prevents conduction between layer A and layer B, which can reduce noise due to unnecessary conduction or discharge. The insulating layer used may be any common one so long as it is a sheet-like or fabric-like anti-static material, but using a fabric-like element between layer A and layer B will avoid interfering with their flexibility and air permeability, and therefore preferably a fabric-like insulating material is also used for layer C.

When an anti-static layer is used for layer C, it is preferred to place insulating layers between the anti-static layer and layer A and the anti-static layer and layer B, in order to prevent conduction between layer A and layer B by the anti-static layer, and unnecessary conduction within layer A and layer B. That is, as layer C there are preferably used two insulating layers and one anti-static layer, with a structure layered in the order: layer A, insulating layer, anti-static layer, insulating layer, layer B. It is preferred to use a fabric with conductive fibers covered on the surface by an insulating material.

(Layering)

Layer A, layer B and layer C of the invention are preferably mutually anchored as necessary, so that their relative positions do not significantly shift. The anchoring may be carried out by a method known in the prior art such as stitching, pressure-sensitive adhesion, bonding or thermocompression bonding, depending on the strength required.

It is important for layer A, layer B and layer C of the invention to have separately different functions, i.e. a function as a transducer, of selectively converting a signal in a specific location or direction or a specific type of signal into an electrical signal as input or output, or an insulating function or anti-static function, and even though each layer is bonded by an adhesive, or hot pressing or the like into an inseparable state, they may be considered separate layers.

(Technology for Use of Piezoelectric Element)

Figure 26:
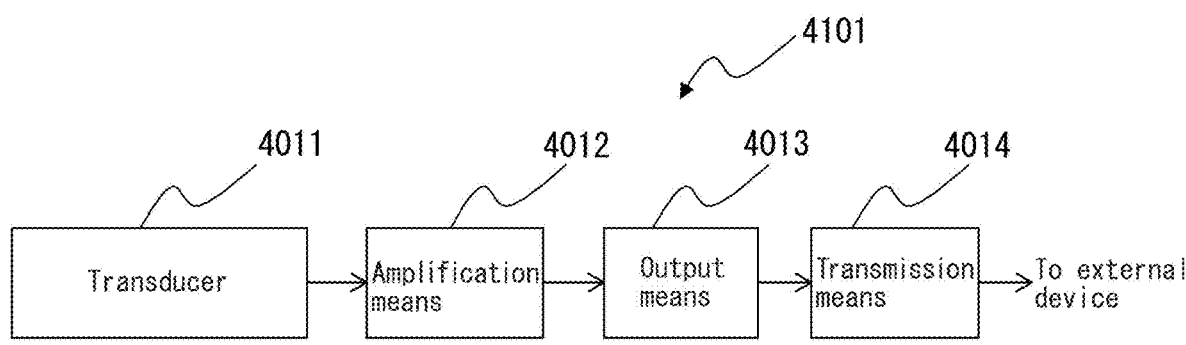
FIG. 26 is a block diagram showing a first concrete example of a device employing a transducer according to the fourth invention.

The transducer of the invention, in any of its forms, can output surface contact, pressure or shape deformation as an electrical signal. FIG. 26 is a block diagram showing a first concrete example of a device employing a transducer according to the invention. For example, a device 4101 is constructed comprising a transducer 4011 of the invention (e.g. layer A and layer B), amplification means 4012 that amplifies an electrical signal outputted from the transducer 4011 in response to applied pressure, output means 4013 that outputs the electrical signal amplified at the amplification means 4012, and transmission means 4014 that transmits the electrical signal outputted from the output means 4013 to an external device (not shown). While not shown in particular here, a lead wire from the conductive fiber of the transducer 4011 is connected to an input terminal of the amplification means 4012 and the piezoelectric fibers of the transducer 4011 are connected to a ground (earth) terminal. The amplification means 4012, output means 4013 and transmission means 4014 are separately provided for the transducer 4011 of layer A and the transducer 4011 of layer B. This allows easy extraction of electrical signals outputted by contact, pressure and shape deformation on the surfaces of the transducers 4011 of each of layer A and layer B, so that the device can be applied for various purposes. For example, it is possible to detect the amount and/or applied location of stress applied to the transducers 4011, by computation processing at an external device (not shown), based on an electrical signal outputted by contact, pressure or shape deformation on the surface of the transducers 4011. Alternatively, computing means (not shown) may be provided in the transducer 4011, that computes the amount and/or applied location of stress applied to the piezoelectric element 4011, based on the electrical signal outputted from the output means 4013.

The amplification means 4012 may be constructed of different electronic circuits, for example, or it may be constructed as a functional module implemented by a software program that operates on a processor, or it may be constructed of a combination of different electronic circuits and a software program. Examples of processors include a CPU (Central Processing Unit), DSP (Digital Signal Processor), LSI (Large Scale Integration), ASIC (Application Specific Integrated Circuit) and FPGA (Field-Programming Gate Array). The output means 4013 may also be constructed solely of different connectors, for example, or it may be constructed as a communication device integrated with the transmission means 4014. Alternatively, the functions of the amplification means 4012, output means 4013 and transmission means 4014 may be combined in the form of an integrated circuit or microprocessor in which a software program is written. Incidentally, the transmission system using transmission means 4014 may be either wireless or wired, determined as appropriate depending on the device to which it is to be applied.

Instead of the amplification means alone, it may also be used in combination with publicly known signal processing means, such as noise-canceling means or means for combined processing with other signals. The order of connection of such means may be modified as appropriate depending on the purpose. Naturally, the electrical signal outputted from the transducer 4011 may be subjected to signal processing after being directly transmitted to an external device.

Specific examples may be clothing that includes caps, gloves and socks, touch panels in the form of supporters or handkerchiefs, and surface pressure-sensitive sensors for humans or animals, such as sensors that detect bending, twisting or stretching of joint sections. When used for a human, for example, it may be used as an interface for detection of contact or movement and collection of data regarding movement of a joint being used for medical purposes, or for amusement, or for movement of lost tissue or a robot. In addition, it may be used as a surface pressure-sensitive sensor in a stuffed doll simulating an animal or human form, or a robot, or as a sensor for sensing of bending, twisting or stretching of joints. It may still further be used as a surface pressure-sensitive sensor or shape deformation sensor in beddings such as sheets or pillows, shoe soles, gloves, chairs, mats, bags, flags or the like.

In addition, since the sensor of the invention is in fabric form, and therefore is elastic and flexible, it may be used as a surface pressure-sensitive sensor or shape deformation sensor by attachment or covering on the surface of all or portions of various structures.

Figure 27:
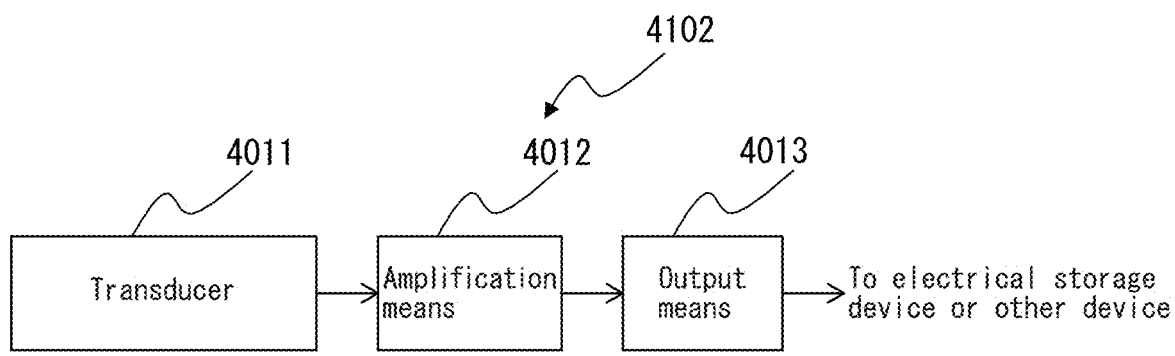
FIG. 27 is a block diagram showing a second concrete example of a device employing a transducer according to the fourth invention.

Furthermore, since the transducer of the invention can extract an electrical signal as output (electric power), the electrical signal (electric power) may be used as a power generating element, to serve as an electric power source to drive another device, or for storage. FIG. 27 is a block diagram showing a second concrete example of a device employing a transducer according to the invention. For example, a device 4102 is constructed comprising a transducer 4011 of the invention (e.g.: layer A and layer B), amplification means 4012 that amplifies an electrical signal outputted from the transducer 4011 in response to applied pressure, and output means 4013 that outputs the electrical signal that has been amplified by the amplification means 4012. While not shown in particular here, a lead wire from the conductive fiber of the transducer 4011 is connected to an input terminal of the amplification means 4012 and the piezoelectric fibers of the transducer 4011 are connected to a ground (earth) terminal. The amplification means 4012 and output means 4013 are separately provided for the transducer 4011 of layer A and the transducer 4011 of layer B. This allows an electrical signal outputted from the output means 4013 by contact, pressure or shape deformation on the surface of the transducer 4011 of each of layer A and layer B, to be used as an electric power source for driving of another device, or to be stored in an electrical storage device.

Instead of the amplification means alone, it may also be used in combination with publicly known signal processing means, such as noise (ripple)-canceling means or means for combined processing with other signals. The order of connection of such means may be modified as appropriate depending on the purpose. Naturally, the electrical signal outputted from the transducer 4011 may be subjected to signal processing for noise (ripple)-canceling after being directly transmitted to an external device.

Specific examples of this include electric power generation by use at movable parts that autonomously move, such as those of a human, animal, robot or machine, electric power generation on the surface of a structure subjected to pressure from a shoe sole, mat or exterior, and electric power generation by shape deformation in a fluid. For generation of an electrical signal by shape deformation in a fluid, an electrostatic substance in a fluid may be adsorbed, or its adhesion inhibited.

Figure 28:
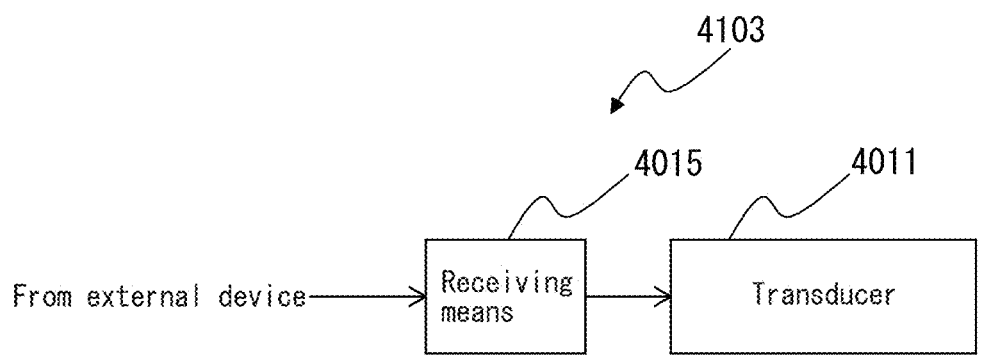
FIG. 28 is a block diagram showing a third concrete example of a device employing a transducer according to the fourth invention.

On the other hand, the transducer of the invention may generate mechanical force by input of the electrical signal, regardless of its form. FIG. 28 is a block diagram showing a third concrete example of a device employing a transducer according to the invention. For example, a device 4103 is constructed comprising receiving means 4015 that receives an electrical signal from an external device (not shown), and a transducer 4011 of the invention (e.g.: layer A and layer B) to which the electrical signal received by the receiving means 4015 is applied. The receiving means 4015 is separately provided for the transducer 4011 of layer A and the transducer 4011 of layer B. This allows force corresponding to the electrical signal inputted through the receiving means 4015 of each of layer A and layer B, to be generated for the transducer 4011 of layer A and the transducer 4011 of layer B, respectively. Incidentally, whether the receiving system of the receiving means 4015 is wireless or wired may be appropriately decided depending on the purpose and environment in which the transducer is to be used. When the receiving system of the receiving means 4015 is wired, receiving means 5015 may be implemented with various types of connectors, for example.

As a specific example of an application in which an electrical signal is inputted, an electrical signal may be applied to a fabric-like piezoelectric element, to move an object set on the fabric surface, or to wrap, compress or vibrate the object. The electrical signal applied to different piezoelectric elements forming the fabric may also be controlled to express different shapes. The fabric itself may even be vibrated to function as a speaker.

Other examples include an actuator in the form of clothing such as a cap, glove or socks, or a supporter handkerchief or the like, that applies pressure to the surface of a human, animal or object, and an actuator that supports bending, twisting or stretch of joints. When used for a human, for example, it may be used to cause contact or movement, or apply pressure for the purpose of amusement, or to move lost tissue. In addition, it may be used as an actuator to cause bulging or stretching of the surface of a stuffed doll simulating an animal or human form, or a robot, or as an actuator that produces movement such as bending, twisting or stretching in a joint. It may also be used as an actuator that moves the surface of bedding such as a sheet or pillow, a shoe sole, glove, chair, mat, bag or flag, or it may be used as an actuator in various fabric forms such as a handkerchief, cloth wrapper or bag, that deforms in shape by an electrical signal.

In addition, since the actuator of the invention is in fabric form, and therefore is elastic and flexible, it may be used as an actuator that varies in surface form by attachment or covering on the surface of all or portions of various structures.

Incidentally, since the transducer of the invention can move with an electrical signal as input, it can be used as a speaker that generates sound by oscillation.

The fifth invention will now be explained in detail.

The fifth object of the invention is achieved by a layered transducer comprising at least two sheets or fabrics, at least one of the sheets or fabrics comprising the following layer A, and at least one of the layers other than layer A comprising the following layer B.

Layer A: A transducer that outputs or inputs an electrical signal, including a piezoelectric unit wherein a conductive fiber and a piezoelectric fiber are arranged on approximately the same plane so as to provide electrical connection.

Layer B: A conductive sheet or conductive fabric having a sheet resistance of no greater than $10^4$ Ω/sq.

Each of the structural aspects will now be explained.

(Layer A)

Layer A is a flat transducer that outputs or inputs an electrical signal, including a piezoelectric unit wherein conductive fibers and piezoelectric fibers are arranged on approximately the same plane so as to provide electrical connection.

(Conductive Fiber)

The conductive fiber may be of any type that exhibits conductivity and any publicly known type may be used, examples of which include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber winding. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity.

The base fiber that has been coated with a metal may be a publicly known fiber, regardless of the presence or absence of conductivity, examples of which include polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these and any publicly known fiber may be used, or combinations of these fibers may be used.

The metal to be coated onto the base fiber may be any type that exhibits conductivity and exhibits the effect of the invention.

Examples to be used include gold, silver, platinum, copper, nickel, tin, zinc, palladium, indium tin oxide, copper sulfide and the like, as well as their mixtures and alloys.

The conductive fiber used may be a multifilament consisting of a bundle of multiple filaments, or a monofilament consisting of a single filament. Using multifilaments is preferred from the viewpoint of the long-term stability of the electrical characteristics. The diameter of a monofilament is 1 μm to 5000 μm, and preferably 2 μm to 100 μm. It is more preferably 3 μm to 50 μm. The number of filaments is preferably from 1 to 100,000, more preferably 5 to 500 and even more preferably 10 to 100. If the diameter is small the strength will be reduced and handling may become difficult, while if the diameter is large there may be some sacrifice of flexibility. The cross-sectional shape of the conductive fiber is preferably circular or elliptical from the viewpoint of design and production of the piezoelectric element, but this is not limitative.

Moreover, a lower electrical resistance is preferred for efficient extraction of electrical output from the piezoelectric polymer, the volume resistivity being preferably no greater than $10^{-1}$ Ω·cm, more preferably no greater than $10^{-2}$ Ω·cm and even more preferably no greater than $10^{-3}$ Ω·cm. However, the resistivity of the conductive fiber is not limited thereto so long as strong signal detection can be obtained.
(Piezoelectric Fibers)

The piezoelectric fibers are fibers with a piezoelectric property. The piezoelectric fibers are preferably made of a piezoelectric polymer. The piezoelectric polymer used may be a polymer that exhibits piezoelectricity, such as polyvinylidene fluoride or polylactic acid, but it is preferably one including mainly polylactic acid. Polylactic acid is readily oriented and exhibits piezoelectricity by stretching after melt spinning, and has excellent productivity since it does not require electric field orientation treatment as is necessary with polyvinylidene fluoride and the like. A piezoelectric fiber composed of polylactic acid has low polarization with tension and compression stress in the axial direction and thus has poor function as a piezoelectric element, whereas it produces relatively large electrical output under shearing stress, which is preferable for a piezoelectric element of the invention having a construction in which shearing stress tends to be applied to the piezoelectric polymer.

The piezoelectric polymer preferably includes mainly polylactic acid. The term "mainly" means preferably 90 mol % or greater, more preferably 95 mol % or greater and even more preferably 98 mol % or greater.

Polylactic acid includes poly-L-lactic acid obtained by polymerization of L-lactic acid and L-lactide, poly-D-lactic acid obtained by polymerization of D-lactic acid and D-lactide, and stereocomplex polylactic acid comprising a hybrid structure of these, depending on the crystal structure, and any of these may be used so long as they exhibit piezoelectricity. Poly-L-lactic acid and poly-D-lactic acid are preferred from the viewpoint of a high piezoelectric modulus. Since poly-L-lactic acid and poly-D-lactic acid exhibit opposite polarization against the same stress, they may be used in combination according to the purpose. The optical purity of the polylactic acid is preferably 99% or greater, more preferably 99.3% or greater and even more preferably 99.5% or greater. If the optical purity is less than 99% the piezoelectric modulus may be significantly lowered, potentially making it difficult to obtain sufficient electrical output by shape deformation of the piezoelectric fibers. The piezoelectric polymer includes mainly poly-L-lactic acid or poly-D-lactic acid, preferably with an optical purity of 99% or greater.

The piezoelectric fibers are preferably uniaxially oriented in the fiber axis direction of the fiber and include crystals, and more preferably they are uniaxially oriented polylactic acid with crystals. This is because polylactic acid exhibits high piezoelectricity in a crystalline state and when uniaxially oriented.

Since polylactic acid is a polyester with relatively rapid hydrolysis, a publicly known hydrolysis preventer such as an isocyanate compound, oxazoline compound, epoxy compound or carbodiimide compound may be added when resistance to moist heat is an issue. Also, if necessary, an antioxidant, plasticizer, photodegradation inhibitor or the like such as a phosphoric acid-based compound may be added to modify the physical properties.

Moreover, polylactic acid may be used as an alloy with another polymer, in which case if polylactic acid is to be used as the main piezoelectric polymer, the amount of the polylactic acid is preferably at least 50 wt % or greater, more preferably 70 wt % or greater and most preferably 90 wt % or greater, based on the total weight of the alloy.

In the case of an alloy, suitable examples of polymers other than polylactic acid include polybutylene terephthalate, polyethylene terephthalate, polyethylene naphthalate copolymer and polymethacrylate, with no limitation to these, and any polymer may be used so long as the piezoelectricity that is the object of the invention is exhibited.

The piezoelectric fibers used may be multifilaments consisting of bundles of multiple filaments, or monofilaments consisting of single filaments. Using multifilaments is preferred from the viewpoint of the long-term stability of the electrical characteristics. The diameter of a monofilament is 1 μm to 5000 μm, and preferably 2 μm to 100 μm. It is more preferably 3 μm to 50 μm. The number of filaments is preferably from 1 to 100,000, more preferably 5 to 500 and even more preferably 10 to 100.

In order to obtain a piezoelectric fiber from the piezoelectric polymer, any publicly known method for forming a fiber from a polymer may be employed so long as the effect of the invention can be exhibited, such as a method of forming a fiber by extrusion molding of a piezoelectric polymer, a method of forming a fiber by melt spinning of a piezoelectric polymer, a method of forming a fiber by dry or wet spinning of a piezoelectric polymer, or a method of forming a fiber by electrostatic spinning of a piezoelectric polymer. The spinning conditions employed may be according to a publicly known process suitable for the piezoelectric polymer used, and for most cases a melt spinning process may be employed, which facilitates industrial production.

As mentioned above, when the piezoelectric polymer is polylactic acid, it will exhibit greater piezoelectricity if oriented by uniaxial stretching and if it contains crystals, and therefore the fiber is preferably stretched.
(On Approximately the Same Plane)

In the piezoelectric element of the invention, the conductive fiber and the piezoelectric fibers are arranged on approximately the same plane. Here, "on approximately the same plane" means that the fiber axes are situated approximately on a plane, where "approximately" includes any areas of thickness produced at the crossing points between the fibers.

For example, the form in which one piezoelectric fiber is aligned parallel between two parallel conductive fibers is a form that is on approximately the same plane. Even if the fiber axis of the one piezoelectric fiber is inclined in a state that is not parallel to the two parallel conductive fibers, it is still on approximately the same plane. Also, even if one conductive fiber and one piezoelectric fiber are aligned parallel while another conductive fiber is crossing with the aligned conductive fiber and piezoelectric fiber, it is still on approximately the same plane.

By being arranged on approximately a plane, the piezoelectric units can be easily combined to form a fabric-like piezoelectric element, and utilizing the piezoelectric element in the form of a fabric can increase the freedom of shape design for the transducer. Woven fabrics, knitted fabrics and nonwoven fabrics are examples of types of fabric.

The relationship between the piezoelectric fibers and conductive fibers is selected as appropriate depending on the shape deformation that is to be detected.

(Order of Arrangement)

The arrangement of the fibers in the piezoelectric unit is not particularly restricted so long as the conductive fibers and piezoelectric fibers are arranged so as to provide electrical connection. For example, when the piezoelectric unit comprises two conductive fibers and one piezoelectric fiber, the arrangement is preferably in the order: conductive fiber, piezoelectric fiber, conductive fiber. Such an arrangement will eliminate contact between the two conductive fibers of the piezoelectric unit, allowing effective functioning as a piezoelectric unit without applying other means to the conductive fiber, such as covering with an insulating material.

It is preferred to have contact points where the conductive fibers and piezoelectric fibers are mutually in physical contact, but electrical connection can be provided even without physical contact so long as the spacing between the conductive fibers and piezoelectric fibers is in a range of no greater than 4 mm. The spacing between the conductive fibers and piezoelectric fibers is preferably no greater than 3 mm, more preferably no greater than 2 mm, even more preferably no greater than 1 mm and most preferably no greater than 0.5 mm. If the spacing is greater than 4 mm, the electrical output may be lower with shape deformation of the piezoelectric fibers, and use as a transducer may become difficult.

The form may be, for example, one in which two conductive fibers are arranged in parallel and one piezoelectric fiber is situated so as to intersect the two conductive fibers. Alternatively, two conductive fibers may be arranged as warp thread (or weft thread), and one piezoelectric fiber arranged as weft thread (or warp thread). In this case, the two conductive fibers are preferably not in contact with each other, and there may be employed a form in which preferably an insulating material, such as insulating fiber, is situated between the two conductive fibers, or a form in which the insulating material covers only the surfaces where the conductive fibers tend to contact, while the conductive fiber directly contacts with the piezoelectric fibers.

(Insulating Fiber)

The piezoelectric unit of the invention includes insulating fibers, and the insulating fibers will sometimes be situated between the conductive fibers and piezoelectric fibers in such a manner that the conductive fibers in the piezoelectric unit do not contact the other conductive fibers or the piezoelectric fibers. In this case, the insulating fibers used may be fibers of a material and shape that are stretchable, in order to improve the flexibility of the fabric. In addition, the conductive fibers in the piezoelectric unit will sometimes be situated in such a manner as not to contact with the other conductive fibers and piezoelectric fibers in the piezoelectric unit.

By situating the insulating fibers in the piezoelectric unit in this manner, there will be no contact of the conductive fibers even when several piezoelectric units have been combined, and the performance as a transducer can be improved.

Such insulating fibers that are used need only have a volume resistivity of $10^6$ Ω·cm or greater, or more preferably $10^8$ Ω·cm or greater and even more preferably $10^{10}$ Ω·cm or greater.

Examples of insulating fibers to be used include polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. There is no restriction to these, however, and any publicly known insulating fibers may be used as desired. These insulating fibers may also be used in combination, or combined with fibers having no insulating property to form fibers with an overall insulating property.

The insulating fibers used may be a multifilament consisting of a bundle of multiple filaments, or a monofilament consisting of a single filament. Using multifilaments is preferred from the viewpoint of the long-term stability of the insulating property. When used as a monofilament the filament diameter is 1 μm to 5000 μm, and preferably 50 μm to 1000 μm. When used as a multifilament the monofilament diameter is 0.1 μm to 5000 μm, and preferably 2 μm to 100 μm. It is more preferably 3 μm to 50 μm. The number of filaments for a multifilament is preferably from 1 to 100,000, more preferably 5 to 500 and even more preferably 10 to 100.

Moreover, fibers of various publicly known shapes may be used, for the purpose of imparting flexibility to the fabric.

(Combined Forms of Piezoelectric Units)

According to the invention, a woven or knitted fabric containing a plurality of piezoelectric units aligned in parallel is preferred. Such a form will allow the freedom of shape deformation (flexibility) of the piezoelectric element to be increased.

Such a woven or knitted fabric form includes multiple piezoelectric units, with no limitations so long as it can exhibit a function as a piezoelectric element. Knitting or weaving using a common loom or knitting machine may be carried out to obtain a woven fabric or knitted fabric form. When multiple piezoelectric units are to be introduced into a single fabric, it may be fabricated in a continuous manner during weaving or knitting, or it may be fabricated by joining together separately prepared fabrics.

Examples for the woven texture of the woven fabric include three foundation weaves such as plain weave, twill weave or satin weave, half-double weaves such as derivative weave, warp backed weave and weft backed weave, and warp velvet weaves.

The type of knitted fabric may be a circular knit fabric (weft knitted fabric) or a warp knitted fabric. Examples of preferred textures of circular knit fabrics (weft knitted fabrics) include plain stitch, rib stitch, interlock stitch, purl stitch, tuck stitch, float stitch, rib-and-tuck stitch, lace stitch and plating stitch. Examples of warp braid stitches include single denbigh stitch, single atlas stitch, double cord stitch, half-tricot stitch, lined stitch and jacquard stitch. It may consist of a single layer, or a multilayer with two or more layers. Alternatively, it may be a plush weave or plush stitch, composed of nap sections and ground weave sections comprising cut piles and/or loop piles.

Incidentally, when the piezoelectric units are present by being incorporated into a woven texture or knitted texture, bent sections will be present in the piezoelectric fibers themselves, but smaller bent sections of the piezoelectric fibers are preferred in order to cause piezoelectric performance as a piezoelectric element to be more efficiently exhibited. Among woven fabrics and knitted fabrics, therefore, woven fabrics are preferred.

In this case as well, since smaller bent sections of the piezoelectric fibers will result in piezoelectric performance being more efficiently exhibited, as mentioned above, a twill weave is preferred over a plain weave as the woven texture, and a satin weave is preferred over a twill weave. Among satin weaves in particular, a step number in the range of 3 to 7 is preferred because a high level of woven texture retention and piezoelectric performance will be exhibited.

The woven texture may be appropriately selected depending on the shape deformation that is to be detected. For example, when bending is to be detected, it is preferably a plain weave structure with the piezoelectric fibers and conductive fibers in a parallel relationship, and when twisting is to be detected, it is preferably a satin weave structure with the piezoelectric fibers and conductive fibers in an orthogonal relationship.

Because the polylactic acid of the piezoelectric fiber is susceptible to electrostatic charge, it may tend to exhibit malfunctioning. In such cases, the piezoelectric fibers that are to extract signals may be grounded (earthed) for use. The method of grounding (earthing) is preferably placement of a conductive fiber separately from the signal-extracting conductive fiber. In this case, the volume resistivity of the conductive fiber is preferably no greater than $10^{-1}$ Ω·cm, more preferably no greater than $10^{-2}$ Ω·cm and even more preferably no greater than $10^{-3}$ Ω·cm.

(Multiple Piezoelectric Elements)

Multiple piezoelectric elements may also be used in arrangement. The manner of arrangement may be on one level in one dimension, or overlaid in two dimensions, or their use by weaving into a fabric, or formation in a braided manner. A fabric-like or braided piezoelectric element can also be realized in this manner. For a fabric or braided form, blending, union weaving or mixed knitting in combination with fibers other than those of the piezoelectric element, or incorporation into a resin or the like, may be carried out so long as the object of the invention is achieved.

(Layer B)

Layer B is an insulating sheet or insulating fabric having the function of reducing the effects of electrical disturbance on the transducer serving as layer A, and the sheet resistance must be no greater than $10^4$ Ω/sq., preferably no greater than $10^2$ Ω/sq., even more preferably no greater than 10 Ω/sq. and most preferably greater than 1 Ω/sq. If it is greater than $10^4$ Ω/sq., unwanted signals may be outputted when the element is in direct contact with the human body or in contact with a charged object, for example. The conductive sheet or conductive fabric is preferably a fabric from the viewpoint of flexibility, but so long as it is flexible it may also be a sheet or film. The material forming the conductive sheet or conductive fabric is not particularly restricted so long as it is conductive, and any publicly known material may be employed. The method of imparting conductivity may be using conductive fibers, or layering or coating a conductive substance onto the sheet or fabric.

(Layering)

There are no particular restrictions on the method of layering of layer A and layer B according to the invention, and it may be carried out by a method known in the prior art, such as stitch, pressure-sensitive adhesion, bonding or thermocompression bonding. However, preferably layer C is used between layer A and layer B so that short circuiting does not occur between the conductive fibers in layer A and the conductive sections of layer B. Covering the surface of layer A with an insulating substance is also effective as a method of preventing short circuiting. Furthermore, the number of layers may be any number in a range that does not interfere with the object of the invention. However, when several layers of layer A are provided, preferably layer C is used between every two of the layers A so that short circuiting does not occur between the conductive fibers in one layer A and the conductive fibers of another layer A. When several layers A are used, the texture of each layer A does not need to be the same, and the texture and angle of attachment may be appropriately varied according to the purpose and the intended use. Layers other than layer A and layer B may also be provided within ranges that do not interfere with the object of the invention. Examples include a layer with an insulating property, a layer having another sensing function, a layer having durability such as abrasion resistance, and a layer for anchoring to an object, such as a pressure-sensitive adhesive layer or adhesive layer.

(Layer C)

Layer C is an insulating sheet or insulating fabric having the function of preventing short circuiting between the transducer of layer A, and layer B, and the sheet resistance must be $10^6$ Ω/sq. or greater, preferably $10^8$ Ω/sq. or greater, even more preferably $10^{10}$ Ω/sq. or greater and most preferably $10^{12}$ Ω/sq. or greater. If it is less than $10^6$ Ω/sq., short circuiting may occur between the conductive fibers of layer A, and layer B, and the electrostatic capacity may vary, potentially resulting in output of unwanted signals. The insulating sheet or insulating fabric is preferably a fabric from the viewpoint of flexibility, but so long as it is flexible it may also be a sheet or film. The material forming the insulating sheet or insulating fabric is not particularly restricted so long as it has an insulating property, and any publicly known material may be employed.

(Technology for Use of Piezoelectric Element)

Figure 30:
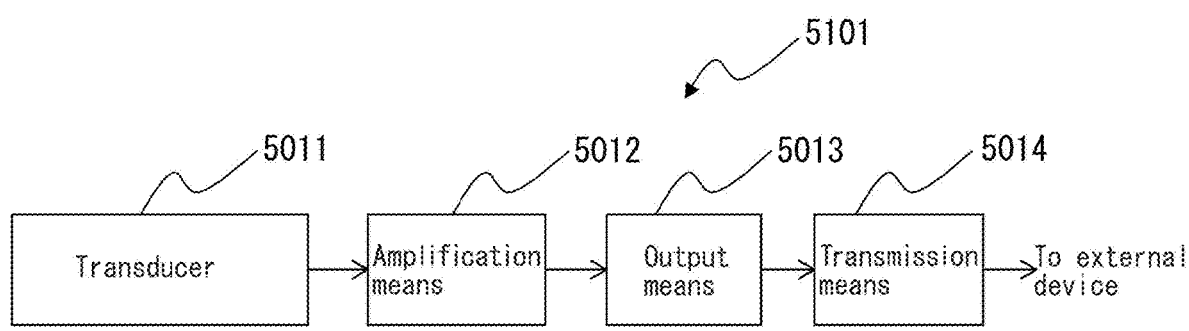
FIG. 30 is a block diagram showing a first concrete example of a device employing a transducer according to the fifth invention.

The transducer of the invention, in any of its forms, can output surface contact, pressure or shape deformation as an electrical signal. FIG. 30 is a block diagram showing a first concrete example of a device employing a transducer according to the invention. For example, a device 5101 is constructed comprising a transducer 5011 of the invention, amplification means 5012 that amplifies an electrical signal outputted from the transducer 5011 in response to applied pressure, output means 5013 that outputs the electrical signal amplified at the amplification means 5012, and transmission means 5014 that transmits the electrical signal outputted from the output means 5013 to an external device (not shown). While not shown in particular here, a lead wire from the conductive fiber of the transducer 5011 is connected to an input terminal of the amplification means 5012 and the piezoelectric fibers of the transducer 5011 are connected to a ground (earth) terminal. This allows easy extraction of electrical signals outputted by contact, pressure or shape deformation on the surface of the transducer 5011, so that the device can be applied for various purposes. For example, it is possible to detect the amount and/or applied location of stress applied to the transducer 5011, by computation processing at an external device (not shown), based on an electrical signal outputted by contact, pressure or shape deformation on the surface of the transducer 5011. Alternatively, computing means (not shown) may be provided in the transducer 5011, that computes the amount and/or applied location of stress applied to the piezoelectric element 5011, based on the electrical signal outputted from the output means 5013.

The amplification means 5012 may be constructed of different electronic circuits, for example, or it may be constructed as a functional module implemented by a software program that operates on a processor, or it may be constructed of a combination of different electronic circuits and a software program. Examples of processors include a CPU (Central Processing Unit), DSP (Digital Signal Processor), LSI (Large Scale Integration), ASIC (Application Specific Integrated Circuit) and FPGA (Field-Programming Gate Array). The output means 5013 may also be constructed solely of different connectors, for example, or it may be constructed as a communication device integrated with the transmission means 5014. Alternatively, the functions of the amplification means 5012, output means 5013 and transmission means 5014 may be combined in the form of an integrated circuit or microprocessor in which a software program is written. Incidentally, the transmission system using transmission means 5014 may be either wireless or wired, determined as appropriate depending on the device to which it is to be applied.

Instead of the amplification means alone, it may also be used in combination with publicly known signal processing means, such as noise-canceling means or means for combined processing with other signals. The order of connection of such means may be modified as appropriate depending on the purpose. Naturally, the electrical signal outputted from the transducer 5011 may be subjected to signal processing after being directly transmitted to an external device.

Specific examples may be clothing that includes caps, gloves and socks, touch panels in the form of supporters or handkerchiefs, and surface pressure-sensitive sensors for humans or animals, such as sensors that detect bending, twisting or stretching of joint sections. When used for a human, for example, it may be used as an interface for detection of contact or movement and collection of data regarding movement of a joint being used for medical purposes, or for amusement, or for movement of lost tissue or a robot. In addition, it may be used as a surface pressure-sensitive sensor in a stuffed doll simulating an animal or human form, or a robot, or as a sensor for sensing of bending, twisting or stretching of joints. It may still further be used as a surface pressure-sensitive sensor or shape deformation sensor in beddings such as sheets or pillows, shoe soles, gloves, chairs, mats, bags, flags or the like.

In addition, since the sensor of the invention is in fabric form, and therefore is elastic and flexible, it may be used as a surface pressure-sensitive sensor or shape deformation sensor by attachment or covering on the surface of all or portions of various structures.

Figure 31:
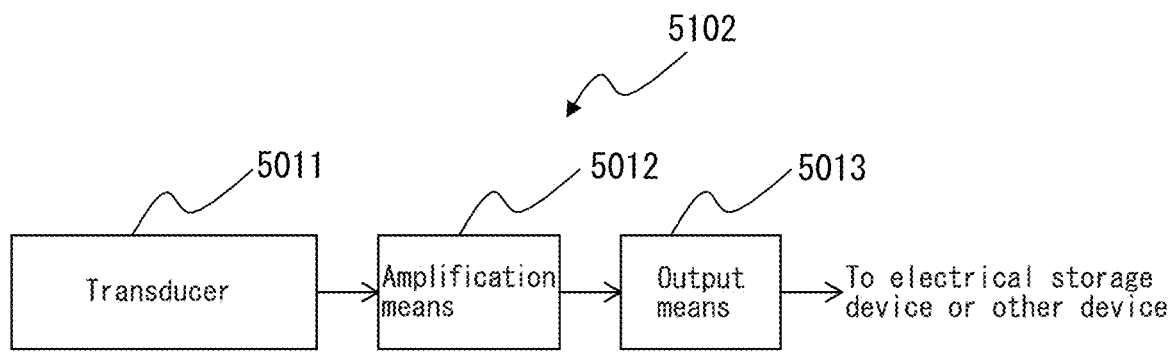
FIG. 31 is a block diagram showing a second concrete example of a device employing a transducer according to the fifth invention.

Furthermore, since the transducer of the invention can extract an electrical signal as output (electric power), the electrical signal (electric power) may be used as a power generating element, to serve as an electric power source to drive another device, or for storage. FIG. 31 is a block diagram showing a second concrete example of a device employing a transducer according to the invention. For example, a device 5102 is constructed comprising a transducer 5011 of the invention, amplification means 5012 that amplifies an electrical signal outputted from the transducer 5011 in response to applied pressure, and output means 5013 that outputs the electrical signal that has been amplified by the amplification means 5012. While not shown in particular here, a lead wire from the conductive fiber of the transducer 5011 is connected to an input terminal of the amplification means 5012 and the piezoelectric fibers of the transducer 5011 are connected to a ground (earth) terminal. This allows an electrical signal outputted from the output means 5013 by contact, pressure or shape deformation on the surface of the transducer 5011, to be used as an electric power source for driving of another device, or to be stored in an electrical storage device.

Instead of the amplification means alone, it may also be used in combination with publicly known signal processing means, such as noise (ripple)-canceling means or means for combined processing with other signals. The order of connection of such means may be modified as appropriate depending on the purpose. Naturally, the electrical signal outputted from the transducer 5011 may be subjected to signal processing for noise (ripple)-canceling after being directly transmitted to an external device.

Specific examples of this include electric power generation by use at movable parts that autonomously move, such as those of a human, animal, robot or machine, electric power generation on the surface of a structure subjected to pressure from a shoe sole, mat or exterior, and electric power generation by shape deformation in a fluid. For generation of an electrical signal by shape deformation in a fluid, an electrostatic substance in a fluid may be adsorbed, or its adhesion inhibited.

Figure 32:
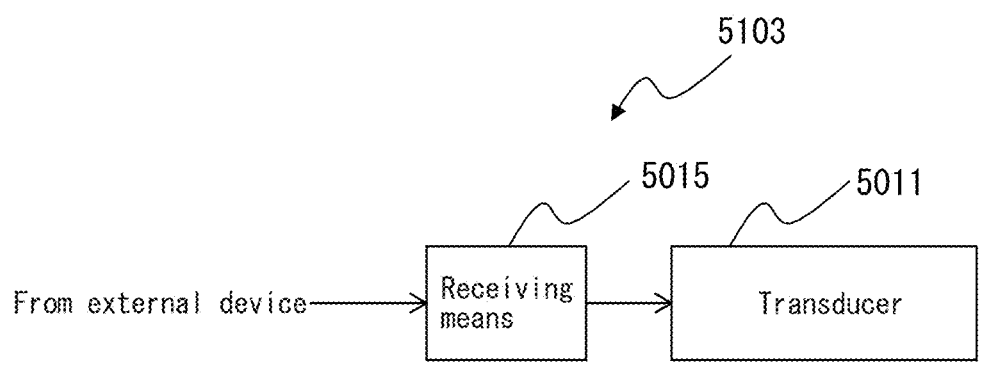
FIG. 32 is a block diagram showing a third concrete example of a device employing a transducer according to the fifth invention.

On the other hand, the transducer of the invention may generate mechanical force by input of an electrical signal, regardless of its form. FIG. 32 is a block diagram showing a third concrete example of a device employing a transducer according to the invention. For example, a device 5103 is constructed comprising receiving means 5015 that receives an electrical signal from an external device (not shown), and a transducer 5011 of the invention to which the electrical signal received by the receiving means 5015 is applied. This allows force corresponding to the electrical signal inputted through the receiving means 5015 to be generated in the transducer 5011. Incidentally, whether the receiving system of the receiving means 5015 is wireless or wired may be appropriately decided on depending on the purpose and environment in which the transducer is to be used. When the receiving system of the receiving means 5015 is wired, the receiving means 5015 may be implemented with various types of connectors, for example.

As a specific example of an application in which an electrical signal is inputted, an electrical signal may be applied to a fabric-like piezoelectric element, to move an object set on the fabric surface, or to wrap, compress or vibrate the object. The electrical signal applied to different piezoelectric elements forming the fabric may also be controlled to express different shapes. The fabric itself may even be vibrated to function as a speaker.

Other examples include an actuator in the form of clothing such as a cap, glove or socks, or a supporter handkerchief or the like, that applies pressure to the surface of a human, animal or object, and an actuator that supports bending, twisting or stretch of joints. When used for a human, for example, it may be used to cause contact or movement, or apply pressure for the purpose of amusement, or to move lost tissue. In addition, it may be used as an actuator to cause bulging or stretching of the surface of a stuffed doll simulating an animal or human form, or a robot, or as an actuator that produces movement such as bending, twisting or stretching in a joint. It may also be used as an actuator that moves the surface of bedding such as a sheet or pillow, a shoe sole, glove, chair, mat, bag or flag, or it may be used as an actuator in various fabric forms such as a handkerchief, cloth wrapper or bag, that deforms in shape by an electrical signal.

In addition, since the actuator of the invention is in fabric form, and therefore is elastic and flexible, it may be used as an actuator that varies in surface form by attachment or covering on the surface of all or portions of various structures.

As another mode of the invention, an electrical signal-outputting transducer is provided that includes piezoelectric units arranged on approximately the same plane so that the conductive fibers and piezoelectric fibers provide electrical connection, and all or some of the locations of the conductive fibers and piezoelectric fibers are in a twill weave structure, the angles of the twills in at least a portion of the twill weave structure being between 30 degrees and 60 degrees, inclusive, with respect to the fiber axis direction of the piezoelectric fibers, whereby a fabric-like transducer can be obtained that has high flexibility and generates a stronger electrical signal. The transducer of this mode is flexible, and it is therefore possible to obtain a transducer whose input/output are electrical signals in different forms allowing foldable fabric forms, such as a handkerchief, or wearable fabric forms to be obtained.

More specifically, the transducer of this mode is a woven fabric containing multiple piezoelectric units, all or some of which must be in a twill weave structure. Since a twill weave structure presents a diagonal weave due to the woven structure, it is also known as a "diagonal weave". A twill weave tends to bend in the diagonal direction, allowing deformation of the fabric to be obtained relatively easily. The angle of the diagonal must be between 30 degrees and 60 degrees, inclusive, with respect to the fiber axis direction of the piezoelectric fibers. When the piezoelectric fiber has been deformed, polarization is produced in the direction 45 degrees with respect to the fiber axis, and a diagonal closer to 45 degrees with respect to the fiber axis will increase the piezoelectric signal generated in response to deformation of the fabric. Therefore, the fabric of the invention must include in at least a portion thereof a twill weave structure wherein the diagonal angle is between 30 degrees and 60 degrees, inclusive, with respect to the fiber axis direction of the piezoelectric fibers. The angle of the diagonal may be between 30 degrees and 60 degrees, inclusive, but is preferably between 35 degrees and 55 degrees, inclusive and more preferably between 40 degrees and 50 degrees, inclusive, with respect to the fiber axis direction of the piezoelectric fibers. The twill weave structure may be any desired structure so long as it satisfies the diagonal angle mentioned above, and examples of preferred structures include a triple twill 2/1 texture and a quadruple twill 3/1 texture or 2/2 texture. Such a transducer is also preferably a woven or knitted fabric containing a plurality of piezoelectric units in parallel. Such a form will allow the freedom of shape deformation (flexibility) of the piezoelectric element to be increased.

Such a woven or knitted fabric form includes multiple piezoelectric units, with no limitations so long as it can exhibit function as a piezoelectric element. A woven fabric or knitted fabric form can be obtained by weaving using a common loom. When multiple piezoelectric units are to be introduced into a single fabric, it may be fabricated in a continuous manner during weaving or knitting, or it may be fabricated by joining together separately prepared fabrics. The fabric of this mode may have any desired woven texture so long as it at least partially includes a twill weave structure, and examples include the three foundational types of weaves: plain weave, twill weave and satin weave, half double weaves such as derivative weave, warp backed weave and weft backed weave, and warp velvet weaves.

As another mode of the invention, there is provided a transducer that includes a piezoelectric unit with conductive fibers, insulating fibers and piezoelectric fibers having contact points of mutual physical contact and arranged on approximately the same plane, wherein at least some of the piezoelectric fibers composing the piezoelectric unit are orthogonal to the conductive fibers and crossing with other fibers across an interval of 4 or more threads, whereby a fabric-like transducer can be obtained that has excellent flexibility and generates a stronger electrical signal. The transducer of this mode is flexible, and it is therefore possible to obtain a transducer whose input/output are electrical signals in different forms allowing foldable fabric forms, such as a handkerchief, or wearable fabric forms to be obtained.

More specifically, the transducer of this mode must have contact points where the conductive fibers, insulating fibers and piezoelectric fibers situated on approximately the same plane are in mutual physical contact, while having the following woven structure.

1. At least some of the piezoelectric fibers are crossing (orthogonal) in the direction perpendicular to the conductive fibers.
2. The piezoelectric fibers are crossing with other fibers at an interval of 4 or more threads.

Particularly when twisting movement is to be detected, the piezoelectric fibers preferably form a "floating", or non-constrained state. That is, it has been found that when piezoelectric fibers are used as warp threads, it is better to have fewer crossing points with the weft threads to create a looser structure. The crossing points must be such that the weft threads cross while skipping at an interval of 4 or more threads. The term "an interval of 4 or more threads" means that 4 or more weft threads are inserted in between. The 4 or more fibers may be any fibers. When piezoelectric fibers are used as the weft threads, as well, it is likewise necessary to cross with the warp threads at an interval of 4 or more threads.

It has also been found that in order to efficiently detect electrical signals from the piezoelectric fibers in such a structure, it is most preferred for the fibers crossing at an interval of 4 or more threads of the piezoelectric fibers to be conductive fibers. Thus, the piezoelectric fibers must be situated orthogonally to the conductive fibers. This structure is preferred for detection of twisting movement. While any other desired structure may be adopted, preferably all of the conductive fibers are situated in the same direction so that contact between the conductive fibers is avoided. There may also be employed a form in which preferably an insulating material, such as insulating fibers, is situated between the two conductive fibers and the piezoelectric fibers, or a form in which the insulating material covers only the surfaces where the conductive fibers tend to contact, while the conductive fiber directly contacts with the piezoelectric fibers. A woven fabric or knitted fabric form can be obtained by weaving using a common loom. When multiple piezoelectric units are to be introduced into a single fabric, it may be fabricated in a continuous manner during weaving or knitting, or it may be fabricated by joining together separately prepared fabrics. The fabric of this mode may have any desired woven texture so long as it at least partially includes the aforementioned woven structure, and examples include the three foundational types of weaves: plain weave, twill weave and satin weave, half double weaves such as derivative weave, warp backed weave and weft backed weave, and warp velvet weaves.

As another mode of the invention, there is provided a transducer that includes piezoelectric units arranged on approximately the same plane so that the conductive fibers and piezoelectric fibers provide electrical connection, the piezoelectric fibers including mainly polylactic acid, and the homo PLA crystallinity $X_{homo}$ (%) and crystal orientation A (%) satisfying the following inequality (1):

$$X_{homo} \times A \times A \div 10^6 \geq 0.26 \tag{1}$$

as quantified by wide-angle X-ray diffraction (WAXD), whereby it is possible to obtain a fabric-like transducer with excellent flexibility, that generates a stronger electrical signal in response to motion in a specific direction. The transducer of this mode is flexible, and it is therefore possible to obtain a transducer whose input/output are electrical signals in different forms allowing foldable fabric forms, such as a handkerchief, or wearable fabric forms to be obtained. Moreover, it is possible to obtain a device utilizing signals from the transducer, and/or a device that functions by input of electrical signals. The details regarding the homo PLA crystallinity $X_{homo}$(%) and crystal orientation A (%) are as explained above.

As another mode of the invention, there is provided a transducer that outputs or inputs an electrical signal, comprising a woven or knitted fabric including multiple piezoelectric units arranged on approximately the same plane so that the conductive fibers and piezoelectric fibers provide electrical connection, wherein the piezoelectric fibers have intersections crossing with any fibers other than the piezoelectric fibers or piezoelectric fibers, and the piezoelectric fibers and the other fibers crossing with the piezoelectric fibers are bonded in at least some of the intersections, whereby it is possible to obtain a fabric-like transducer with excellent flexibility. The transducer of this mode is flexible, and it is therefore possible to obtain a transducer whose input/output are electrical signals in different forms allowing foldable fabric forms, such as a handkerchief, or wearable fabric forms to be obtained.

More specifically, the function of the fabric transducer according to this mode arises because deformation of the fabric is transmitted to the piezoelectric fibers and deformation of the piezoelectric fibers is converted to an electrical signal and extracted, and therefore by having the piezoelectric fibers fixed in the fabric structure, deformation of the fabric is efficiently transmitted to the piezoelectric fibers and a strong signal can be obtained. The term "bonded" indicates a state in which the fibers are less able to separate due to reinforced interaction between the fiber surfaces, which is not produced by simply producing the woven or knitted fabric. As a preferred form of a bonded state, there may be mentioned a state in which the piezoelectric fibers and the fibers crossing with the piezoelectric fibers are deformed flat along their respective surfaces at the intersections. Such a state can be obtained by strengthening the tensile force of the weft thread and warp thread when weaving the fabric, or by subjecting the fabric to pressing with strong force and/or pressing in a heated atmosphere. The preferred state of bonding in this case is by penetration on the molecular level or formation of chemical bonds to create a pressure-sensitive adhesive state at the contact interface between the piezoelectric fibers and the crossing fibers, but a state in which there is no pressure-sensitive adhesion but the fibers are less able to separate due merely to the increased surface interaction resulting from increased contact area, may also be considered a bonded state. When the fibers have pressure-sensitive adhesion between them, it is a state in which there is no clear interface between the piezoelectric fibers and the crossing fibers when a cross-section of the piezoelectric fibers at a crossing section is observed. Moreover, when the contact area has increased, it is a state in which the piezoelectric fibers are deformed into a very flat form matching the shape of the crossing fiber surfaces, when a cross-section of the piezoelectric fibers at a crossing section is observed. Whether or not deformation into a very flat form has taken place can be evaluated by the following method. The fabric is solidified after impregnation with an adhesive so that the state does not change, fixing it into a thin sheet form. A feather cutter is used to cut out a perpendicular cross-section of the piezoelectric fibers at a portion where they are crossing with the other fibers, and the cross-section is observed with a microscope. On the fiber cross-section, the x-axis is defined as the axis parallel to the plane formed by the fabric, and the y-axis is defined as the axis perpendicular to the x-axis. When the fibers observed in the cross-section are monofilaments, the smallest rectangular shape in which a fiber cross-section of a single filament completely fits is drawn with the sides on the x-axis and y-axis, respectively, and the length of a side of the rectangular shape in the x-axis direction is denoted as x, while the length of a side in the y-axis direction is denoted as $y_1$. When the fibers observed in the cross-section are multifilaments, the smallest rectangular shape in which the cross-sections of all of the filaments in the multifilament fit is drawn with the sides on the x-axis and y-axis, respectively, and the length of a side of the rectangular shape in the x-axis direction is denoted as x, while the length of a side in the y-axis direction is denoted as $y_1$. The flatness is calculated by the following formula (7) based on the measurement results.

$$\text{Flatness}=x_1 \div y_1 \qquad (7)$$

The flatness is calculated for at least ten different points, and the average value is used. If the average value for the flatness is 2.0 or greater, for the purpose of the present application, it is judged that the piezoelectric fibers at the crossing sections are deformed to very flat shapes matching the shapes of the crossing fiber surfaces, or in other words, that at the intersections where the piezoelectric fibers cross with separate fibers, the piezoelectric fibers and the other fibers crossing with the piezoelectric fibers are bonded. Flatter deformation of the piezoelectric fibers at the crossing sections is preferred as it will increase the contact area at the crossing points and increase the bonding effect between fibers. The flatness is therefore more preferably 2.3 or greater and even more preferably 2.5 or greater.

In the case of a fabric using multifilaments, preferably the gaps between the filaments composing the multifilaments are compressed to form compacted multifilaments, increasing the bonding effect between the individual filaments, from the viewpoint of fixing the structure of the piezoelectric fibers.

In order to achieve such flatness, it is preferred to use a press method that is publicly known in the prior art. Particularly when polylactic acid fibers are used as the piezoelectric fibers, it is preferred to carry out hot pressing for up to 10 minutes at a temperature of between 60° C., as the glass transition point, and the melting point, and preferably between 70° C. and 160° C. It is more preferred to carry out hot pressing at a temperature near the initial fusion temperature of the piezoelectric fibers (between 140° C. and 160° C., in the case of polylactic acid), but at such a temperature that the conductive fibers and insulating fibers do not fuse. The hot pressing is preferably carried out with a roll press machine that can operate in a continuous system. Also, when multifilaments are used for the piezoelectric fibers, conductive fibers or insulating fibers, the number of twists of the multifilaments is preferably low in order to obtain the aforementioned flatness. If the number of twists is too great, the fibers will be less likely to undergo flat deformation and the bonding effect will be reduced, which is undesirable. From this viewpoint, the number of twists per meter is no greater than 1000, preferably no greater than 500 and even more preferably no greater than 300.

Another performed form of the bonding state is a state in which the piezoelectric fibers are bonded using an adhesive. The adhesive used may be any one situated between the piezoelectric fibers and the fibers crossing with the piezoelectric fibers and having the function of constraining movement between them, with no restriction on the amount of the constraining force. As adhesives there may be suitably used rubber dispersions, bond agents, acrylic adhesives, epoxy-based adhesives, phenol-based adhesives, pressure-sensitive adhesive polymers, melt polymers and polymer solutions. The adhesive may be pre-coated onto the fiber surfaces or added to the fibers and then, after conducting a weaving or knitting step, the necessary surface deposition or curing step may be carried out on the fabric form, or alternatively the adhesive may be coated or impregnated after the fabric has been formed. Since the adhesive is distributed throughout the entire fabric when the adhesive is to be coated or impregnated in the fabric form, the adhesive used is preferably one with no piezoelectric or pyroelectric property that can cause noise, and with no conductive property that can cause short circuiting. In order to achieve the object of this mode, the weaving with strong weft thread and warp thread tension, or pressing or adhesive application as described above, may be employed, or they may be carried out in combination.

As another mode of the invention, there is provided a transducer that outputs or inputs an electrical signal, comprising a woven or knitted fabric including multiple piezoelectric units arranged on approximately the same plane so that the conductive fibers and piezoelectric fibers provide electrical connection, wherein the piezoelectric fibers and conductive fibers composing one piezoelectric unit directly contact at their fiber surfaces and/or are indirectly connected through a conducting material, whereby it is possible to obtain a fabric-like transducer with excellent flexibility. The transducer of this mode is flexible, and it is therefore possible to obtain a transducer whose input/output are electrical signals in different forms allowing foldable fabric forms, such as a handkerchief, or wearable fabric forms to be obtained.

More specifically, since the function of the fabric of this mode as a transducer arises because deformation of the piezoelectric fibers produces electrostatic polarization on the piezoelectric fiber surfaces, and the electrical signal derived from the electrostatic polarization is extracted through the conductive fibers, sufficient contact points between the piezoelectric fibers and the conductive fibers will reduce contact resistance between them, and a strong electrical signal can be obtained. Here, "sufficient contact points" means a state with large conductive area between the piezoelectric fibers and conductive fibers, which is not produced merely by creating a woven or knitted fabric.

As a preferred form of a state of having sufficient contact points, there may be mentioned a state in which the piezoelectric fibers and/or the conductive fibers are deformed flat along their respective surfaces at the intersections. Such a state can be obtained by strengthening the tensile force of the weft thread and warp thread when weaving the fabric, or by subjecting the fabric to pressing with strong force and/or pressing in a heated atmosphere. The preferred state of bonding in this case is by penetration on the molecular level or formation of chemical bonds to create a pressure-sensitive adhesive state at the contact interface between the piezoelectric fibers and the contacting conductive fibers, but a state in which there is no pressure-sensitive adhesion but the contact area increases by deformation of the individual fiber surfaces may also be considered a state with sufficient contact points. When the fibers have pressure-sensitive adhesion between them, it is a state in which there is no clear interface between the piezoelectric fibers and the conductive fibers when a fiber cross-section at a crossing section is observed. Moreover, when the contact area has increased, it is a state in which the piezoelectric fibers or conductive fibers are deformed into a very flat form matching the shape of the crossing fiber surfaces, when a fiber cross-section at a crossing section is observed. Whether or not deformation into a very flat form has taken place can be evaluated by the following method.

The fabric is solidified after impregnation with an adhesive so that the state does not change, fixing it into a thin sheet form. A feather cutter is used to cut out a perpendicular cross-section of the piezoelectric fibers at a portion where they are crossing with the conductive fibers, and the cross-section is observed with a microscope. On the piezoelectric fiber cross-section, the x-axis is defined as the axis parallel to the plane formed by the fabric, and the y-axis is defined as the axis perpendicular to the x-axis. When the fibers observed in the cross-section are monofilaments, the smallest rectangular shape in which a fiber cross-section of a single filament completely fits is drawn with the sides on the x-axis and y-axis, respectively, and the length of a side of the rectangular shape in the x-axis direction is denoted as $x_1$ while the length of a side in the y-axis direction is denoted as $y_1$. When the fibers observed in the cross-section are multifilaments, the smallest rectangular shape in which the cross-sections of all of the filaments in the multifilament fit is drawn with the sides on the x-axis and y-axis, respectively, and the length of a side of the rectangular shape in the x-axis direction is denoted as $x_1$ while the length of a side in the y-axis direction is denoted as $y_1$.

The flatness is calculated by the following formula (8) based on the measurement results.

$$\text{Flatness} = x_1 \div y_1 \tag{8}$$

The flatness is calculated for at least ten different points, and the average value is used. If the average value for the flatness is 2.0 or greater, for the purpose of the present application, it is judged that the piezoelectric fibers at the crossing sections are deformed to very flat shapes matching the shapes of the crossing conductive fiber surfaces, or in other words, that a state with sufficient contact points exists at the intersections where the piezoelectric fibers cross with conductive fibers. Flatter deformation of the piezoelectric fibers at the crossing sections is preferred as it will increase the contact area at the crossing points. The flatness is therefore more preferably 2.3 or greater and even more preferably 2.5 or greater.

In the case of a fabric using multifilaments for the piezoelectric fibers, preferably the gaps between the filaments composing the multifilaments are compressed to form compacted multifilaments, from the viewpoint of keeping as many piezoelectric filaments as possible near the conductive filaments in order to facilitate extraction of electrical signals derived from piezoelectricity.

In order to achieve such flatness, it is preferred to use a press method that is publicly known in the prior art. Particularly when polylactic acid fibers are used as the piezoelectric fibers, it is preferred to carry out hot pressing for up to 10 minutes at a temperature of between 60° C., as the glass transition point, and the melting point, and preferably between 70° C. and 160° C. It is more preferred to carry out hot pressing at a temperature near the initial fusion temperature of the piezoelectric fibers (between 140° C. and 160° C., in the case of polylactic acid), but at such a temperature that the conductive fibers and insulating fibers do not fuse. The hot pressing is preferably carried out with a roll press machine that can operate in a continuous system.

Also, when multifilaments are used for the piezoelectric fibers or conductive fibers, the number of twists of the multifilaments is preferably low in order to obtain the aforementioned flatness. If the number of twists is too great, the fibers will be less likely to undergo flat deformation and it will not be possible to adequately increase the contact points, which is undesirable. From this viewpoint, the number of twists per meter is no greater than 1000, preferably no greater than 500 and even more preferably no greater than 300.

Another preferred form of a state with sufficient contact points is a state with indirect contact points formed of a conducting material between the piezoelectric fibers and conductive fibers. The conducting material used for the indirect contact points may be any one situated between the piezoelectric fibers and conductive fibers and having a function of carrying out electrical conduction, and a conductive paste containing solder, metal or a conductive filler such as carbon, or a conductive pressure-sensitive adhesive or conductive adhesive may be suitably used. A conductive adhesive with adhesive force is more preferred since it will allow particularly efficient transmission of deformation of the fabric to the piezoelectric fibers so that a piezoelectric function is more easily exhibited, and will allow the indirect contact points to be stably maintained for prolonged periods. The conducting material may be pre-coated onto the fiber surfaces or added to the fibers and then, after conducting a weaving or knitting step, a surface deposition or curing step, as necessary, may be carried out on the fabric form, or alternatively the conducting material may be coated or impregnated after the fabric has been formed. In order to prevent short circuiting between different conductive fibers and conduction at unintended sections, it is preferred to use a method in which the conducting material is coated onto the conductive fibers or added to the conductive fibers and then, after conducting a weaving or knitting step, a surface deposition or curing step, as necessary, is carried out on the fabric form. The object of this mode may be achieved by weaving with strong weft thread and warp thread tension, or by increasing the direct contact point area by pressing, or by setting of indirect contact points by a conducting material, or these may be carried out in combination.

As another mode of the invention, there is provided a transducer that outputs or inputs an electrical signal, including multiple piezoelectric units arranged on approximately the same plane so that one conductive fiber and one piezoelectric fiber provide electrical connection, wherein the different conductive fibers composing different piezoelectric units are arranged across mutual intervals of 4 mm or greater, whereby it is possible to obtain a fabric-like transducer with excellent flexibility. The transducer of this mode is flexible, and it is therefore possible to obtain a transducer whose input/output are electrical signals in different forms allowing foldable fabric forms, such as a handkerchief, or wearable fabric forms to be obtained.

More specifically, in the transducer of this mode, the arrangement of the fibers in each piezoelectric unit is not particularly restricted so long as they are arranged so that the conductive fibers and piezoelectric fibers provide electrical connection, but from the viewpoint of strong signal strength, the one conductive fiber and one piezoelectric fiber in each piezoelectric unit are preferably arranged in a more adjacent manner. The locations where the conductive fibers and piezoelectric fibers are adjacent may be punctiform or linear. It is preferred to have contact points where the conductive fibers and piezoelectric fibers are mutually in physical contact, but electrical connection can be provided even without physical contact so long as the spacing between the conductive fiber and piezoelectric fiber in each piezoelectric unit is in a range of no greater than 4 mm. The spacing between the conductive fiber and piezoelectric fiber in each piezoelectric unit is preferably no greater than 3 mm, more preferably no greater than 2 mm, even more preferably no greater than 1 mm and most preferably no greater than 0.5 mm. If the spacing is greater than 4 mm, the electrical output may be lower with shape deformation of the piezoelectric fibers, and use as a transducer may become difficult.

The form of each piezoelectric unit may be, for example, a form in which one conductive fiber and one piezoelectric fiber are arranged in parallel. For a woven fabric, this includes a form in which one warp thread (or weft thread) is used as the conductive fiber and one separate warp thread (or weft thread) is used as the piezoelectric fiber. Another form of the piezoelectric unit may be, for example, a form in which one conductive fiber and one piezoelectric fiber are arranged in a crossing manner. For a woven fabric, this includes a form in which one weft thread (or warp thread) is used as the conductive fiber and one warp thread (or weft thread) is used as the piezoelectric fiber.

The transducer of this mode preferably has a plurality of piezoelectric units arranged on approximately the same plane. Also according to this mode, in order to prevent short circuiting between two conductive fibers in different piezoelectric units, a form in which the two conductive fibers are arranged in parallel is preferred. Furthermore, in order to more reliably prevent short circuiting between two conductive fibers, a particularly preferred mode is one in which an insulating material, such as at least one insulating fiber, is situated between two conductive fibers. When an insulating fiber is arranged between two conductive fibers, unless the insulating fiber is to be used as part of the piezoelectric unit, the insulating fiber is most preferably one having no piezoelectric property in order to avoid noise arising from piezoelectricity. An insulating fiber having no piezoelectric property is preferably an insulating fiber without a helical structure in the crystal, or an insulating fiber without formation of a dipole orientation by poling, or a space charge, since it will have no piezoelectric property in principle. From the viewpoint of economic sense, polyethylene terephthalate threads are particularly preferred for use. However, insulating fibers arranged at spacings of greater than 4 mm from every two conductive fibers will have a minimal effect of noise arising from piezoelectricity, in which case there is no problem with using insulating fibers with a piezoelectric property.

Also in this mode, in light of inconveniences due to electrostatic interference between two conductive fibers in different piezoelectric units, and in order to provide sufficient spatial room to easy separation of the conductive fibers and connection to an input/output device, the conductive fibers are arranged in parallel, with the spacing between the conductive fibers being preferably 4 mm or greater, even more preferably 5 mm or greater and yet more preferably 6 mm or greater.

As another mode of the invention, there is provided a transducer including piezoelectric units wherein the conductive fibers and piezoelectric fibers are arranged on approximately the same plane so as to provide electrical connection, the boiling water shrinkage ratio S(p) of the piezoelectric fibers and the boiling water shrinkage ratio S(c) of the conductive fiber satisfying the following inequality (9):

$$|S(p)-S(c)| \leq 10 \tag{9}$$

whereby it is possible to obtain a fabric-like transducer with excellent flexibility and high practicality. The transducer of this mode is flexible, and it is therefore possible to obtain a transducer whose input/output are electrical signals in different forms allowing foldable fabric forms, such as a handkerchief, or wearable fabric forms to be obtained.

Furthermore, it is possible to obtain a device utilizing signals from the transducer, and/or a device that functions by input of electrical signals. The details regarding the boiling water shrinkage ratio S are as explained above.

As another mode of the invention, there is provided a transducer which is a layered transducer comprising at least two sheets or fabrics, at least one of the sheets or fabrics comprising the following layer A, and at least one of the layers other than layer A comprising the following layer B, whereby a fabric-like transducer with excellent flexibility can be obtained.

Layer A: A transducer that outputs or inputs an electrical signal, including a piezoelectric unit wherein a conductive fiber and a piezoelectric fiber are arranged on approximately the same plane so as to provide electrical connection.

Layer B: An insulating sheet or insulating fabric having a sheet resistance of $10^6$ Ω/sq. or greater.

The transducer of this mode is flexible, and it is therefore possible to obtain a transducer whose input/output are electrical signals in different forms allowing foldable fabric forms, such as a handkerchief, or wearable fabric forms to be obtained.

More specifically, in a transducer according to this mode, layer A is a flat transducer that outputs or inputs an electrical signal, including a piezoelectric unit wherein the conductive fibers and piezoelectric fibers are arranged on approximately the same plane so as to provide electrical connection. Layer B is an insulating sheet or insulating fabric having the function of reducing the effects of electrical disturbance on the transducer of layer A, and the sheet resistance must be $10^6$ Ω/sq. or greater, preferably $10^8$ Ω/sq. or greater, even more preferably $10^{10}$ Ω/sq. or greater and most preferably $10^{12}$ Ω/sq. or greater. If it is less than $10^6$ Ω/sq., unwanted signals may be outputted when the element is in direct contact with the human body or when it is in contact with a conductive object, for example. The insulating sheet or insulating fabric is preferably a fabric from the viewpoint of flexibility, but so long as it is flexible it may also be a sheet or film. The material forming the insulating sheet or insulating fabric is not particularly restricted so long as it has an insulating property, and any publicly known material may be employed. There are no particular restrictions on the method of layering of layer A and layer B according to this mode, and it may be carried out by a method known in the prior art, such as stitch, pressure-sensitive adhesion, bonding or thermocompression bonding. Furthermore, the number of layers may be any number in a range that does not interfere with the object of this mode. However, when several layers of layer A are provided, preferably layer B is present between every two of the layers A so that short circuiting does not occur between the conductive fibers in one layer A and the conductive fibers of another layer A. When several layers A are used, the texture of each layer A does not need to be the same, and the texture and angle of attachment may be appropriately varied according to the purpose and the intended use. Layers other than layer A and layer B may also be provided within ranges that do not interfere with this mode. Examples include a layer with a conductive property, a layer having another sensing function, a layer having durability such as abrasion resistance, and a layer for anchoring to an object, such as a pressure-sensitive adhesive layer or adhesive layer.

As another mode of the invention, there is provided a transducer that outputs or inputs an electrical signal, and that includes piezoelectric units arranged on approximately the same plane so that the conductive fibers and piezoelectric fibers provide electrical connection, the transducer including ultrafine fibers with monofilament diameters of 10 to 2000 nm, whereby it is possible to obtain a fabric-like transducer with excellent flexibility. The transducer of this mode is flexible, and it is therefore possible to obtain a transducer whose input/output are electrical signals in different forms allowing foldable fabric forms, such as a handkerchief, or wearable fabric forms to be obtained.

More specifically, in the transducer of this mode, the ultrafine fibers may be conductive fibers, piezoelectric fibers or insulating fibers, but preferably the ultrafine fibers are insulating fibers from the viewpoint of a wider range of selection of materials. Also, two or more types of fibers may be ultrafine fibers, and of course even all of the fibers composing the piezoelectric units may be ultrafine fibers. The ultrafine fibers have monofilament diameters of 10 to 2000 nm, more preferably 50 to 1500 nm and even more preferably 100 to 1000 nm. If the monofilament diameters are larger than 2000 nm, the effect of the ultrafine fibers will not be obtained and adhesiveness with the target object may not be obtained, while if they are smaller than 10 nm, productivity may be greatly impaired. The total fineness (product of the single fiber size and the number of filaments) is preferably in the range of 5 to 150 dtex. For a total fineness in this range, multiple ultrafine fibers may be doubled, or they may be doubled with fibers having monofilament diameters thicker than 2000 nm.

The amount of ultrafine fibers in the fabric is not particularly restricted so long as the object of improving the adhesiveness with the target object is achieved, as the object of this mode, and for example, when the insulating fibers are ultrafine fibers, it is not necessary for all of the insulating fibers to be ultrafine fibers, though they are preferably included at 1 wt % or more of the total fabric. If the amount of ultrafine fibers is less than 1 wt %, adhesiveness with the target object will not be obtained, and the percentage is preferably 5 wt % or greater, even more preferably 10 wt % or greater and most preferably 15 wt % or greater. Also, ultrafine fibers used may be doubled with thicker fibers. The method of producing the ultrafine fibers is not particularly restricted and any publicly known method may be employed, but the most preferred method is one in which the sea components are removed from sea-island composite fibers in a multi-island structure. An excessive number of island components, however, will not only increase production cost for the spinneret but will also tend to reduce the actual working precision of the spinneret, and therefore the number of island components is preferably no greater than 1000.

As another mode of the invention, there is provided a transducer that outputs or inputs an electrical signal, including piezoelectric units arranged on approximately the same plane so that the conductive fibers and piezoelectric fibers provide electrical connection, wherein the conductive fibers and piezoelectric fibers all have ductility of 3% or greater, whereby it is possible to obtain a fabric-like transducer with excellent flexibility. The transducer of this mode is flexible, and it is therefore possible to obtain a transducer whose input/output are electrical signals in different forms allowing foldable fabric forms, such as a handkerchief, or wearable fabric forms to be obtained.

More specifically, in the transducer of this mode, it is important for the ductility of the conductive fibers to be 3% or greater in order to obtain a transducer with excellent stretchability. If the ductility is less than 3%, movement in the direction parallel to the fiber axes will be restricted when the piezoelectric element has been attached to a deformed section, often making it impossible to adequately detect the original movement, and especially large movement. The ductility of the conductive fibers is more preferably 5' or greater, even more preferably 8% or greater and most preferably 10% or greater. The strength of the conductive fibers is preferably 1 to 15 cN/dtex. If the strength is less than 1 cN/dtex the fabric strength may not be maintained, and it is more preferably 2 cN/dtex or greater and even more preferably 3 cN/dtex or greater. If it is greater than 15 cN/dtex, on the other hand, the piezoelectric element may restrict movement at deformed sections, and it is more preferably no greater than 10 cN/dtex and even more preferably no greater than 8 cN/dtex. Fibers satisfying this ductility and strength are preferably fibers having a conductive layer formed on the surface of a fibrous substance, and specifically metal-plated polymer fibers are preferred.

In addition, in order to obtain a transducer with excellent stretchability according to this mode, it is important for the ductility of the piezoelectric fibers to be 3% or greater. If the ductility is less than 3%, movement in the direction parallel to the fiber axes will be restricted when the piezoelectric element has been attached to a deformed section, often making it impossible to adequately detect the original movement, and especially large movement. The ductility of the piezoelectric fibers is more preferably 5% or greater, even more preferably 8% or greater and most preferably 10% or greater. The strength of the piezoelectric fibers is preferably 1 to 15 cN/dtex. If the strength is less than 1 cN/dtex the fabric strength may not be maintained, and it is more preferably 2 cN/dtex or greater and even more preferably 3 cN/dtex or greater. If it is greater than 15 cN/dtex, on the other hand, the piezoelectric elements may restrict movement at deformed sections, and it is more preferably no greater than 10 cN/dtex and even more preferably no greater than 8 cN/dtex.

As another mode of the invention, there is provided a transducer comprising piezoelectric elements that include piezoelectric units arranged on approximately the same plane so that the conductive fibers and piezoelectric fibers provide electrical connection, wherein the limiting oxygen index of the piezoelectric elements is 24 or greater, whereby a fabric-like or braided transducer with excellent flexibility and flame retardance can be obtained. The transducer of this mode is flexible, and it is therefore possible to obtain a transducer whose input/output are electrical signals in different forms allowing foldable fabric forms, such as a handkerchief, or wearable fabric forms to be obtained. Furthermore, it is possible to obtain a device utilizing signals from the transducer, and/or a device that functions by input of electrical signals.

More specifically, in the transducer of this mode, flame retardant fibers are used for either or both the conductive fibers and piezoelectric fibers, or the piezoelectric elements are covered with a flame retardant. Examples for the method of imparting flame retardance to the conductive fibers may be a method of using a flame retardant-added conductive polymer, using a polymer having a flame retardant dispersed with a conductive filler, or using a base fiber substance such as aramid fiber, polybenzimidazole fiber, polyimide fiber, polyamideimide fiber, polyetherimide fiber, polyallylate fiber, polyparaphenylenebenzobisoxazole fiber, novoloid fiber, flame-retardant acrylic fiber, polychlal fiber, flame retardant polyester fiber, flame-retardant cotton fiber or flame-retardant wool fiber as the starting material for the conductive fibers, or a method of adding a flame retardant to a coating agent beforehand. Examples of methods of imparting flame retardance to piezoelectric fibers include methods of adding an organic flame retardant such as a phosphorus-based compound, or an inorganic flame retardant such as diantimony trioxide, to polylactic acid.

The piezoelectric unit of this mode includes insulating fibers, and the insulating fibers will sometimes be situated between the conductive fibers and piezoelectric fibers in such a manner that the conductive fibers in the piezoelectric unit do not contact the other conductive fibers or the piezoelectric fibers. The flame retardant insulating fibers are preferably organic fibers with a limiting oxygen index of 24 or greater, such as aramid fiber, polybenzimidazole fiber, polyimide fiber, polyamideimide fiber, polyetherimide fiber, polyallylate fiber, polyparaphenylenebenzobisoxazole fiber or novoloid fiber, and alternatively flame-retardant acrylic fiber, polychlal fiber, flame retardant polyester fiber, flame-retardant cotton fiber or flame-retardant wool fiber may be used. The type of flame retardant may be either an organic compound or inorganic compound.

The method of imparting flame retardance with a limiting oxygen index or 24 or greater to the piezoelectric elements of the fabric-like transducer may be a method of imparting flame retardance to any one or more of the conductive fibers, piezoelectric fibers or insulating fibers. In this case, in order to allow the performance of the piezoelectric elements to be adequately exhibited, it is preferred to impart flame retardance to the insulating fibers that do not directly affect the piezoelectric property. From the viewpoint of the fiber properties, it is most convenient, and preferred, to impart flame retardance to the insulating fibers rather than the conductive fibers or the highly crystalline piezoelectric fibers.

Another method for giving the piezoelectric element of the fabric-like transducer flame retardance with a limiting oxygen index of 24 or greater is a method of forming a coating of a flame retardant on the surface of the piezoelectric elements (piezoelectric units) of the transducer. That is, a flame retardant dispersed in a solvent such as water or a resin may be impregnated into or coated onto a fabric-like or braided piezoelectric element, to form a flame retardant film. For example, this includes film coating with a resin that contains a flame retardant. The resin referred to here is a resin that exhibits a binder effect to anchor the flame retardant to the fabric. Specific examples of resins include acrylic resins, urethane resins, melamine resins, epoxy resins, polyester resins, polyamine resins, vinyl ester resins, phenol resins, fluorine resins, silicon resins, and modified forms of these resins. Such resins may also be used as composites of two or more. Preferred resins include acrylic resins and urethane resins, which have a soft feel and low cost.

Flame retardants to be mixed with the resin include publicly known flame retardants. Examples include halogen-based compounds, phosphorus-based compounds, nitrogen-based compounds and antimony compounds, any of which may also be used in combinations of two or more. Specifically these include decabromodiphenyl ether, antimony trioxide and halogenated phosphoric acid ester mixtures, and poly(ammonium phosphate).

The mixing ratio of the flame retardant and resin is preferably between 20 parts and 300 parts of the flame retardant, with the resin at 100 parts, based on weight. If the proportion of the resin is low, anchoring of the flame retardant will be insufficient, and if it is too high the flame-retardant effect may be inferior.

The method used to form the resin layer may be any desired conventionally known single-side coating method or dipping method, and the coating method used may employ a knife coater, gravure coater, comma coater or the like.

Alternatively, the fabric may be laminated with a resin sheet or a resin film that already includes a flame retardant. If the thickness of the resin layer is too thin the amount of flame retardant in the resin will be reduced and sufficient flame retardance may not be obtained, and therefore it is preferably 0.03 µm or larger, but since the flexibility may be impaired if the thickness is too large, it is preferably no larger than 5 µm. A more preferred thickness range is 0.1 to 3 µm.

As another mode of the invention, there is provided a transducer comprising piezoelectric elements that include piezoelectric units arranged on approximately the same plane so that the conductive fibers and piezoelectric fibers provide electrical connection, wherein either or both the conductive fibers and piezoelectric fibers are fibers using a spun-dyed polymer, whereby a fabric-like transducer with excellent flexibility and design properties can be obtained. The transducer of this mode is flexible, and it is therefore possible to obtain a transducer whose input/output are electrical signals in different forms allowing foldable fabric forms, such as a handkerchief, or wearable fabric forms to be obtained. Moreover, such a transducer is resistant to coloration or formation of folding stripes when subjected to repeated folding back or twisting back, and can maintain uniform color for prolonged periods. Furthermore, it is possible to obtain a device utilizing signals from the transducer, and/or a device that functions by input of electrical signals.

More specifically, in a transducer according to this mode, the spun-dyed polymer is the polymer serving as the starting material for the conductive fibers, piezoelectric fibers or insulating fibers with addition and dispersion of any of various pigments, where the pigments to be used may be different types of organic pigments comprising conventionally known azo lake-based, benzimidazolone-based, diazolide-based, condensed azo-based, quinacridone-based, dioxazine-based, isoindolinone-based, vat-based or phthalocyanine-based pigments, or different inorganic pigments comprising titanium yellow, iron oxide, cobalt blue, chromium oxide, cadmium sulfide or carbon black, and other known pigments that can generally be used for coloration of polymers, or mixtures thereof. Among these, since this mode preferably employs carbon fibers as the conductive fibers, a black spun-dyed polymer such as carbon black is preferably used for the piezoelectric fibers and insulating fibers, for color matching. By adding a small amount of a spun-dyed polymer to the starting polymer it is possible to color the conductive fibers, piezoelectric fibers and insulating fibers. This method is only one example, and other publicly known methods may also be used. Examples include a method of dyeing the conductive fibers, piezoelectric fibers and insulating fibers with a publicly known disperse dye or cationic pigment, or a method of coating the fiber surfaces using a print method or the like employing a binder. However, in some cases it may be difficult to adjust the color, or folding stripes may become visible during the process of using the transducer of the invention.

As another mode of the invention, there is provided a shoe sole insert comprising a shoe sole insert main body and a fabric-like or braided piezoelectric sensor mounted on the sole insert main body, whereby it is possible to obtain a fabric-like transducer with excellent flexibility, and by using it as a fabric-like piezoelectric sensor mounted in a shoe sole insert, it is possible to obtain a shoe sole insert (sensor) that can ascertain foot movement or movement the load of the sole.

Incidentally, since the transducer of this mode can extract an electrical signal as output, the electrical signal may be used as a power generating element, to serve as an electric power source to drive another device, or for storage.

More specifically, when using the piezoelectric element (piezoelectric sensor) including piezoelectric units in a shoe sole insert, in order to protect the woven structure of the piezoelectric element from abrasion by the foot and socks, the surface may be coated with a resin or covered with a resin sheet/film, to an extent that does not interfere with the function of the sensor. With a sole insert comprising a transducer according to this mode, when used in running shoes, for example, it is possible to obtain data for travel distance and traveling speed, as well as data that can aid in improving running form, in a continuous manner.

As another mode of the invention, there is provided a transducer that outputs or inputs an electrical signal, including multiple piezoelectric units arranged on approximately the same plane so that conductive fibers and piezoelectric fibers provide electrical connection, wherein each piezoelectric unit comprises two conductive fibers and one piezoelectric fiber, with the conductive fiber, piezoelectric fiber and conductive fiber being arranged in that order, and the plurality of piezoelectric units are arranged so that the spacing between piezoelectric fibers is 4 mm or greater, whereby it is possible to obtain a fabric-like transducer with excellent flexibility and the capability of stably detecting piezoelectric signals. The transducer of this mode is flexible, and it is therefore possible to obtain a transducer whose input/output are electrical signals in different forms allowing foldable fabric forms, such as a handkerchief, or wearable fabric forms to be obtained.

More specifically, in a transducer according to this mode, the piezoelectric fiber between the conductive fibers in each piezoelectric unit must be arranged with a spacing of at least 4 mm or greater, preferably 5 mm or greater and even more preferably 7 mm or greater between them. Here, "spacing between piezoelectric fibers" means the distance "between the surfaces" of the fibers. If it is less than 4 mm, the signal obtained from each piezoelectric element will not be stable, and an accurate signal will not be obtained. If it is 4 mm or greater, a stable signal will be obtained and a device suitable for use as a sensor will be obtained. While the reason why an accurate signal cannot be obtained at less than 4 mm is not fully understood, it is conjectured that interference of signals generated between each of the piezoelectric elements may be a cause.

As another mode of the invention, there is provided a transducer that outputs or inputs an electrical signal, and that includes piezoelectric units arranged on approximately the same plane so that the conductive fibers and piezoelectric fibers provide electrical connection, wherein the number of twists of the piezoelectric fibers is no greater than 1000 per meter, whereby it is possible to obtain a fabric-like transducer with excellent flexibility. The transducer of this mode is flexible, and it is therefore possible to obtain a transducer whose input/output are electrical signals in different forms allowing foldable fabric forms, such as a handkerchief, or wearable fabric forms to be obtained.

More specifically, in the transducer of this mode, the number of twists of the piezoelectric fibers is no greater than 1000, preferably no greater than 500 times and more preferably no greater than 300 times per meter. From merely the viewpoint of increasing piezoelectric performance, it is ideal to carry out weaving without application of twisting (that is, with zero twists). While it is not our intention to be constrained by any particular theory, it is conjectured that polarization by displacement of the piezoelectric fibers occurs in a fixed direction with respect to the orientation direction of the threads, and therefore increasing the number of twists results in a more diagonal orientation direction of the threads, and the fact that the polarization direction is no longer constant is a cause of reduced piezoelectricity. On the other hand, increasing the number of twists increases the strength of the threads, and it is commonly done to minimize thread breakage or fluff generation during weaving and knitting. Therefore, for concrete application of this mode, it is attempted to optimize the number of twists while obtaining comparative equilibrium between the mechanical properties and piezoelectric performance required for target objects.

In order to obtain a piezoelectric fiber from the piezoelectric polymer, any publicly known method for forming a fiber from a polymer may be employed so long as the effect of the invention can be exhibited, such as a method of forming a fiber by extrusion molding of a piezoelectric polymer, a method of forming a fiber by melt spinning of a piezoelectric polymer, a method of forming a fiber by dry or wet spinning of a piezoelectric polymer, or a method of forming a fiber by electrostatic spinning of a piezoelectric polymer. The spinning conditions employed may be according to a publicly known process suitable for the piezoelectric polymer used, and for most cases a melt spinning process may be employed, which facilitates industrial production. Incidentally, when the piezoelectric polymer is polylactic acid, it will exhibit greater piezoelectricity if oriented by uniaxial stretching and if it contains crystals, and therefore the fiber is preferably stretched.

As another mode of the invention, there is provided a fabric-like transducer that outputs or inputs an electrical signal, including piezoelectric units arranged on approximately the same plane so that conductive fibers and piezoelectric fibers provide electrical connection, the transducer having a cover factor CF of 500 or greater as calculated by the following formula:

$$CF=(DWp/1.1)^{1/2} \times MWp+(DWf/1.1)^{1/2} \times MWf$$

(where $DWp$ is the total fineness of the warp thread (dtex), $MWp$ is the woven density of the warp thread (num/2.54 cm), $DWf$ is the total fineness of the weft thread (dtex) and $MWf$ is the woven density of the weft thread (num/2.54 cm)), or the transducer having an area coverage of 0.40 or greater as calculated by the following formula:

$$\text{Area coverage}=D1 \times N1+D2 \times N2-D1 \times N1 \times D2 \times N2$$

(where $D1$ is the diameter of the warp thread (mm), $N1$ is the warp density (num/mm), $D2$ is the diameter of the weft thread (mm) and $N2$ is the weft density (num/mm)), whereby a fabric-like transducer with excellent flexibility can be obtained. The transducer of this mode is flexible, and it is therefore possible to obtain a transducer whose input/output are electrical signals in different forms allowing foldable fabric forms, such as a handkerchief, or wearable fabric forms to be obtained.

More specifically, in the transducer of this mode, the cover factor is increased to allow the piezoelectric fibers to be more firmly immobilized, and therefore piezoelectric signals due to displacement of the fabric can be stably and reliably acquired. If the cover factor is lower than 500, on the other hand, immobilization of the piezoelectric fibers is softened and their movement becomes easier, thereby resulting in destabilization of obtained signals. Therefore, a stable signal cannot be obtained when used as a sensor. A low cover factor also reduces the durability of the fabric. Furthermore, in the transducer of this mode, the area coverage is increased to allow the piezoelectric fiber to be more firmly immobilized, and therefore piezoelectric signals due to displacement of the fabric can be stably and reliably acquired. If the area coverage is less than 0.40, on the other hand, immobilization of the piezoelectric fibers is softened and their movement becomes easier, thereby resulting in destabilization of obtained signals. Therefore, a stable signal cannot be obtained when used as a sensor. A low area coverage also reduces the durability of the fabric.

The area coverage can be calculated by the following method. The fabric is laid in its natural state without unnatural tensile force or wrinkles, the numbers of warp threads and weft threads in a 25.4 mm region are counted and divided by 25.4 to obtain the warp density $N1$ (num/mm) and weft density $N2$ (num/mm) for 5 locations, and the average value is used. The fabric is then sandwiched by cover glasses in its natural state without unnatural tensile force or wrinkles and placed horizontally, and an area 3 mm long and 3 mm wide is observed from above with a microscope, at 5 locations. At each observed location, the thickness of the warp threads and weft threads is observed at 10 locations, and the measured values for a total of 50 observations of warp threads and weft threads is averaged to obtain the warp thread diameter $D1$ (mm) and weft thread diameter $D2$ (mm). For the warp thread diameter when using 2 or more different fibers for the warp threads, the average for the measured values at 5 locations×10 measurements each for each fiber used is recorded as the diameter for each fiber, the diameter for each fiber is multiplied by the proportion of each thread used in the total texture, and a total is obtained as the weighted average value for the warp thread diameter. For the weft thread diameter when using 2 or more different fibers for the weft thread, the weighted average value is calculated in the same manner and used as the weft thread diameter. The area coverage is calculated by the following formula from the warp density $N1$ (num/mm), weft density $N2$ (num/mm), warp thread diameter $D1$ (mm) and weft thread diameter $D2$ (mm) determined in the manner described above.

$$\text{Area coverage}=D1 \times N1+D2 \times N2-D1 \times N1 \times D2 \times N2$$

The piezoelectric element of this mode has an outputted electrical signal from the piezoelectric unit after washing 50 times, that is at least 70% of that before washing, and an outputted electrical signal from the piezoelectric unit after a 100-pass friction test by the Martindale method, that is at least 70% of that before washing. Moreover, when the piezoelectric unit in the fabric is rubbed 1000 times with a finger, it is possible to reduce the difference in potential detected between the first time and the 1000th time.

As another mode of the invention, there is provided a fabric-like transducer that outputs or inputs an electrical signal, including piezoelectric units arranged on approximately the same plane so that conductive fibers and piezoelectric fibers provide electrical connection, the transducer having a cover factor CF of 500 or greater as calculated by the following formula:

$$CF=(DWp/1.1)^{1/2} \times MWp+(DWf/1.1)^{1/2} \times MWf$$

(where $DWp$ is the total fineness of the warp thread (dtex), $MWp$ is the woven density of the warp thread (num/2.54 cm), $DWf$ is the total fineness of the weft thread (dtex) and $MWf$ is the woven density of the weft thread (num/2.54 cm)),
and being subjected to water-repellent treatment, whereby a fabric-like transducer with excellent flexibility can be obtained. The transducer of this mode is flexible, and it is therefore possible to obtain a transducer whose input/output are electrical signals in different forms allowing foldable fabric forms, such as a handkerchief, or wearable fabric forms to be obtained.

More specifically, in the transducer of this mode, the cover factor is increased to allow the piezoelectric fiber to be more firmly immobilized, and therefore piezoelectric signals due to displacement of the fabric can be stably and reliably acquired. If the cover factor is lower than 500, on the other hand, immobilization of the piezoelectric fibers is softened and their movement becomes easier, thereby resulting in destabilization of obtained signals. Therefore, a stable signal cannot be obtained when used as a sensor. A low cover factor also reduces the durability of the fabric. Furthermore, the transducer of this mode has an outputted electrical signal strength after a washing durability test conducted 50 times based on JIS L0844:2011, "Color Fastness Test Method A-1 for Washing", that is at least 70% of that before the washing durability test. Also, the water-repellency of the transducer of the invention is grade 4 or higher in the spray method of JIS L1092:2009.

As another mode of the invention, there is provided an antibacterial transducer that outputs or inputs an electrical signal, including piezoelectric units arranged on approximately the same plane so that the conductive fibers and piezoelectric fibers provide electrical connection, wherein the conductive fibers in each piezoelectric unit are arranged so as not to be in electrical connection with the conductive fibers and/or piezoelectric fibers in other piezoelectric units, and the bacteriostatic activity value is 2.2 or greater, whereby it is possible to obtain a fabric-like transducer with excellent flexibility. The transducer of the invention is flexible, and it is therefore possible to obtain a transducer whose input/output are electrical signals in different forms allowing foldable fabric forms, such as a handkerchief, or wearable fabric forms to be obtained.

More specifically, in the transducer of this mode, fibers are present that are not in contact with the conductive fibers used as piezoelectric units. Any desired fibers may be used as such fibers, but at least 50%, preferably 70% or greater and more preferably 90% of the total number are piezoelectric fibers. This will allow not only piezoelectric performance but also an antibacterial property to be imparted. Some of the conductive fibers are not used as piezoelectric units in some cases, and naturally these are not considered to be "conductive fibers used as piezoelectric units".

The piezoelectric unit of this mode includes insulating fibers, and the insulating fibers will sometimes be situated between the conductive fibers and piezoelectric fibers in such a manner that the conductive fibers in the piezoelectric unit do not contact the other conductive fibers or the piezoelectric fibers. In this case, the insulating fibers used may be fibers of a material and shape that are stretchable, in order to improve the flexibility of the fabric. In addition, the conductive fibers in the piezoelectric unit will sometimes be situated in such a manner as not to contact with the other conductive fibers and piezoelectric fibers in the piezoelectric unit. By situating the insulating fibers in the piezoelectric unit in this manner, there will be no contact of the conductive fibers even when several piezoelectric units have been combined, and the performance as a transducer can be improved.

As another mode of the invention, there is provided a bedding employing an antibacterial transducer including piezoelectric units arranged on approximately the same plane so that the conductive fibers and piezoelectric fibers provide electrical connection, wherein the conductive fibers in each piezoelectric unit are arranged so as not to be in electrical connection with the conductive fibers and/or piezoelectric fibers in other piezoelectric units, and the bacteriostatic activity value of the transducer is 2.2 or greater, whereby it is possible to obtain a fabric-like transducer with excellent flexibility and an excellent antibacterial property. The transducer of this mode is flexible, and it is therefore possible to obtain a transducer whose input/output are electrical signals in different forms allowing foldable fabric forms, such as a handkerchief, or wearable fabric forms to be obtained. Furthermore, it is possible to obtain a device utilizing signals from the transducer, and/or a device that functions by input of electrical signals.

Incorporating a device comprising a transducer of this mode into beddings, such as a sheet or pillow or a pillow cover or bed, or a futon or futon cover, is extremely useful. For example, in order to prevent wandering of a patient at a caregiving facility, it is extremely useful to sense the presence or absence of the patient on the bed, and for this purpose, to use a sheet or pillow employing a transducer of this mode. Also, with increasing interest in health issues in recent years, products have been developed that monitor the state of daily sleep by sensing movement of the body during sleep, and a sheet, pillow or bed according to the invention may also be applied for this purpose. However, the concept of bedding comprising a device that includes a transducer of this mode includes a construction in which the device is the bedding.

The fact that a transducer of this mode has excellent antibacterial properties also makes it highly suited for incorporation into beddings, such as a sheet or pillow or a pillow cover or bed, or a futon or futon cover. Because bedding contacts with the human body, their use results in adhesion of harmful bacteria such as *Staphylococcus aureus*, which proliferate on fabrics using sweat components and dead skin as nutrients, and these release bad odors during their proliferation and produce bad odor in sheets and pillows. In addition, *Staphylococcus aureus* is suspected of being a cause of inflammation in atopic dermatitis. Since the transducer of the invention has excellent antibacterial properties, it can suppress proliferation of bacteria such as *Staphylococcus aureus* and thereby reduce generation of bad odors.

A transducer fabric of this mode has excellent washing durability. In addition, since the transducer of this mode is not surface-treated for antibacterial treatment of the fabric, but rather the transducer itself has a high antibacterial property, the antibacterial property is not reduced even with repeated washing.

In addition, since the sensor of this mode is in fabric form, and therefore is elastic and flexible, it may be used as a surface pressure-sensitive sensor or shape deformation sensor by attachment or covering on the surface of all or portions of various structures. Moreover, since the transducer of this mode can extract an electrical signal as output, the electrical signal may be used as a power generating element, to serve as an electric power source to drive another device, or for storage. By incorporating such a device into bedding such as a sheet or pillow, it is possible to use it as an electric power source to drive another device incorporated into bedding such as a sheet or pillow, or to store electricity in an electrical storage device incorporated into bedding such as a sheet or pillow.

As another mode of the invention, there is provided a shoe insole employing an antibacterial transducer including piezoelectric units arranged on approximately the same plane so that the conductive fibers and piezoelectric fibers provide electrical connection, wherein the conductive fibers in each piezoelectric unit are arranged so as not to be in electrical connection with the conductive fibers and/or piezoelectric fibers in other piezoelectric units, and the bacteriostatic activity value of the transducer is 2.2 or greater, whereby it is possible to obtain a fabric-like transducer with excellent flexibility and an excellent antibacterial property. The transducer of this mode is flexible, and it is therefore possible to obtain a transducer whose input/output are electrical signals in different forms allowing foldable fabric forms, such as a handkerchief, or wearable fabric forms to be obtained. Furthermore, it is possible to obtain a device utilizing signals from the transducer, and/or a device that functions by input of electrical signals.

It is extremely useful to incorporate a device using a transducer of this mode into a shoe insole. For example, for use in sports, it is desirable to detect body movement of an athlete by a shoe insole and to analyze the movement. For rehabilitation purposes as well, it is desirable to use a shoe insole as a sensor to monitor the recovery of a patient, and an insole incorporating a device that includes a transducer of this mode is suited for such a purpose. However, the concept of an insole comprising a device that includes a transducer of this mode includes a construction in which the device is the insole.

The fact that a transducer of this mode has excellent antibacterial properties also makes it highly suited for incorporation into an insole. Because an insole contacts with the human body, their use results in adhesion of harmful bacteria such as *Staphylococcus aureus*, which proliferate on fabrics using sweat components and dead skin as nutrients, and these release bad odors during their proliferation and produce bad odor in shoes. In addition, *Staphylococcus aureus* is suspected of being a cause of inflammation in atopic dermatitis. Since the transducer of the invention has excellent antibacterial properties, it can suppress proliferation of bacteria such as *Staphylococcus aureus* and thereby reduce generation of bad odors.

A transducer fabric of this mode has excellent washing durability. In addition, since the transducer of this mode is not surface-treated for antibacterial treatment of the fabric, but rather the transducer itself has a high antibacterial property, the antibacterial property is not reduced even with repeated washing.

In addition, since the sensor of this mode is in fabric form, and therefore is elastic and flexible, it may be used as a surface pressure-sensitive sensor or shape deformation sensor by attachment or covering on the surface of all or portions of various structures. Moreover, since the transducer of this mode can extract an electrical signal as output, the electrical signal may be used as a power generating element, to serve as an electric power source to drive another device, or for storage. By incorporating such a device into a shoe insole, it is possible to use it as an electric power source to drive another device incorporated into a shoe insole, or to store electricity in an electrical storage device incorporated into a shoe insole.

As another mode of the invention, there is provided a transducer comprising piezoelectric units arranged on approximately the same plane so that the conductive fibers and piezoelectric fibers provide electrical connection, and electrostatic capacity units comprising a plurality of mutually separated conductive fibers, whereby a fabric-like transducer with excellent flexibility can be obtained. The transducer of the invention is flexible, and it is therefore possible to obtain a transducer whose input/output are electrical signals in different forms allowing foldable fabric forms, such as a handkerchief, or wearable fabric forms to be obtained. Furthermore, it is possible to obtain a device utilizing signals from the transducer, and/or a device that functions by input of electrical signals.

More specifically, a transducer of this mode also includes electrostatic capacity units in addition to the piezoelectric units. Here, an "electrostatic capacity unit" is one having two conductive fibers arranged so as to be mutually separated and parallel, with a voltage being applied between the conductive fibers, where the resistance value or charge produced by change in the distance between the conductive fibers that varies the electrostatic capacity, is measured to detect pressure on or displacement of the fabric. The method of mutually separating two conductive fibers in parallel may be, for example, a method of interposing an insulating fiber between the two conductive fibers, a method of sandwiching a dielectric material between the two conductive fibers, or a method of forming a space between the two conductive fibers by the method of weaving or knitting. Moreover, the detection may be made using the signal from one electrostatic capacity unit, or using signals from multiple electrostatic capacity units connected in series and/or parallel.

While the signal from the piezoelectric unit is generated only at the instant of displacement, the signal from the electrostatic capacity unit is obtained as a signal at all times during displacement, and the signal from the electrostatic capacity unit is also relatively large. On the other hand, the electrostatic capacity unit is easily affected by static electricity, and when used as a sensor, for example, there is a risk of malfunctioning. Thus, analysis of more detailed movement can be made with a fabric structure with both piezoelectric units and electrostatic capacity units, and by analyzing both signals. For example, motion analysis may be made by detecting the specific movement of the fabric, i.e. the type of movement such as bending or twisting and the amount of displacement, from the piezoelectric units, and detecting whether or not the displacement is continuing, from the electrostatic capacity units. Also, when the amount of displacement of the fabric is to be measured by signals from the electrostatic capacity units, one possible manner of use is to only extract signals when signals from the piezoelectric elements are simultaneously detected from among the obtained signals, thereby minimizing malfunctioning from the electrostatic capacity units. In this case, since signals from both the piezoelectric units and electrostatic capacity units are used for analysis of one movement of the fabric, preferably the piezoelectric units and electrostatic capacity units are arranged close to each other so that they undergo the same movement with one movement of the fabric.

EXAMPLES

The first invention will now be described in greater detail by examples, with the understanding that the invention is not in any way restricted by the examples.

The piezoelectric element fabric was produced by the following method.
(Production of Polylactic Acid)

The polylactic acid used in the Examples was produced by the following method.

After adding 0.005 part by weight of tin octylate to 100 parts by weight of L-lactide (product of Musashino Chemical Laboratory, Ltd., 100% optical purity), the mixture was reacted at 180° C. for 2 hours in a stirring blade-equipped reactor under a nitrogen atmosphere, and phosphoric acid was added at 1.2 equivalents with respect to the tin octylate, after which the remaining lactide was removed under reduced pressure at 13.3 Pa, and chips were formed to obtain poly-L-lactic acid (PLLA1). The weight-average molecular weight of the obtained PLLA1 was 152,000, the glass transition point (Tg) was 55° C. and the melting point was 175° C.

(Piezoelectric Fibers)

The PLLA1 was melted at 240° C. and discharged from a 24-hole cap at 20 g/min, and drawn out at 887 m/min. The unstretched multifilament thread was stretched to a factor of 2.3 at 80° C. and heat set at 100° C., to obtain an 84 dTex/24 filament multifilament uniaxial stretched thread, and eight multifilament uniaxial stretched threads were bundled to form a piezoelectric fiber 100A.

(Conductive Fiber)

Silver plated nylon "AGposs" by Mitsufuji Corp. was used as the conductive fiber 100B. The volume resistivity of the fiber was $1.1 \times 10^{-3}$ Ω·cm.

The piezoelectric element was evaluated by the following method.

(Evaluation of Piezoelectric Element)

Figure 3:
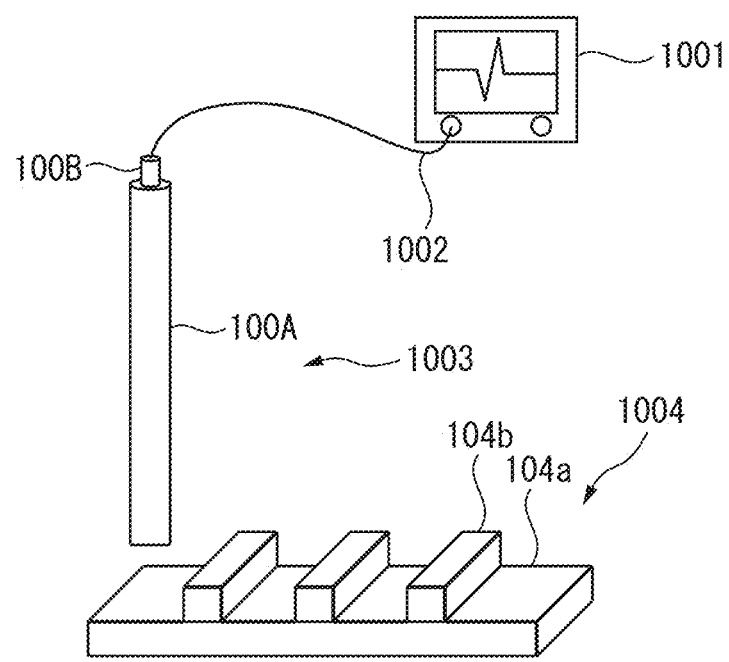
FIG. 3 is a schematic diagram of an evaluation system for the piezoelectric element of Example 1.

The covered fiber 1003 of a braided piezoelectric element including a covered fiber 1003, formed by a conductive fiber 100B and a piezoelectric fiber 100A, was cut to a length of 5 cm, and the piezoelectric fiber 100A on the surface at one end of the covered fiber 1003 was removed to expose the end section of the conductive fiber 100B. As shown in FIG. 3, the end section of the exposed conductive fiber 100B was connected to an oscilloscope 1001 through an evaluating wire 1002, and the piezoelectric characteristic of the piezoelectric element was evaluated by contacting the piezoelectric fiber 100A at the other end of the covered fiber 1003 with the surface of a measuring sample 1004 to be measured while scanning parallel to the surface.

The measuring sample 1004 that was prepared had plates 104b each with a 1 cm length×0.5 cm width×0.5 cm thickness attached at 3 locations with equal spacings on a flat plate 104a with a 1 cm length×5 cm width×0.5 cm thickness, while leaving 1 cm open at each of both ends.

For evaluation of the piezoelectric characteristic, the surface of the measuring sample 1004 was rubbed at a speed of approximately 0.5 m/s with a constant force so that the end section of the covered fiber 1003 of the piezoelectric element came to a height location approximately 0.5 cm from the surface of the measuring sample 1004. The oscilloscope 1001 used for voltage evaluation was a Digital Oscilloscope DL6000 Series, "DL6000" trade name of Yokogawa Electric Corp.

The surface of the measuring sample 1004 was also rubbed 2000 times with the piezoelectric element, and then voltage evaluation was conducted in the same manner.

Example 1

By wrapping eight piezoelectric fibers 100A while knitting them with the conductive fiber 100B, a braided covered fiber 1003 with a 10 m-long tubular braid was obtained. The silver plated nylon fiber serving as the conductive fiber 100B in the covered fiber 1003 had a volume resistivity of $1.1 \times 10^{-3}$ Ω·cm. Next, one end of the piezoelectric fibers 100A on the surface of the covered fiber 1003 was removed, leaving the conductive fiber 100B bare, to obtain a piezoelectric element. The piezoelectric element was evaluated its piezoelectric characteristic with the construction as shown in FIG. 3.

When the top of the measuring sample 1004 was traced with the piezoelectric element, different voltages were confirmed at the base plate 104a section and section where two plates 104a, 104b overlapped.

Also, the top of the measuring sample 1004 was rubbed 2000 times, and then the piezoelectric characteristic of the piezoelectric element was evaluated, but there was virtually no change in the magnitude of the electrical signal before and after rubbing 2000 times.

The piezoelectric element of the invention is flexible and allows electrical output generated from a piezoelectric polymer to be sufficiently extracted simply by rubbing the surface of the piezoelectric element with a finger, while it can function as a flexible touch sensor that can detect stress generated by rubbing or the like or the location of the stress, and therefore it can be suitably used as a touch sensor. Furthermore, by incorporating the piezoelectric element into the housing of a smartphone or the like, it is possible to obtain a smartphone capable of operation by one hand.

In addition, since the piezoelectric element is in a flexible fibrous form it can be made into a fabric by weaving or knitting, thereby allowing a fabric-like touch panel to be obtained that is foldable like a handkerchief.

Furthermore, since electrical output can be extracted simply by rubbing, it can also be applied as a microgenerator or the like.

Moreover, when the braided piezoelectric element is to be used as a contact probe, despite being a contact system, it is possible to perform measurement while minimizing damage to the object to be measured, and it can therefore be used for measurement in fields where application has been difficult, such as measurement of human faces, for example.

The second invention will now be described in greater detail by examples, with the understanding that the invention is not in any way restricted by the examples.

The piezoelectric element fabric was produced by the following method.

(Production of Polylactic Acid)

The polylactic acid used in the Examples was produced by the following method.

After adding 0.005 part by mass of tin octylate to 100 parts by mass of L-lactide (product of Musashino Chemical Laboratory, Ltd., 100% optical purity), the mixture was reacted at 180° C. for 2 hours in a stirring blade-equipped reactor under a nitrogen atmosphere, and phosphoric acid was added at 1.2 equivalents with respect to the tin octylate, after which the remaining lactide was removed under reduced pressure at 13.3 Pa, and chips were formed to obtain poly-L-lactic acid (PLLA1). The weight-average molecular weight of the obtained PLLA1 was 152,000, the glass transition point (Tg) was 55° C. and the melting point was 175° C.

(Piezoelectric Fibers)

PLLA1 melted at 240° C. was discharged from a 24-hole cap at 20 g/min, and drawn out at 887 m/min. The unstretched multifilament thread was stretched to a factor of 2.3 at 80° C. and heat set at 100° C., to obtain an 84 dTex/24 filament multifilament uniaxial stretched thread.

(Conductive Fiber)

Silver plated nylon "AGposs" 100d34f by Mitsufuji Corp. was used as the conductive fiber 200B. The volume resistivity of the fiber was $1.1 \times 10^{-3}$ Ω·cm.

(Insulating Fiber)

Polyethylene terephthalate melted at 280° C. was discharged from a 24-hole cap at 45 g/min, and drawn out at 800 m/min. The unstretched filament was stretched to a factor of 2.5 at 80° C. and heat set at 180° C. to obtain an 84 dTex/24 filament multifilament drawn thread, which was used as the insulating fiber.

(Braided Piezoelectric Element)

As the sample for Example 2, the conductive fiber 200B was used as the core thread and the eight piezoelectric fibers 200A were wound in a braided form around the core thread, as shown in FIG. 6, to create an 8-plaited braid, forming a braided piezoelectric element 2001. The winding angle α of the piezoelectric fiber 200A was 450 with respect to the fiber axis CL of the conductive fiber 200B.

(Weaving)

As the sample for Example 3, insulating fibers 2007 and one braided piezoelectric element 2001 (the same sample as Example 2) were arranged as warp threads, and insulating fibers 2007 and conductive fibers 2008 were arranged alternately as weft threads, as shown in FIG. 7, to form a plain weave fabric as the fabric-like piezoelectric element 2005.

Figure 11:
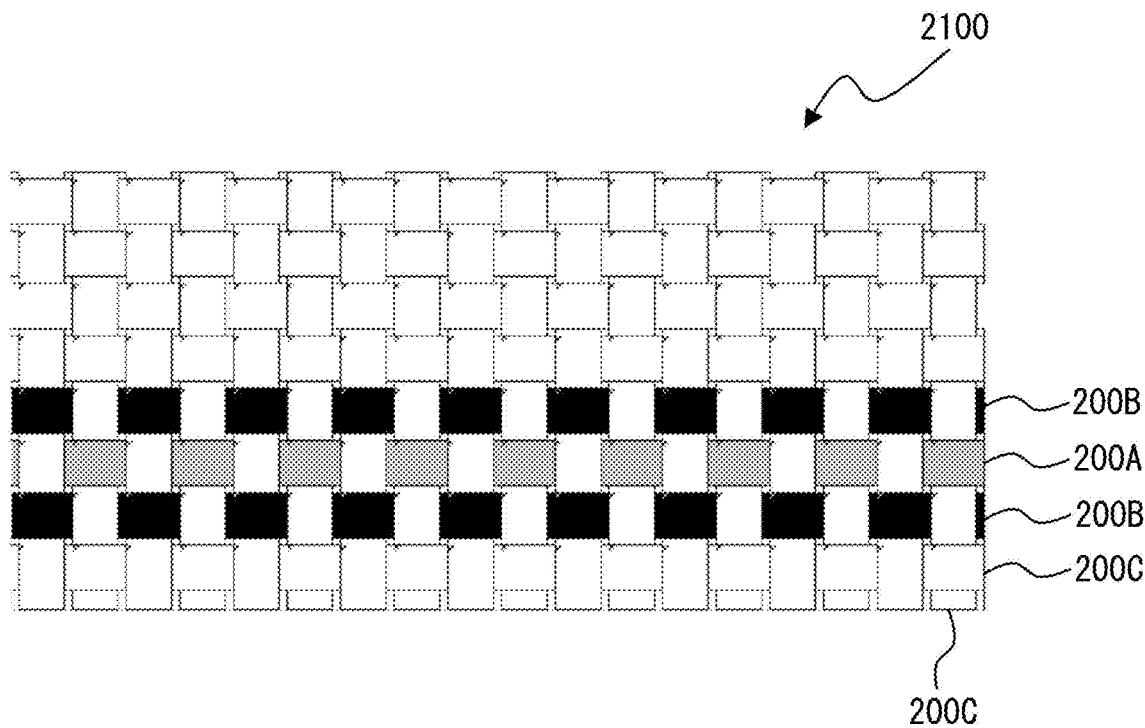
FIG. 11 is a schematic diagram showing an example of the construction of a woven fabric including piezoelectric fibers according to Comparative Example 1.

As the sample for Comparative Example 1, insulating fibers 200C were arranged as warp threads and insulating fibers 200C, a piezoelectric fiber 200A and conductive fibers 200B were arranged as weft threads, as shown in FIG. 11, to form a plain weave fabric 2100.

(Performance Evaluation and Evaluation Results)

The performance evaluation and evaluation results for the braided piezoelectric element 2001, the fabric-like piezoelectric element 2005 and the plain weave fabric 2100 were as shown below.

Example 2

Using the conductive fiber 200B in the braided piezoelectric element 2001 as a signal wire, an oscilloscope (Digital Oscilloscope DL6000 Series "DL6000", trade name of Yokogawa Electric Corp.) was connected through the wire via a 1000-fold amplification circuit. The braided piezoelectric element 2001 was bent 90 degrees in an electromagnetic shield box protected by a grounded (earthed) metallic gold net.

As a result, a difference in potential of approximately 100 mV was detected by the oscilloscope as the output from the braided piezoelectric element 2001, confirming that a sufficiently large electrical signal can be detected by deformation of the braided piezoelectric element 2001.

Example 3

Using the conductive fiber 200B in the braided piezoelectric element 2001 of the fabric-like piezoelectric element 2005 as a signal wire, an oscilloscope (Digital Oscilloscope DL6000 Series "DL6000", trade name of Yokogawa Electric Corp.) was connected through the wire via a 1000-fold amplification circuit. A conductive fiber 2008 of the weft threads of the fabric-like piezoelectric element 2005 was used as a grounding (earthing) wire for grounding. In this state, the fabric-like piezoelectric element 2005 was bent 90 degrees in the direction perpendicular to the braided piezoelectric element 2001.

As a result, a virtually noise-free electrical signal was obtained by the oscilloscope, as output from the braided piezoelectric element 2001 of the fabric-like piezoelectric element 2005, and a difference in potential of approximately 100 mV was detected. These results confirmed that it is possible to detect a sufficiently large electrical signal with low noise by deformation of the fabric-like piezoelectric element 2005.

Comparative Example 1

Using the conductive fiber 200B in a plain weave fabric 2100 as a signal wire, an oscilloscope (Digital Oscilloscope DL6000 Series "DL6000", trade name of Yokogawa Electric Corp.) was connected through the wire via a 1000-fold amplification circuit.

As a result, a difference in potential of approximately 30 mV was detected as output from the conductive fiber 200B, but the signal had a low S/N ratio. This is believed to be because a braided piezoelectric element 2001 was not incorporated into the plain weave fabric 2100.

The third invention will now be described in greater detail by examples, with the understanding that the invention is not in any way restricted by the examples.

The piezoelectric element fabric was produced by the following method.

(Production of Polylactic Acid)

The polylactic acid used in the examples was produced by the following method.

After adding 0.005 part by mass of tin octylate to 100 parts by mass of L-lactide (product of Musashino Chemical Laboratory, Ltd., 100% optical purity), the mixture was reacted at 180° C. for 2 hours in a stirring blade-equipped reactor under a nitrogen atmosphere, and phosphoric acid was added at 1.2 equivalents with respect to the tin octylate, after which the remaining lactide was removed under reduced pressure at 13.3 Pa, and chips were formed to obtain poly-L-lactic acid (PLLA1). The weight-average molecular weight of the obtained PLLA1 was 152,000, the glass transition point (Tg) was 55° C. and the melting point was 175° C.

(Piezoelectric Fibers)

PLLA1 melted at 240° C. was discharged from a 24-hole cap at 20 g/min, and drawn out at 887 m/min. The unstretched multifilament thread was stretched to a factor of 2.3 at 80° C. and heat set at 100° C., to obtain an 84 dTex/24 filament multifilament uniaxial stretched thread.

(Conductive Fiber)

Silver plated nylon "AGposs" 100d34f by Mitsufuji Corp. was used as the conductive fiber 300B, conductive fiber 3006 and conductive fiber 3010. The volume resistivity of the fiber was $1.1 \times 10^{-3}$ Ω·cm.

(Insulating Fiber)

Polyethylene terephthalate melted at 280° C. was discharged from a 24-hole cap at 45 g/min, and drawn out at 800 m/min. The unstretched filament was stretched to a factor of 2.5 at 80° C. and heat set at 180° C. to obtain an 84 dTex/24 filament multifilament drawn thread, which was used as the insulating fiber 300C and insulating fiber 3009.

(Braided Piezoelectric Element)

As the sample for Example 4, the conductive fiber 300B was used as the core thread and the eight piezoelectric fibers 300A were wound in a braided form around the core thread, as shown in FIG. 12, to create an 8-plaited braid, and the conductive fiber 3006 was further wound around the piezoelectric fiber 300A of the sheath in a braided form to create a conductive layer 3004, thus forming a braided piezoelectric element 3001. The winding angle α of the piezoelectric fiber 300A was 450 with respect to the fiber axis CL of the conductive fiber 300B. The coverage factor of the conductive layer 3004 of the sample of Example 4 was 100%.

As the sample for Example 5, the conductive fiber 300B was used as the core thread and the eight piezoelectric fibers 300A were wound in a braided form around the core thread, as shown in FIG. 12, to create an 8-plaited braid, and four insulating fibers 3009 were right-wound while one conductive fiber 3006 and three insulating fibers 3009 were left-wound around the piezoelectric fiber 300A of the sheath to create an 8-plait braided conductive layer 3004, thus forming a braided piezoelectric element 3001. The winding angle α of the piezoelectric fiber 300A was 450 with respect to the fiber axis CL of the conductive fiber 300B. The coverage factor of the conductive layer 3004 of the sample of Example 5 was 25%.

As the sample for Comparative Example 2, the conductive fiber 300B was used as the core thread and piezoelectric fibers 300A were wound in a braided form around the core thread, as shown in FIG. 12, forming a braided piezoelectric element 3001. The winding angle α of the piezoelectric fiber 300A was 450 with respect to the fiber axis CL of the conductive fiber 300B.

(Weaving)

As the sample for Example 6, insulating fibers 3009 and one braided piezoelectric element 3001 (the same sample as Example 4) were arranged as warp threads, and insulating fibers 3009 and conductive fibers 3010 were alternately arranged as weft threads, as shown in FIG. 13, to form a plain weave fabric as the fabric-like piezoelectric element 3007.

Figure 19:
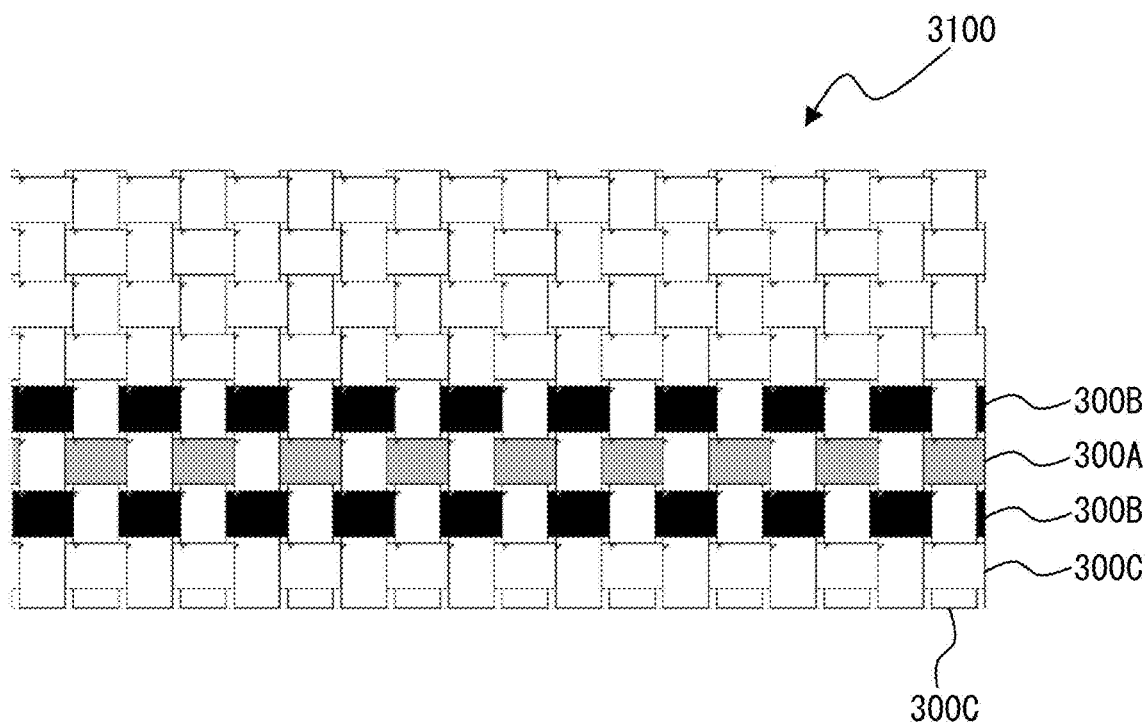
FIG. 19 is a schematic diagram showing an example of the construction of a woven fabric including piezoelectric fibers according to Comparative Example 3.

As the sample for Comparative Example 3, insulating fibers 300C were arranged as warp threads and insulating fibers 300C, a piezoelectric fiber 300A and conductive fibers 300B were arranged as weft threads, as shown in FIG. 19, to form a plain weave fabric 3100.

(Performance Evaluation and Evaluation Results)

The performance evaluation and evaluation results for the braided piezoelectric element 3001, the fabric-like piezoelectric element 3007 and the plain weave fabric 3100 were as shown below.

Example 4

Using the conductive fiber 300B in the braided piezoelectric element 3001 as a signal wire, an oscilloscope (Digital Oscilloscope DL6000 Series "DL6000", trade name of Yokogawa Electric Corp.) was connected through the wire via a 1000-fold amplification circuit, and the conductive layer 3004 of the braided piezoelectric element 3001 was grounded (earthed). The braided piezoelectric element 3001 was bent 90 degrees.

As a result, a difference in potential of approximately 100 mV was detected by the oscilloscope as the output from the braided piezoelectric element 3001, confirming that a sufficiently large electrical signal can be detected by deformation of the braided piezoelectric element 3001. Also, the noise signal at rest was 20 mV and the S/N ratio was 5, demonstrating that noise signals were adequately suppressed.

Example 5

Using the conductive fiber 300B in the braided piezoelectric element 3001 as a signal wire, an oscilloscope (Digital Oscilloscope DL6000 Series "DL6000", trade name of Yokogawa Electric Corp.) was connected through the wire via a 1000-fold amplification circuit, and the conductive layer 3004 of the braided piezoelectric element 3001 was grounded (earthed). The braided piezoelectric element 3001 was bent 90 degrees.

As a result, a difference in potential of approximately 100 mV was detected by the oscilloscope as the output from the braided piezoelectric element 3001, confirming that a sufficiently large electrical signal can be detected by deformation of the braided piezoelectric element 3001. Also, the noise signal at rest was 20 mV and the S/N ratio was 5, demonstrating that noise signals were adequately suppressed.

Example 6

Using the conductive fiber 3003 in the braided piezoelectric element 3001 of the fabric-like piezoelectric element 3007 as a signal wire, an oscilloscope (Digital Oscilloscope DL6000 Series "DL6000", trade name of Yokogawa Electric Corp.) was connected through the wire via a 1000-fold amplification circuit. The conductive layer 3004 in the braided piezoelectric element 3001 of the fabric-like piezoelectric element 3007 was used as a grounding (earthing) wire for grounding. In this state, the fabric-like piezoelectric element 3007 was bent 90 degrees in the direction perpendicular to the braided piezoelectric element 3001.

As a result, a virtually noise-free electrical signal was obtained by the oscilloscope as the output from the braided piezoelectric element 3001 of the fabric-like piezoelectric element 3007, and a difference in potential of approximately 100 mV was detected, confirming that a sufficiently large electrical signal can be detected with low noise, by deformation of the fabric-like piezoelectric element 3007. Also, the noise signal at rest was 20 mV and the S/N ratio was 5, demonstrating that noise signals were adequately suppressed.

Comparative Example 2

Using the conductive fiber 300B in the braided piezoelectric element 3001 as a signal wire, an oscilloscope (Digital Oscilloscope DL6000 Series "DL6000", trade name of Yokogawa Electric Corp.) was connected through the wire via a 1000-fold amplification circuit, during which time the noise signal at rest was 1000 mV. The braided piezoelectric element 3001 was bent 90 degrees, but the noise signal was large and it was not possible to discriminate the electrical signal from bending.

Comparative Example 3

Using the conductive fiber 300B in a plain weave fabric 3100 as a signal wire, an oscilloscope (Digital Oscilloscope DL6000 Series "DL6000", trade name of Yokogawa Electric Corp.) was connected through the wire via a 1000-fold amplification circuit, during which time the noise signal at rest was 1000 mV. The plain weave fabric 3100 was bent 90 degrees, but the noise signal was large and it was not possible to discriminate the electrical signal from bending.

The fifth invention will now be described in greater detail by examples, with the understanding that the invention is not in any way restricted by the examples.

The physical properties were measured by the following methods.

(1) Optical Purity of Polylactic Acid:

After sampling 0.1 g of a single polylactic acid fiber composing the fabric (one bundle in the case of a multifilament), 1.0 mL aqueous sodium hydroxide at 5 mol/liter concentration/1.0 mL methanol was added, the mixture was set in a water bath shaker adjusted to 65° C., hydrolysis was performed for about 30 minutes until the polylactic acid became a homogeneous solution, the completely hydrolyzed solution was neutralized by addition of 0.25 mol/liter sulfuric acid, and 0.1 mL of the hydrolyzed solution was sampled and diluted with 3 mL of a high-performance liquid chromatography (HPLC) mobile phase solution, and filtered with a membrane filter (0.45 µm). The modified solution was measured by HPLC to quantify the proportion of L-lactic acid monomer and D-lactic acid monomer. When one polylactic acid fiber did not fully supply 0.1 g, the amount of the other solution was adjusted to match the sampleable amount, and the polylactic acid concentration of the sample solution provided for HPLC measurement was adjusted in a range from an amount equal to the above, to $1/100$.

<HPLC Measuring Conditions>
Column: "SUMICHIRAL®" OA-5000 (4.6 m m$\phi$×150 mm) by Sumika Chemical Analysis Service, Ltd.
Mobile phase: 1.0 millimole/liter aqueous copper sulfate solution
Mobile phase flow rate: 1.0 milliliter/min
Detector: UV detector (wavelength of 254 nm)
Injection rate: 100 microliters With the peak area attributed to L-lactic acid monomer as $S_{LLA}$ and the peak area attributed to D-lactic acid monomer as $S_{DLA}$, since $S_{LLA}$ and $S_{DLA}$ are proportional to the molar concentration of L-lactic acid monomer $M_{LLA}$ and the molar concentration $M_{DLA}$ of D-lactic acid monomer, respectively, the larger value of $S_{LLA}$ and $S_{DLA}$ was used as $S_{MLA}$ to calculate the optical purity by the following formula 3.

$$\text{Optical purity (\%)} = S_{MLA} \div (S_{LLA} + S_{DLA}) \times 100 \quad (3)$$

(2) Sheet Resistivity:
A Digital Multimeter DT4222 by Hioki E.E. Corp. was used to measure the resistivity with a clip parallel electrode width of 10 cm and an inter-electrode distance of 10 cm, which was recorded as the sheet resistivity.

(Production of Polylactic Acid)
The polylactic acid used in the Examples was produced by the following method.

After adding 0.005 part by weight of tin octylate to 100 parts by weight of L-lactide (product of Musashino Chemical Laboratory, Ltd., 100% optical purity), the mixture was reacted at 180° C. for 2 hours in a stirring blade-equipped reactor under a nitrogen atmosphere, and phosphoric acid was added at 1.2 equivalents with respect to the tin octylate, after which the remaining lactide was removed under reduced pressure at 13.3 Pa, and chips were formed to obtain poly-L-lactic acid (PLLA1). The weight-average molecular weight of the obtained PLLA1 was 152,000, the glass transition point (Tg) was 55° C. and the melting point was 175° C.

(Piezoelectric Fibers)
PLLA1 melted to 230° C. was discharged from a 24-hole cap at 16.8 g/min and drawn out at 1300 m/min, and then stretched to a factor of 1.54 at 80° C. and heat set at 125° C., to obtain an 84 dTex/24 filament multifilament piezoelectric fiber 5001.

(Conductive Fiber)
Silver plated nylon "AGposs" by Mitsufuji Corp., with a volume resistivity of $1.1 \times 10^{-3}$ Ω·cm, was used as the conductive fiber 5002.

(Insulating Fiber)
Polyethylene terephthalate melted at 280° C. was discharged from a 24-hole cap at 22 g/min, and drawn out at 800 m/min. The unstretched filament was stretched to a factor of 2.5 at 80° C. and heat set at 180° C., to obtain an 84 dTex/24 filament insulating fiber 5003.

Example 7

Figure 29:
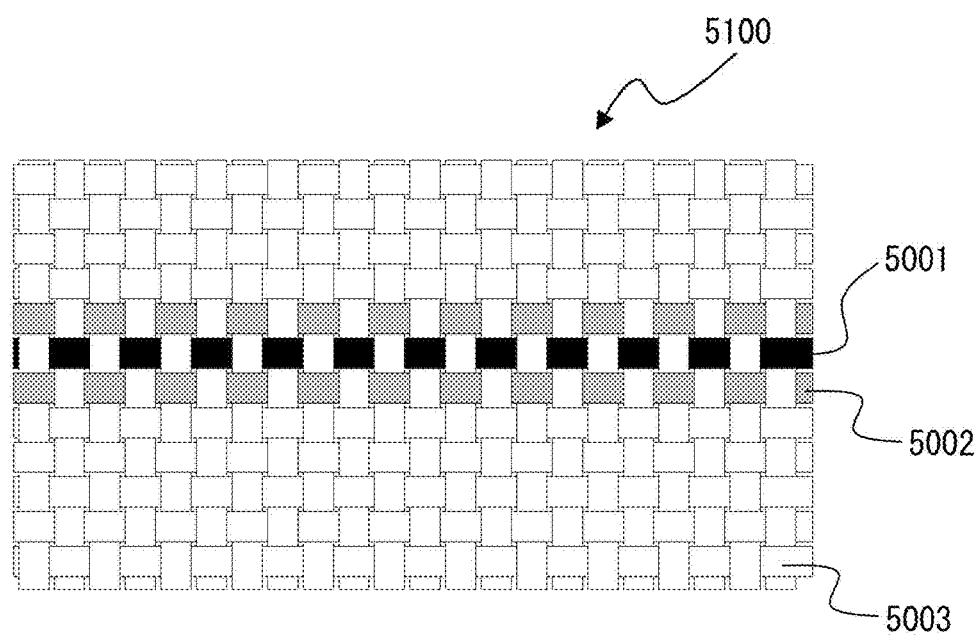
FIG. 29 is a schematic diagram showing the plain weave fabrics of Example 7 and Comparative Example 4.

As shown in FIG. 29, insulating fibers 5003 were arranged as warp threads and the piezoelectric fiber 5001 and conductive fibers 5002 were alternately arranged as weft threads to create a plain weave fabric 5100. A plain weave fabric was also formed of the insulating fibers 5003 alone, to obtain a plain weave fabric 5200 having a sheet resistivity of $60 \times 10^6$ Ω/sq. or greater. A plain weave fabric 5300 was also obtained having one of 10 warp threads and weft threads of the plain weave fabric 5200 changed to the conductive fiber 5002. The sheet resistivity of this plain weave fabric 5300 was 3.2 Ω/sq.

The plain weave fabric 5100, plain weave fabric 5200 and plain weave fabric 5300 were layered in that order and sewed with insulating fiber 5003 to obtain a layered fabric.

This was wound and anchored at the elbow section where a nylon jumper was being worn over a polyester shirt, so that the plain weave fabric 5100 of the layered fabric was on the surface.

The pair of conductive fibers 5002 sandwiching the piezoelectric fiber 5001 in the plain weave fabric 5100 were used by being connected as signal wires to an oscilloscope (digital oscilloscope DL6000 Series "DL6000", trade name of Yokogawa Electric Corp.), and when the elbow was bent with the signal wire in a connected state, a voltage signal was obtained matching movement of the arm.

Comparative Example 4

The plain weave fabric 5100 was wound and anchored at the elbow section where a nylon jumper was being worn over a polyester shirt.

The pair of conductive fibers 5002 sandwiching the piezoelectric fiber 5001 in the plain weave fabric 5100 were used by being connected as signal wires to an oscilloscope (digital oscilloscope DL6000 Series "DL6000", trade name of Yokogawa Electric Corp.), and when the elbow was bent with the signal wire in a connected state, the noise level was high and a voltage signal matching movement of the arm could not be obtained.

EXPLANATION OF SYMBOLS

A Piezoelectric fiber
B Conductive fiber
C Insulating fiber
12 Amplification means
13 Output means
100A Piezoelectric fiber
100B Conductive fiber
1001 Oscilloscope
1002 Evaluating wire
1003 Covered fiber
1004 Measuring sample
1011 Piezoelectric element
1012 Amplification means
1013 Output means
1014 Transmission means
1101 Sensor
200A Piezoelectric fiber
200B Conductive fiber
200C Insulating fiber
2001 Braided piezoelectric element
2002 Sheath
2003 Core
2005 Fabric-like piezoelectric element
2006 Fabric
2007 Insulating fiber
2008 Conductive fiber
2010 Device
2011 Piezoelectric element
2012 Amplification means
2013 Output means
2014 Transmission means
CL Fiber axis α Winding angle
2100 Plain weave fabric
300A Piezoelectric fiber
300B Conductive fiber
300C Insulating fiber
3001 Braided piezoelectric element
3002 Sheath
3003 Core
3004 Conductive layer
3005 Conductive substance
3006 Conductive fiber
3007 Fabric-like piezoelectric element
3008 Fabric
3009 Insulating fiber
3010 Conductive fiber
3011 Device
3012 Piezoelectric element
3013 Amplification means
3014 Output means
3015 Transmission means
CL Fiber axis
α Winding angle
3100 Plain weave fabric
400A Piezoelectric fiber
400B Conductive fiber
400C Insulating fiber
400D Fabric deformation direction
400E Orthogonal coordinate axis
4011 Transducer
4012 Amplification means
4013 Output means
4014 Transmission means
4015 Receiving means
4101, 4102, 4103 Devices
5001 Piezoelectric fiber
5002 Conductive fiber
5003 Insulating fiber
5011 Transducer
5012 Amplification means
5013 Output means
5014 Transmission means
5015 Receiving means
5100 Plain weave fabric
5101, 5102, 5103 Devices
6001 Braided piezoelectric element
7001 Braided piezoelectric element
7002 Sheath
7003 Core
7005 Fabric-like piezoelectric element
7006 Fabric
7007 Insulating fiber
7008 Conductive fiber
7010 Device
7012 Amplification means
7013 Output means
7015 Comparative computing means
8001 Braided piezoelectric element
8005 Fabric-like element
8008 Separate conductive fiber
8010 Device
8012 Piezoelectric signal analysis means
8013 Output means
8014 Transmission means
8015 Electrostatic capacity analysis means
9001 Braided piezoelectric element
9004 Fiber
9005 Flat braided piezoelectric element
9006 Flat braid
9007 Core thread

The invention claimed is:

1. A piezoelectric element including a braid comprising a conductive fiber, an insulating fiber and piezoelectric fibers, the braid having the conductive fiber as the core, and the insulating fiber and the piezoelectric fibers being covering fibers that cover the periphery of the conductive fiber, wherein the flexural rigidity of the conductive fiber is no greater than $0.05 \times 10^{-4}$ N·m$^2$/m, wherein the piezoelectric fibers comprise polylactic acid.

2. The piezoelectric element according to claim 1, wherein the conductive fiber is a metal coated organic fiber.

3. The piezoelectric element according to claim 1, wherein the piezoelectric fibers comprise poly-L-lactic acid or poly-D-lactic acid with an optical purity of 99% or greater.

4. The piezoelectric element according to claim 1, wherein the piezoelectric fibers are uniaxially oriented and include crystals.

5. The piezoelectric element according to claim 1, which detects the amount of stress applied to the covering fibers and/or the location at which it is applied.

6. The piezoelectric element according to claim 5, wherein the stress to be detected is frictional force between the surfaces of the covering fibers and the surface of the contacting object.

7. The piezoelectric element according to claim 5, wherein the stress to be detected is resistance in the direction perpendicular to the surfaces or tip sections of the covering fibers.

8. A piezoelectric sensor using the piezoelectric element according to claim 1.

9. A device comprising:
a piezoelectric sensor according to claim 8,
amplification means that amplifies an electrical signal outputted from the piezoelectric sensor in response to applied pressure, and
output means that outputs the electrical signal that has been amplified by the amplification means.

10. The device according to claim 9, the device further comprising transmission means that transmits the electrical signal that has been outputted from the output means, to an external device.

11. A device comprising:
the piezoelectric sensor according to claim 8,
output means that outputs an electrical signal from the piezoelectric sensor in response to applied pressure, and
transmission means that transmits the electrical signal outputted from the output means, to an external device.

12. The piezoelectric element according to claim 1, wherein the flexural rigidity of the conductive fiber is no greater than $0.02 \times 10^{-4}$ N·m$^2$/m.

13. The piezoelectric element according to claim 1, wherein the conductive fiber is carbon fiber.

* * * * *